(12) United States Patent
Kameyama et al.

(10) Patent No.: US 7,464,131 B2
(45) Date of Patent: Dec. 9, 2008

(54) LOGICAL CALCULATION CIRCUIT, LOGICAL CALCULATION DEVICE, AND LOGICAL CALCULATION METHOD

(75) Inventors: Michitaka Kameyama, Sendai (JP);
Takahiro Hanyu, Sendai (JP);
Hiromitsu Kimura, Kyoto (JP);
Yoshikazu Fujimori, Kyoto (JP);
Takashi Nakamura, Kyoto (JP);
Hidemi Takasu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 704 days.

(21) Appl. No.: 10/543,356

(22) PCT Filed: Feb. 2, 2004

(86) PCT No.: PCT/JP2004/001021
§ 371 (c)(1),
(2), (4) Date: Jul. 25, 2005

(87) PCT Pub. No.: WO2004/070609
PCT Pub. Date: Aug. 19, 2004

(65) Prior Publication Data
US 2006/0139844 A1 Jun. 29, 2006

(30) Foreign Application Priority Data
Feb. 6, 2003 (JP) .............................. 2003-029165

(51) Int. Cl.
*G06G 7/00* (2006.01)
(52) U.S. Cl. ...................................... 708/801
(58) Field of Classification Search ............... 708/801
See application file for complete search history.

(56) References Cited

U.S. PATENT DOCUMENTS

| 5,198,706 | A | 3/1993 | Papaliolius |
| 6,141,237 | A | 10/2000 | Eliason et al. |
| 2005/0190597 | A1* | 9/2005 | Kato ..................... 365/185.08 |
| 2006/0067102 | A1* | 3/2006 | Yamada et al. .............. 365/145 |
| 2006/0083049 | A1* | 4/2006 | Chandler et al. ............ 365/145 |
| 2008/0151600 | A1* | 6/2008 | Fujimori .................... 365/145 |

FOREIGN PATENT DOCUMENTS

| JP | 05-242667 | 9/1993 |
| JP | 2674775 | 7/1997 |
| JP | 2001-126469 | 5/2001 |
| JP | 2003-140883 | 5/2003 |

* cited by examiner

*Primary Examiner*—Tan V Mai
(74) *Attorney, Agent, or Firm*—Hogan & Hartson LLP

(57) ABSTRACT

A logical calculation circuit capable of storing data, and performing logical calculations with high reliability and high speeds are provided. The residual polarized state s' of a load ferroelectric capacitor Cs' is actively changed so that the residual polarized state s' of a load ferroelectric capacitor Cs' is opposite to the residual polarized state s of a storage ferroelectric capacitor Cs. In the case a reference potential is made c=0 in the calculation operation, even if the second data to be calculated x=1 is given to the storage ferroelectric capacitor Cs in the residual polarized state s (the first data to be calculated)=0, the ferroelectric capacitor Cs does not reverse in polarity. Even with combinations other than s=0 and x=1, the ferroelectric capacitor Cs does not reverse in polarity. Difference is great between a potential VA=VA(0) occurring at a coupling node when x=1 is given to the ferroelectric capacitor Cs of s=0 and a potential VA=VA(1) occurring at the coupling node when x=1 is given to the ferroelectric capacitor Cs of s=1.

26 Claims, 49 Drawing Sheets for C=0

| X | S | VA | Mp |
|---|---|----|----|
| 0 | 0 | 0V | OFF |
| 0 | 1 | 0V | OFF |
| 1 | 0 | VA(0) | ON |
| 1 | 1 | VA(1) | OFF |

| X | S | $V_A$ | Mp |
|---|---|-------|-----|
| 0 | 0 | $V_{A(0)}$ | ON |
| 0 | 1 | $V_{A(1)}$ | OFF |
| 1 | 0 | 5V | ON |
| 1 | 1 | 5V | ON |

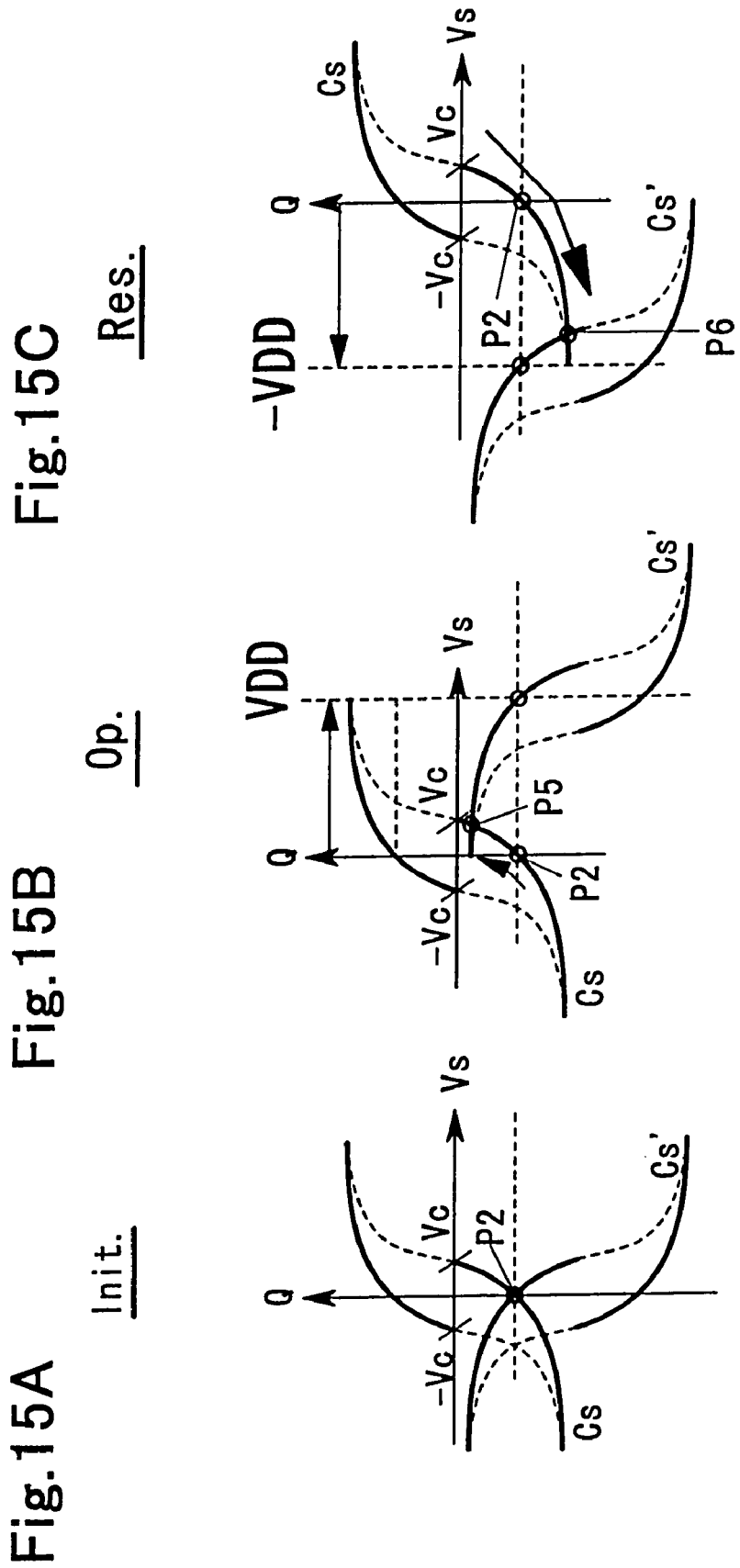

R0, Res.

Standby

LOGICAL CALCULATION CIRCUIT, LOGICAL CALCULATION DEVICE, AND LOGICAL CALCULATION METHOD

CROSS-REFERENCE TO RELATED APPLICATIONS

The whole disclosure of JP-A-2003-29165 (Applied on Feb. 6, 2003) including its specification, claims, drawings, and abstract is incorporated herein by reference.

TECHNICAL FIELD

This invention relates to a logical calculation circuit, a logical calculation device, and a logical calculation method, in particular relates to those using non-volatile memory elements such as ferroelectric capacitors.

BACKGROUND ART

The non-volatile memory is known as a circuit using ferroelectric capacitors. Using ferroelectric capacitors makes it possible to fabricate a rewritable non-volatile memory that works at a low voltage (for example refer to FIG. 3 of JP-2674775).

However, although such a conventional circuit can be used to store data, it cannot be used to perform logical calculation of data.

DISCLOSURE OF THE INVENTION

An object of this invention is to provide a logical calculation circuit, a logical calculation device, and a logical calculation method, using ferroelectric capacitors, that make it possible to store data and perform logical calculation of data, while solving the above-mentioned problem accompanying the conventional circuit. Another object of this invention is to provide the logical calculation circuit, the logical calculation device, and the logical calculation method, that are capable of performing numerical calculations with high reliability at high speeds.

A logical calculation circuit of this invention includes: a storage ferroelectric capacitor for retaining a polarized state corresponding to a first data to be calculated and having first and second terminals; a load ferroelectric capacitor for retaining a polarized state corresponding to the first data to be calculated and substantially complementary to the polarized state of the storage ferroelectric capacitor, and having a third terminal connected to the first terminal of the storage ferroelectric capacitor, and a fourth terminal; and a calculation result output section connected to a coupling node to output a logical calculation result of the first and second data to be calculated for a specified logical operator according to a potential, of the coupling node between the first terminal of the storage ferroelectric capacitor and the third terminal of the load ferroelectric capacitor, obtained by connecting the fourth terminal of the load ferroelectric capacitor to a specified reference potential and by giving a second data to be calculated to the second terminal of the storage ferroelectric capacitor.

The logical calculation circuit of this invention includes: a non-volatile memory element for retaining non-volatile state corresponding to a binary data, a first data to be calculated s, and having first and second terminals; a non-volatile load element for retaining non-volatile state corresponding to a binary, second data to be calculated /s, an inverted value of the first data to be calculated s, having a third terminal connected to the first terminal of the non-volatile memory element, and a fourth terminal; and a calculation result output section for outputting a logical calculation result of the first and second data to be calculated s and x, as a calculation result data z as a binary data for a specified logical operator corresponding to a reference potential according to the states of the non-volatile memory element and the non-volatile load element obtained by pre-charging the coupling node between the first terminal of the non-volatile memory element and the third terminal of the non-volatile load element to the reference potential and then giving the second data x as a binary data to the second terminal of the non-volatile memory element while maintaining the fourth terminal of the non-volatile load element at a reference potential arbitrarily chosen out of two complementary reference potentials, in which logical calculation circuit is constituted that the calculation result data z substantially meets the following equation when the binary data corresponding to the two complementary reference potentials are assumed to be c and /c, $$z = /c \text{ AND } x \text{ AND } /s \text{ OR } c \text{ AND } (x \text{ OR } /s).$$

A logical calculation circuit of this invention includes: a non-volatile memory element for retaining non-volatile state corresponding to the first data to be calculated, a non-volatile load element for retaining non-volatile state of different state change rate depending on the first data to be calculated and connected to the non-volatile memory element through a coupling node, and a calculation result output section for outputting a logical calculation result of the first and second data to be calculated for a specified logical operator based on the state change amount of both the non-volatile memory element and the non-volatile load element obtained by giving the second data to be calculated to the non-volatile memory element.

A logical calculation method of this invention is a method of performing logical calculation using the first and second data to be calculated for a specified logical operator including: writing step of preparing a non-volatile memory element for retaining non-volatile state corresponding to the first data to be calculated and having the first and second terminals; and a non-volatile load element for retaining non-volatile state of different state change rate depending on the first data to be calculated and having the third terminal connected to the first terminal of the non-volatile memory element through the coupling node, and the fourth terminal; and a reading step of performing logical calculation based on the state change amounts of both the non-volatile memory element and the non-volatile load element obtained by connecting the fourth terminal of the non-volatile load element to a specified reference potential and by giving the second data to be calculated to the second terminal of the non-volatile memory element.

While the features and constitution of this invention are broadly described above, their details together with objects will become more apparent with the following disclosure in reference to appended drawings.

BRIEF DESCRIPTION OF DRAWINGS

FIGS. 15A, 15B, and 15C respectively show the polarized states of the ferroelectric capacitor Cs and the ferroelectric capacitor Cs' of the example shown in FIG. 14 respectively in initializing operation (Init.), calculating operation (Op.), and restoring operation (Res.)

BEST MODE FOR CARRYING OUT THE INVENTION

Figure 1:
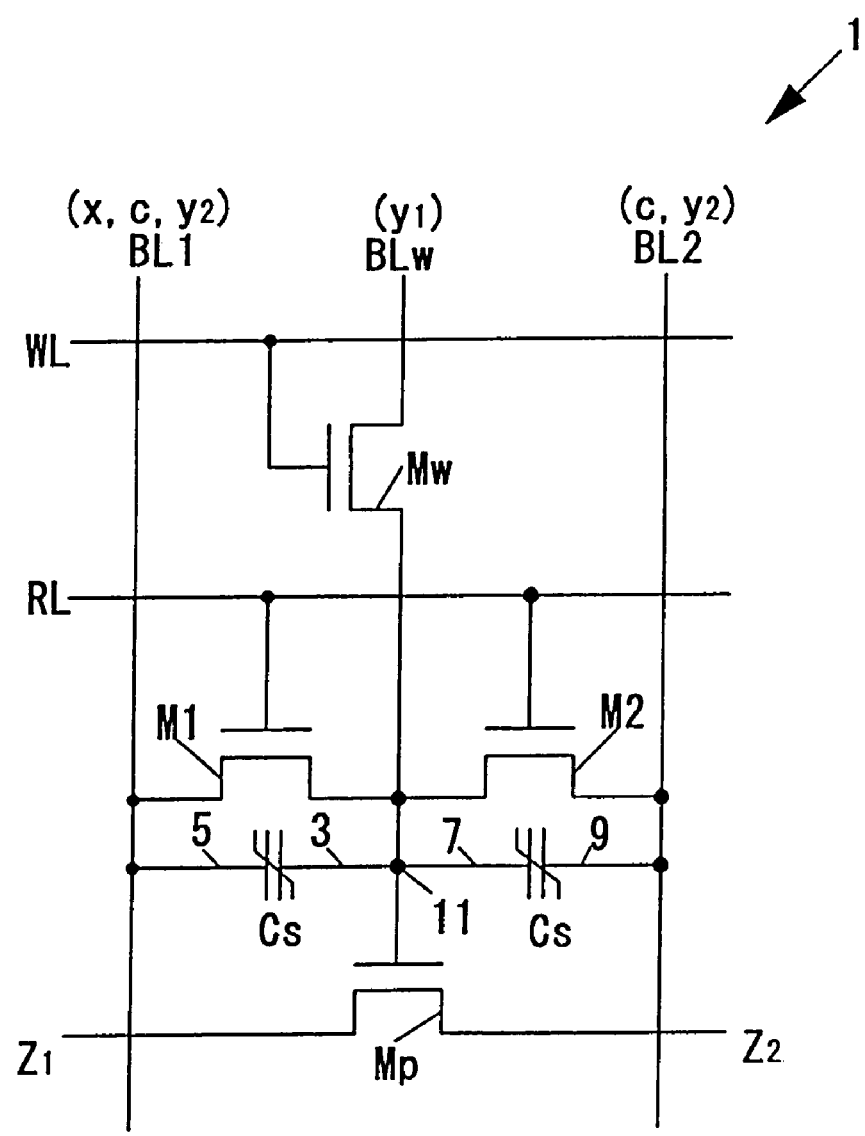
FIG. 1 is a diagram of a logical calculation circuit 1 according to a first embodiment of the invention.

FIG. 1 is a diagram of a logical calculation circuit 1 according to a first embodiment of the invention. The logical calculation circuit 1 includes: a ferroelectric capacitor Cs as a storage ferroelectric capacitor (non-volatile memory element), a ferroelectric capacitor Cs' as a load ferroelectric capacitor (non-volatile load element), a transistor MP as an output transistor (calculation result output section) and transistors M1, M2, and Mw.

The ferroelectric capacitors Cs and Cs' are made to have substantially the same hysteresis characteristics and exhibit complementary residual polarized states. The transistors MP, M1, M2, and Mw are all N-channel MOSFETs (metal oxide semiconductor field effect transistors).

The first terminal 3 of the ferroelectric capacitor Cs is connected through a coupling node 11 to the third terminal 7 of the ferroelectric capacitor Cs'. The second terminal 5 of the ferroelectric capacitor Cs is connected to a bit line BL1. The fourth terminal 9 of the ferroelectric capacitor Cs' is connected to a bit line BL2.

The coupling node 11 is connected to the gate terminal of the transistor MP. The coupling node 11 is also connected through the transistor Mw to a bit line BLw. The gate terminal of the transistor Mw is connected to a writing control line WL.

The coupling node 11 is connected through the transistors M1 and M2 respectively to the bit lines BL1 and BL2. The gate terminals of the transistors M1 and M2 are both connected to a reading control line RL. The input terminal of the transistor MP is given an input signal Z1. The output signal of the transistor MP is assigned as Z2.

In the data write operation (WO), a third data to be calculated y1 is given to the bit line BLw, and a fourth data to be calculated y2 is given to the bit lines BL1 and BL2. In the data read operation (RO), a reference potential c corresponding to a specified logical operator is given to the bit lines BL1 and BL2, and a second calculation data x is given to the bit line BL1.

Figure 2:
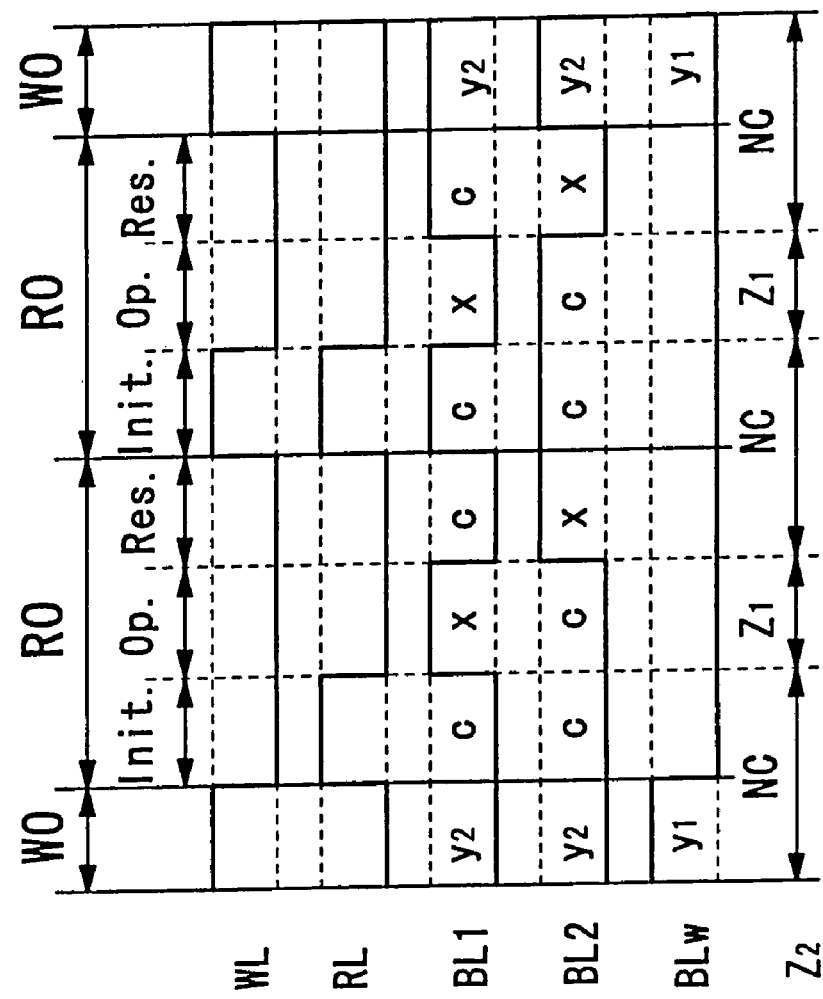
FIG. 2 is an example timing chart of operations of the logical calculation circuit 1.
Figure 3A:
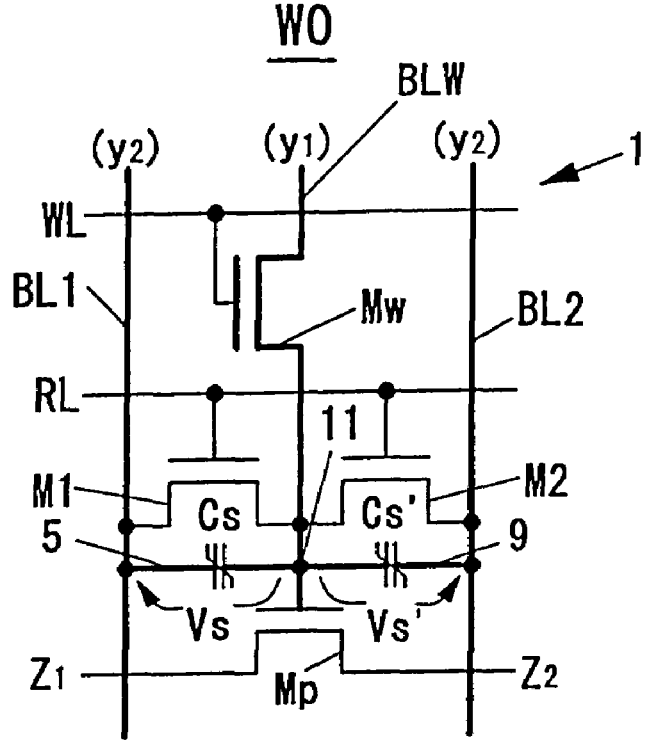
FIGS. 3A and 3B are respectively circuit diagrams for explaining a data write operation (WO) and a standby state (Standby).
Figure 3B:
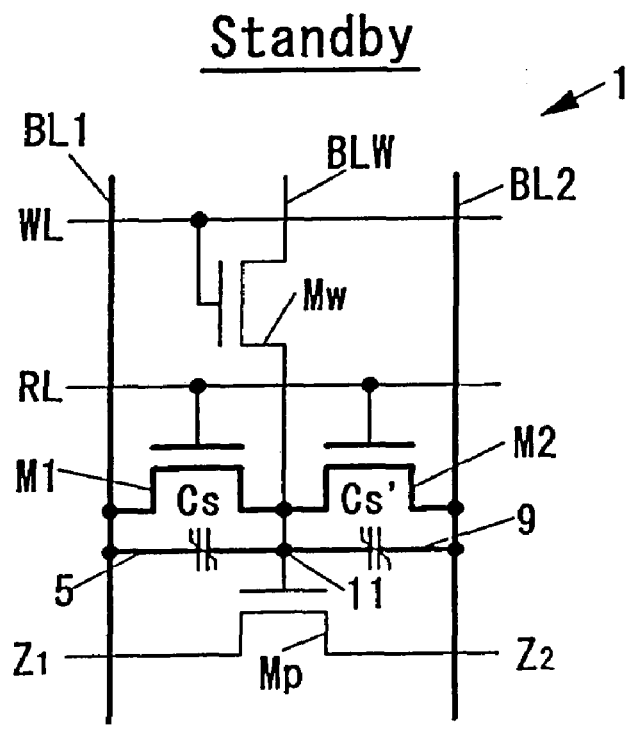
Figure 4A:
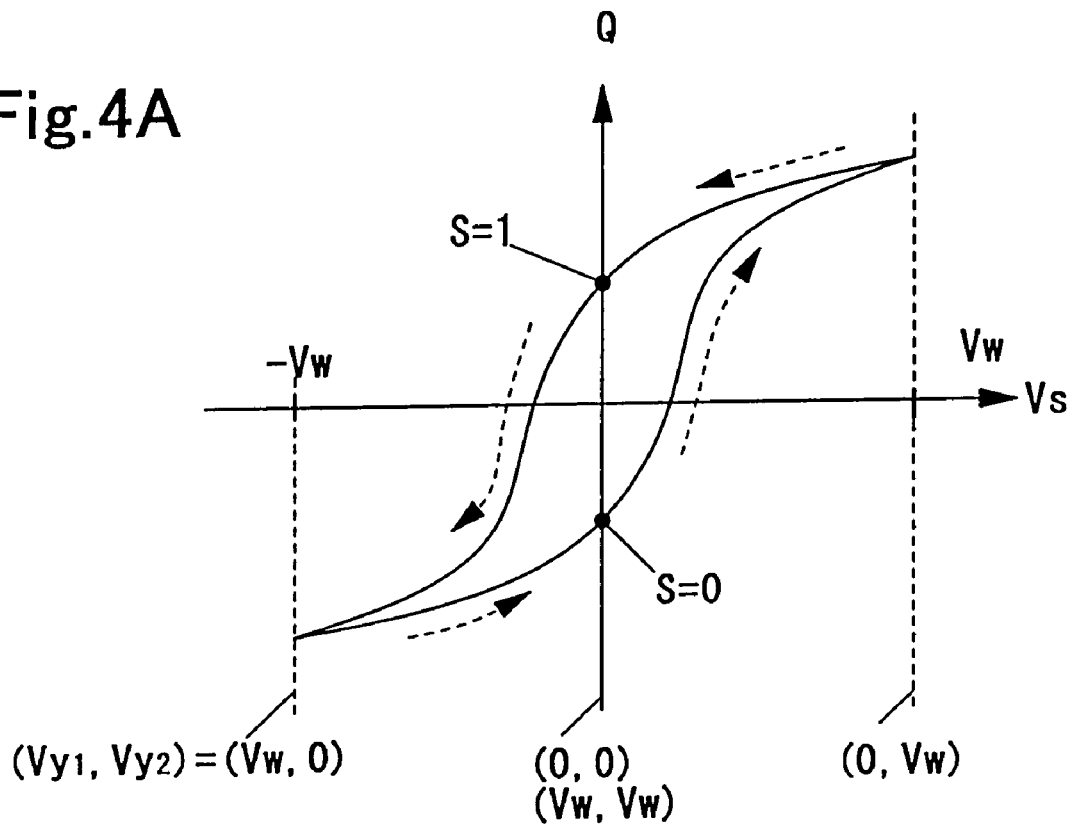
FIGS. 4A and 4B are respectively a hysteresis diagram and a state transition diagram for explaining the data write operation of the logical calculation circuit 1.
Figure 4B:
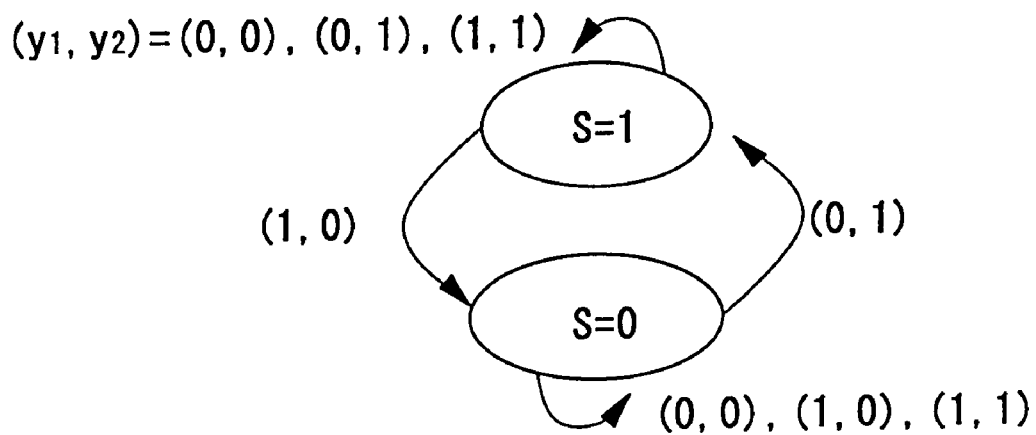

Next, the operation of the logical calculation circuit 1 shown in FIG. 1 is described. FIG. 2 is an example timing chart of operations of the logical calculation circuit 1. FIGS. 3A and 3B are respectively circuit diagrams for explaining data write operation (WO) and standby state (Standby). FIGS. 4A and 4B are respectively a hysteresis diagram and a state transition diagram for explaining the data write operation of the logical calculation circuit 1.

Figure 5A:
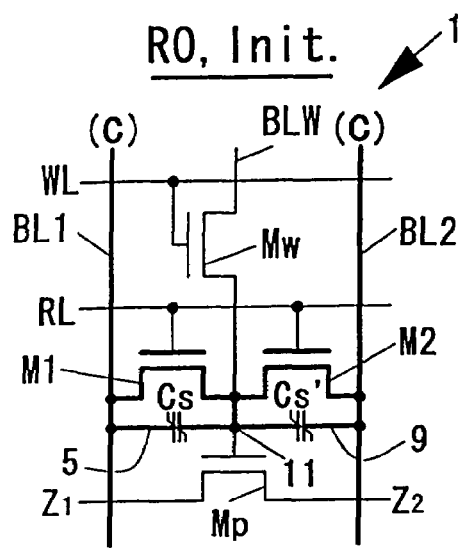
FIGS. 5A-5C are circuit diagrams for explaining the data read operation (RO) of the logical calculation circuit 1.
Figure 5B:
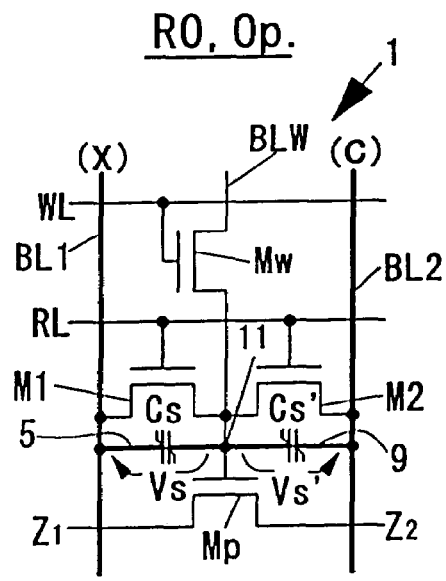
Figure 5C:
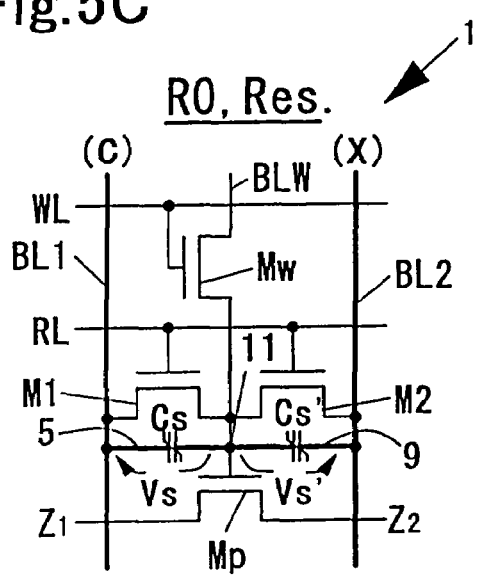
Figures 6A, 6B:
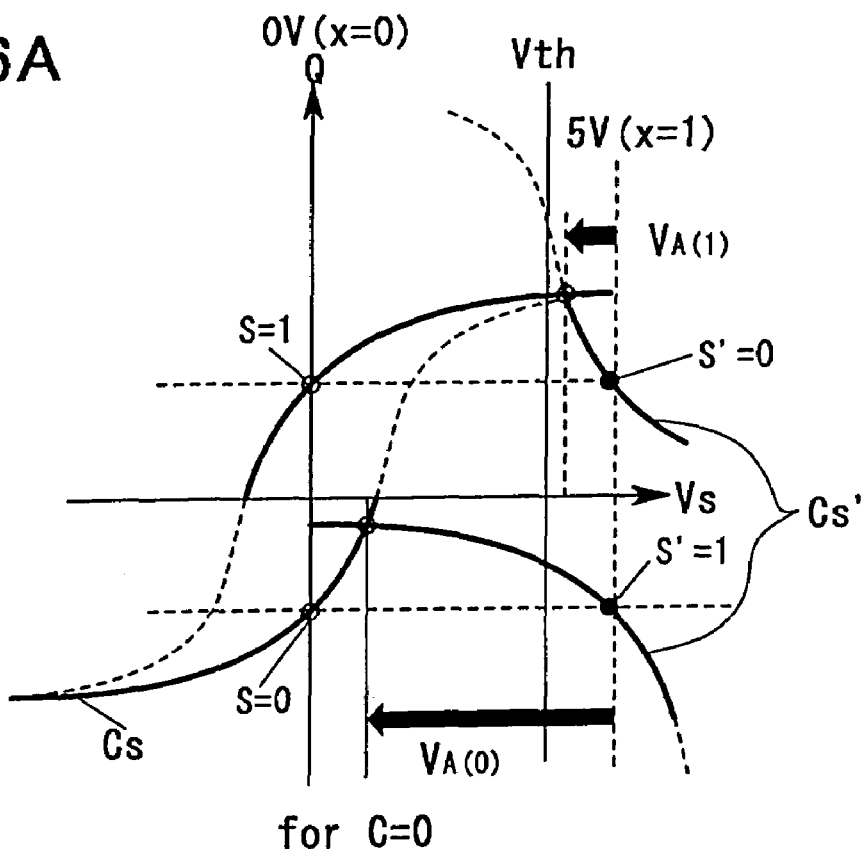
FIGS. 6A and 6B are respectively a hysteresis diagram and a truth table for explaining the data read operation of the logical calculation circuit 1 when the reference potential c=0 corresponding to a logical operator.

FIGS. 5A-5C are circuit diagrams for explaining the data read operation (RO) of the logical calculation circuit 1. FIGS. 6A and 6B are respectively a hysteresis diagram and a truth table for explaining the data read operation of the logical calculation circuit 1 when the reference potential c=0 corresponding to the logical operator.

Figures 7A, 7B:
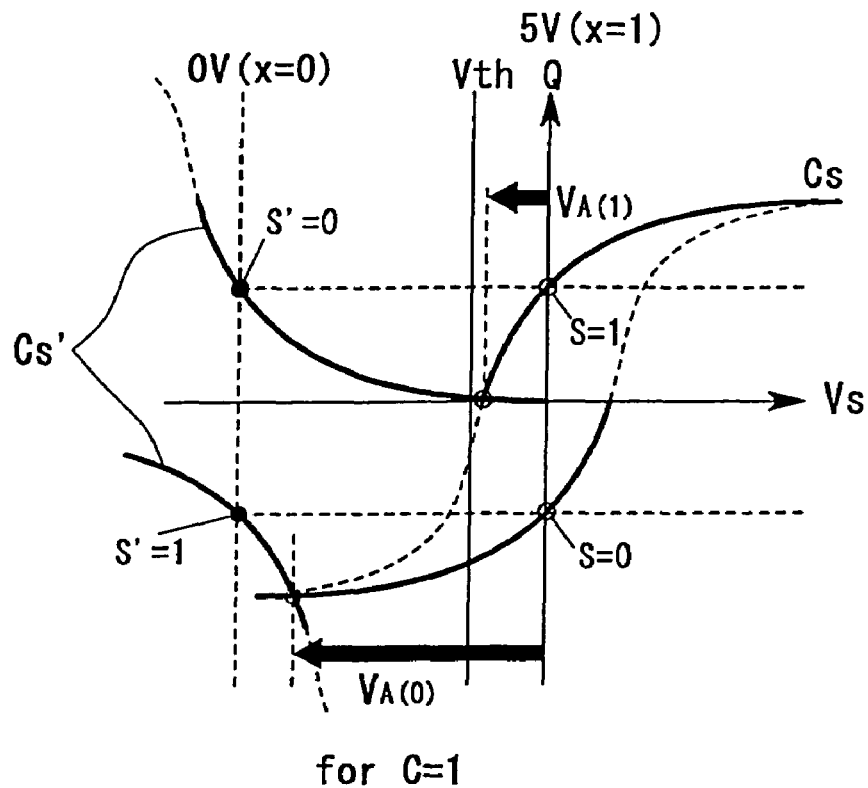
FIGS. 7A and 7B are respectively a hysteresis diagram and a truth table for explaining the data read operation of the logical calculation circuit 1 when the reference potential c=1 corresponding to the logical operator.
Figure 8A:
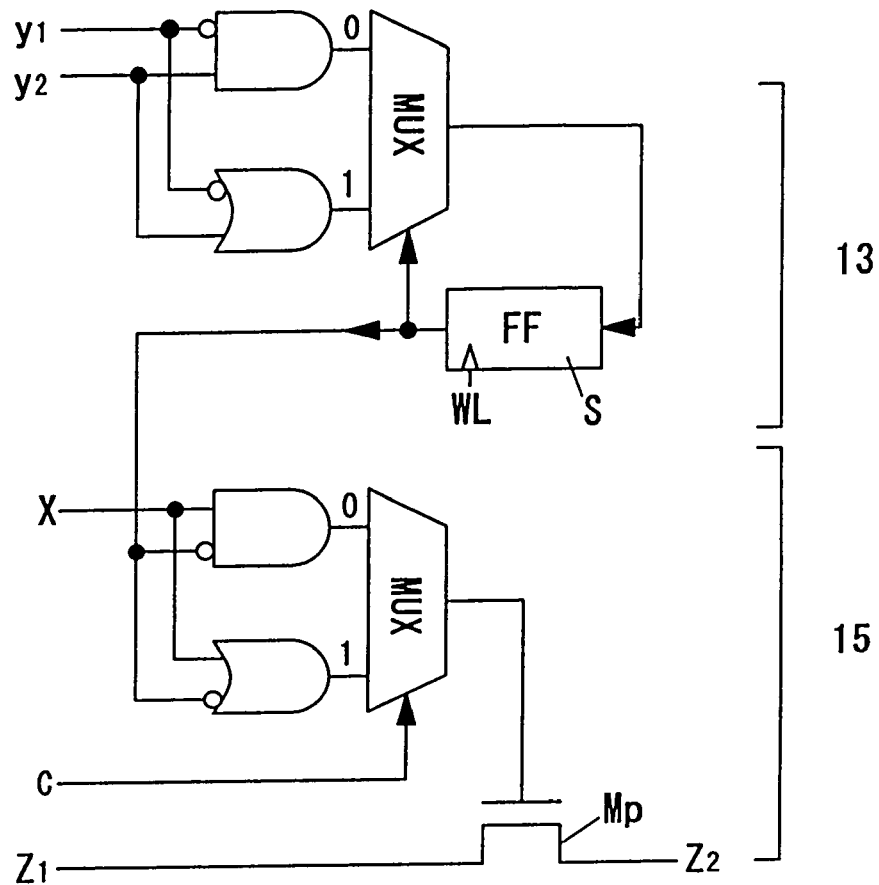
FIGS. 8A and 8B are respectively an equivalent circuit and a symbol diagram of the logical calculation circuit 1.
Figure 8B:
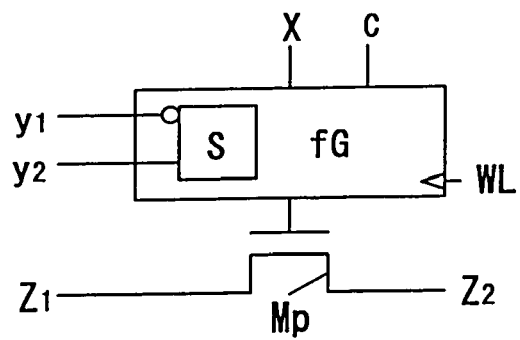

FIGS. 7A and 7B are respectively a hysteresis diagram and a truth table for explaining the data read operation of the logical calculation circuit 1 when the reference potential c=1 corresponding to the logical operator. FIGS. 8A and 8B are respectively an equivalent circuit and a symbol diagram of the logical calculation circuit 1.

As shown in FIG. 2, in the data write operation (WO), the control lines WL and RL are respectively given "1" (or a power source potential Vdd as the second reference potential) and "0" (or the ground potential GND as the first reference potential). The bit line BLw is given the third data to be calculated y1. The bit lines BL1 and BL2 are given the fourth data to be calculated y2. In this embodiment, it is assumed that y1=1 and y2=0.

In the data write operation (WO) as shown in FIG. 3A, the transistors Mw, M1, and M2 are on, off, and off, respectively. Therefore, y1=1 is given to the coupling node 11, while y2=0 is given to the second terminal 5 of the ferroelectric capacitor Cs and to the fourth terminal 9 of the ferroelectric capacitor Cs'.

In the succeeding standby state (Standby) as shown in FIG. 3B, the transistors Mw, M1, and M2 are off, on, and on, respectively. Therefore, the coupling node 11, the second terminal 5 of the ferroelectric capacitor Cs, and the fourth terminal 9 of the ferroelectric capacitor Cs' are at the same potential. Therefore, when the circuit operation shifts from data writing to standby, the polarized state of the ferroelectric capacitor Cs becomes the residual polarized state at the point s=0 as shown in FIG. 4A.

Contrary to the above, when the third data to be calculated y1=0 and the fourth data to be calculated y2=1 are given in the data write operation, the polarized state of the ferroelectric capacitor Cs becomes the residual polarized state at the point s=1 in the succeeding standby state (Standby).

By the data write operation, the residual polarized state s of the ferroelectric capacitor Cs changes as shown in FIG. 4B. That is, in the case the residual polarized state of the ferroelectric capacitor Cs before the write operation is s=1, the residual polarized state s=1 of the ferroelectric capacitor Cs remains unchanged when the third data to be calculated y1 and the fourth data to be calculated y2 are (y1, y2)=(0, 0), (0, 1), or (1, 1). However, when (y1, y2)=(1, 0), the residual polarized state of the ferroelectric capacitor Cs is changed to s=0 by the write operation.

On the other hand, in the case the residual polarized state of the ferroelectric capacitor Cs before the data write operation is s=0, the residual polarized state s=0 of the ferroelectric capacitor Cs remains unchanged when the third data to be calculated y1 and the fourth data to be calculated y2 are (y1, y2)=(0, 0), (1, 0), or (1, 1). However, when (y1, y2)=(0, 1), the residual polarized state of the ferroelectric capacitor Cs is changed to s=1 by the write operation.

Assuming the residual polarized state of the ferroelectric capacitor Cs immediately before the write operation to be sb, the residual polarized state s (the first data to be calculated) of the ferroelectric capacitor Cs may be expressed with the following equation.

$$s = /sb \text{ AND } /y1 \text{ AND } y2 \text{ OR } sb \text{ AND } (/y1 \text{ OR } y2)$$

In this way, it is possible to perform logical calculation utilizing the data write operation to the ferroelectric capacitor Cs. Incidentally, the residual polarized state s' of the ferroelectric capacitor Cs' shows opposite (in complementary relationship) to the residual polarized state s of the ferroelectric capacitor Cs.

Referring back to FIG. 2, the data write operation (WO) is followed by the data read operation (RO). The data read operation (RO) is performed in the order of an initializing operation (Init.), calculation operation (Op.) and a restoring operation (Res.).

As shown in FIG. 2, in the initializing operation (Init.), the control lines WL and RL are respectively given "0" and "1". Further, a reference potential c corresponding to a specified logical operator is given to the bit lines BL1 and BL2. In this embodiment, c=0.

As shown in FIG. 5A, in the initializing operation (Init.), the transistors Mw, M1, and M2 are off, on, and on, respectively. Therefore, c=0 is given to the second terminal 5 of the ferroelectric capacitor Cs and to the fourth terminal 9 of the ferroelectric capacitor Cs'.

The initializing operation allows the coupling node 11 to be pre-charged to the reference potential c corresponding to a specified logical operator without changing the residual polarized states s and s' of the ferroelectric capacitor Cs and the ferroelectric capacitor Cs'.

In a succeeding calculation operation (Op.) as shown in FIG. 2, the control lines WL and Rl are respectively given "0" and "0". Further, the second data to be calculated x and the reference potential c above are given respectively to the bit lines BL1 and BL2. In this embodiment, x=1, and c=0.

In the calculation operation (Op.) as shown in FIG. 5B, all the transistors Mw, M1, and M2 are off. Therefore, x=1 and c=0 are respectively given to the second terminal 5 of the ferroelectric capacitor Cs and to the fourth terminal 9 of the ferroelectric capacitor Cs'.

As described above, because the ferroelectric capacitor Cs is in the polarized state indicated with s=0, the ferroelectric capacitor Cs' is in the polarized state indicated with s'=1. By graphical determination method using the graph of FIG. 6A here, the potential generated at the coupling node 11 by the calculating operation (Op.) is determined as VA=VA(0). Because the potential VA(0) is greater than the threshold voltage Vth of the transistor MP, the transistor MP turns on. In other words, as shown in FIG. 2, the output signal of the transistor MP becomes Z2=Z1.

In contrast to the above, in the case the residual polarized state of the ferroelectric capacitor Cs in the data write operation is s=1, the potential generated at the coupling node 11 in the calculation operation (Op.) is VA=VA(1) as shown in FIG. 6A. Because the potential VA(1) is smaller than the threshold voltage Vth of the transistor MP, the transistor MP turns off. In other words, the output signal of the transistor MP becomes Z2=NC (disconnected state).

In the case the second data to be calculated in the data read operation is made x=0, the transistor MP turns off regardless of the residual polarized state of the ferroelectric capacitor Cs. Therefore, the results of the calculation operations (Op.) with the reference potential c are summarized in the truth table as shown in FIG. 6B.

On the other hand, when the reference potential c=1, the potential VA generated at the coupling node 11 in the calculation operation (Op.) may be determined using the graph of FIG. 7A. Results of calculation operations (Op.) in this case may be summarized in the truth table as shown in FIG. 7B.

Assuming on and off states of the transistor MP to correspond to z=1 and z=0, these states may be expressed as follows:

$$z = /c \text{ AND } x \text{ AND } /s \text{ OR } c \text{ AND } (x \text{ OR } /s)$$

In this way, the operations of reading data from the ferroelectric capacitor Cs may be used to perform logical calculations.

As described above, this logical calculation circuit 1 may be used to perform logical calculations by using data write operation (WO) and data read operation (RO) while storing data in the ferroelectric capacitor Cs in non-volatile state. The logical calculation circuit 1 may be expressed with an equivalent logical circuit as shown in FIG. 8A. Of the equivalent logical circuit of FIG. 8A, the part 13 is the logical calculation section using the data write operation (WO) and the part 15 is the logical calculation section using the data read operation (RO). Further, the logical calculation circuit 1 may be expressed as FIG. 8B using symbols.

Now, in the logical calculation circuit 1, as described above, the load element is the ferroelectric capacitor Cs' having nearly the same hysteresis characteristic as that of the storage ferroelectric capacitor Cs. And that, the residual polarized state of the load ferroelectric capacitor Cs' is actively changed to be opposite to that of the storage ferroelectric capacitor Cs.

Therefore, in the case the reference potential is made c=0 in the calculation operation (Op.), as shown in FIG. 6A, even if the second data to be calculated x=1 is given to the storage ferroelectric capacitor Cs in the residual polarized state s=0, the ferroelectric capacitor Cs does not reverse in polarity. As a matter of course, the ferroelectric capacitor Cs cannot reverse in polarity with any other combination than the residual polarized state s=0, and the second data to be calculated x=1.

Also in the case the reference potential is made c=1 in the calculation operation (Op.), as shown in FIG. 7A, the storage ferroelectric capacitor Cs cannot reverse in polarity. Likewise, the load ferroelectric capacitor Cs' cannot reverse in polarity. In other words, the logical calculation circuit 1 permits nondestructive reading.

Further, in the case the reference potential is made c=0 in the calculation operation (Op.) as shown in FIG. 6A, the difference is very large between the potential VA=VA(0) generated at the coupling node 11 when the second data to be calculated x=1 is given to the storage ferroelectric capacitor Cs in the residual polarized state of s=0, and the potential VA=VA(1) generated at the coupling node 11 when the second data to be calculated x=1 is given to the storage ferroelectric capacitor Cs in the residual polarized state of s=1.

Likewise, in the case the reference potential is made c=1 in the calculation operation (Op.) as shown in FIG. 7A, the difference is very large between the potential VA=VA(0) generated at the coupling node 11 when the second data to be calculated x=0 is given to the storage ferroelectric capacitor Cs in the residual polarized state of s=0 and the potential VA=VA(1) generated at the coupling node 11 when the second data to be calculated x=0 is given to the storage ferroelectric capacitor Cs in the residual polarized state of s=1. In other words, it is seen that the read margin is very large in the data read operation.

Referring again to FIG. 2, in the restoration operation (Res.) performed after the calculation operation (Op.), "0" and "0" are respectively given to the control lines WL and RL like in the calculation operation. The bit lines BL1 and BL2 are given, contrary to the calculation operation, respectively the reference potential c=0 and the second data to be calculated x=1.

As shown in 5C, in the restoration operation (Res.) like in the calculation operation, the transistors Mw, M1, and M2 are all off. Therefore, the second terminal 5 of the ferroelectric capacitor Cs and the fourth terminal 9 of the ferroelectric capacitor Cs' are respectively given c=0 and x=1, contrary to the calculation operation.

As described above, the ferroelectric capacitor Cs and the ferroelectric capacitor Cs' are both constituted not to reverse in polarity. However, the calculation operation may cause, although not so much as the polarity reversal, some distortion in the hysteresis characteristics of the ferroelectric capacitor Cs and the ferroelectric capacitor Cs'.

To correct this distortion, it is adapted that, in the restoration operation, a voltage of opposite direction to that in the calculation operation is given to a compound ferroelectric capacitor made by series connection of the ferroelectric capacitor Cs and the ferroelectric capacitor Cs'.

Figure 9:
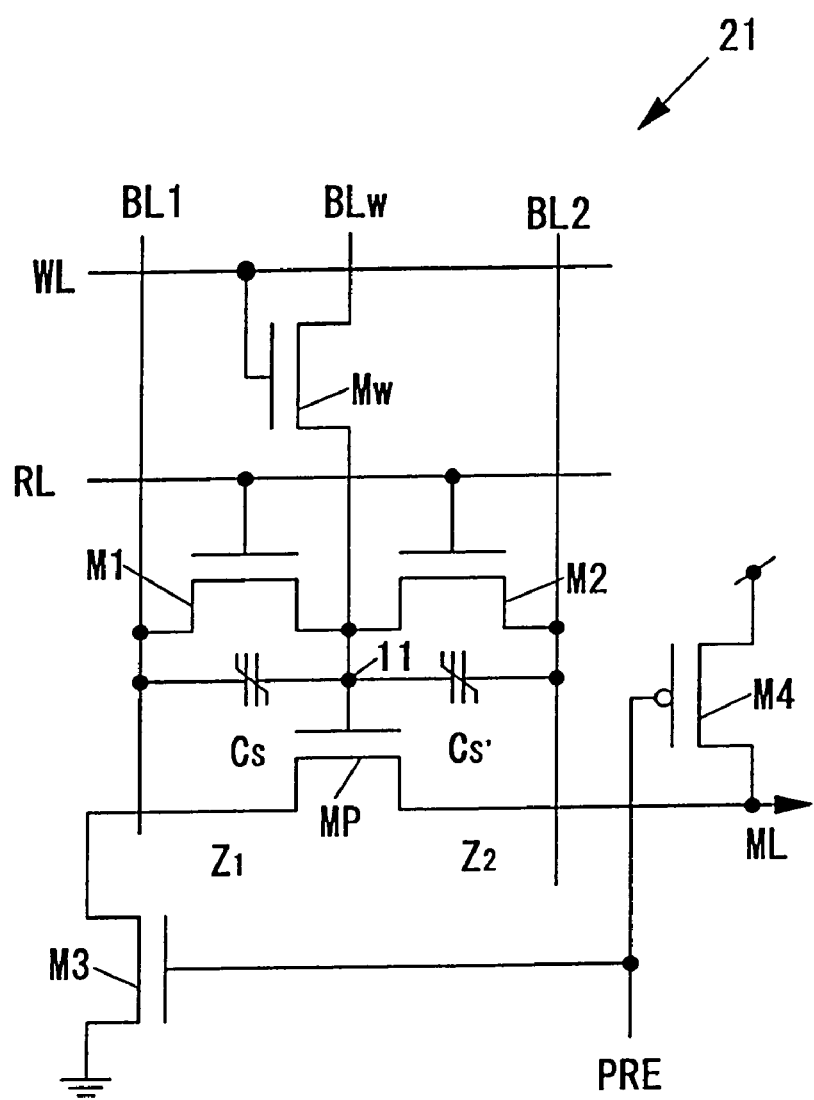
FIG. 9 is a diagram of a logical calculation circuit 21 according to another embodiment of the invention.

Next, FIG. 9 shows a logical calculation circuit 21 as another embodiment of this invention. The logical calculation circuit 21 is made by adding transistors M3 and M4 to the logical calculation circuit 1 described above.

The input terminal of the transistor MP is connected through the transistor M3 to the ground potential GND. The output terminal of the transistor MP is connected to the output line ML. The output line ML is connected through the transistor M4 to the second reference potential, which is the power source potential Vdd. The gate terminals of the transistors M3 and M4 are connected to a preset line PRE.

The transistor M3 is an N-channel MOSFET (metal oxide semiconductor field effect transistor). The transistor M4 is a P-channel MOSFET (metal oxide semiconductor field effect transistor).

Figure 10:
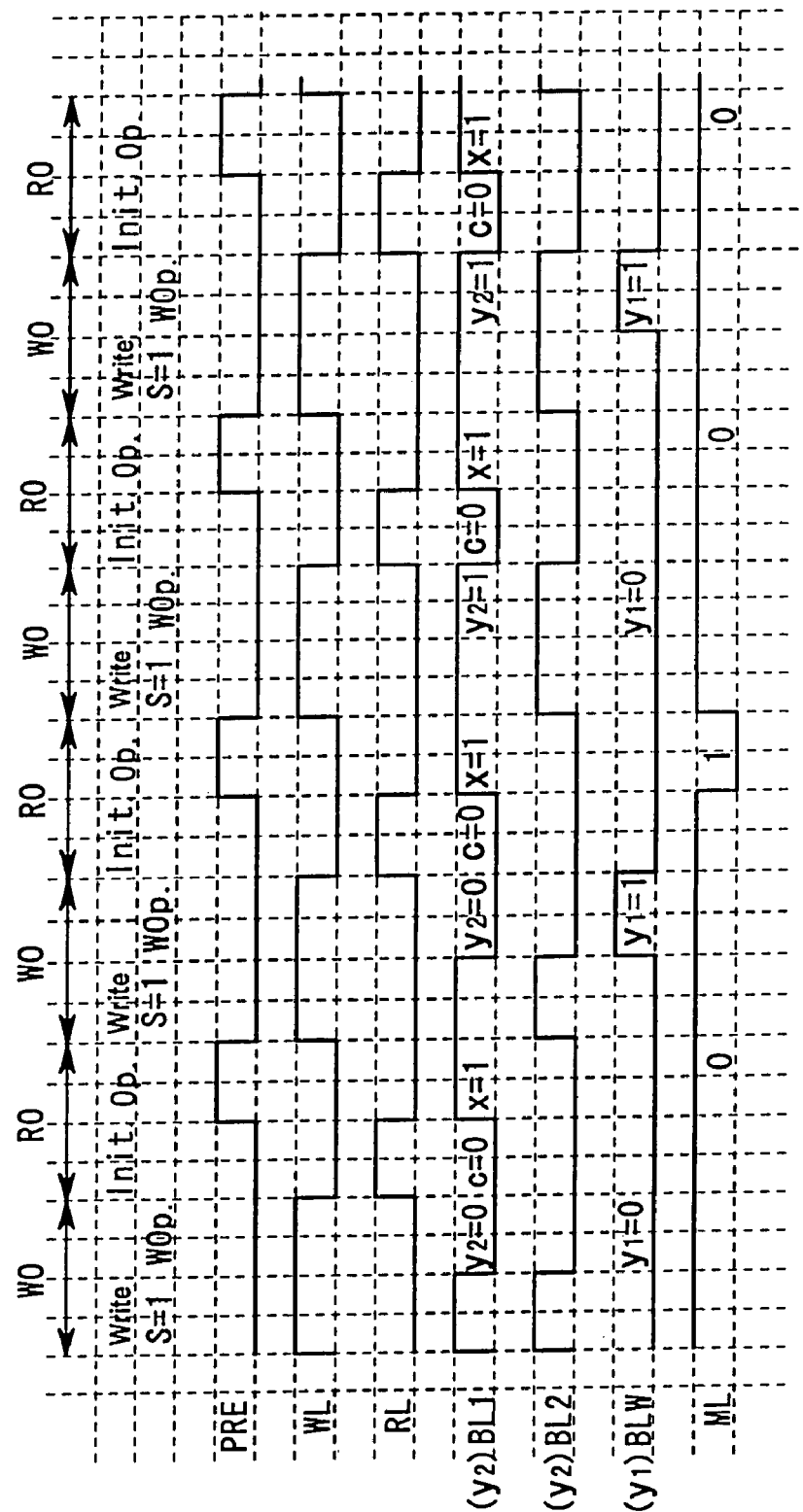
FIG. 10 is a timing chart for performing logical calculation using the data write operation of the logical calculation circuit 21.

FIG. 10 is a timing chart for performing logical calculation using the data write operation of the logical calculation circuit 21. Operation of write logical calculation using the logical calculation circuit 21 is described in reference to FIG. 10. The write logical calculation is performed as shown in FIG. 10 in the order of data write operation (WO) and data read operation (RO).

The data write operation (WO) is performed in the order of s-initialize operation (Write s=1) and write calculation operation (Wop.). First, in the s-initialize operation (Write s=1), the control lines WL and RL are respectively given "1" and "0". The bit line BLw is given "0". The bit lines BL1 and BL2 are given "1".

As a result, the residual polarized state of the ferroelectric capacitor Cs is initialized to s=1. Naturally, the residual polarized state of the ferroelectric capacitor Cs' is initialized to s'=0. With the s-initialize operation, it is possible to determine a logical operator in the succeeding write calculation operation (Wop.).

In the write calculation operation (Wop.) after the s-initialize operation (Write s=1), the control lines WL and RL are respectively given "1" and "0". The bit line BLw is given the third data to be calculated, y1. The bit lines BL1 and BL2 are given the fourth data to be calculated, y2. Here, it is assumed that y1=0 and y2=0. With this operation, the residual polarized state s of the ferroelectric capacitor Cs and the residual polarized state s' of the ferroelectric capacitor Cs' are updated.

In other words, the following calculation is performed by the data write operation (WO) and the result is stored.

$$s = /sb \text{ AND } /y1 \text{ AND } y2 \text{ OR } sb \text{ AND } (/y1 \text{ OR } y2)$$

In the example of FIG. 10, as the s-initialize operation (Write s=1) makes sb=1, the above equation may be expressed as $$s = /y1 \text{ OR } y2.$$

The succeeding data read operation (RO) is performed in order of an initialize operation (Init.) followed by a calculation operation (Op.). In the initialize operation (Init.), the control lines WL and RL are respectively given "0" and "1". The bit lines BL1 and BL2 are given the reference potential c=0.

The above operation allows the coupling node 11 to be pre-charged with the reference potential c corresponding to a specified logical operator without changing the residual polarized states s and s' of the ferroelectric capacitors Cs and Cs'.

In the calculation operation (Op.) performed after the initialize operation (Init.), as shown in FIG. 10, the control lines WL and RL are respectively given "0" and "0". The bit lines BL1 and BL2 are respectively given x=1 and c=0. With this operation, the transistor MP turns on or off according to the potential occurring at the coupling node 11.

Assuming the on and off states of the transistor MP to correspond to z=1 and z=0, they are expressed as follows.

$$z = /c \text{ AND } x \text{ AND } /s \text{ OR } c \text{ AND } (x \text{ OR } /s)$$

In the example of FIG. 10, as the s-initialize operation (Init.) and the calculation operation (Op.) make x=1 and c=0, the above equation is expressed as follows.

$$z = /s$$

Putting the calculation contents of the data write operation (WO) into the above equation, the example of FIG. 10 is to perform the following calculation.

$$z = /(/y1 \text{ OR } y2) = y1 \text{ AND } /y2$$

Figure 11A:
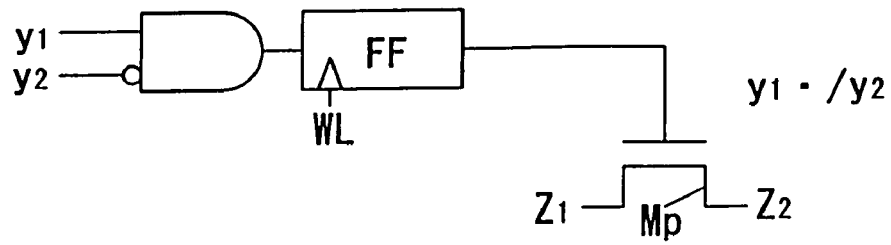
FIGS. 11A and 11C are respectively an equivalent circuit and a symbol diagram of the logical calculation circuit 21 assuming s=1 in the s-initializing operation of the example of FIG. 10.
Figure 11B:
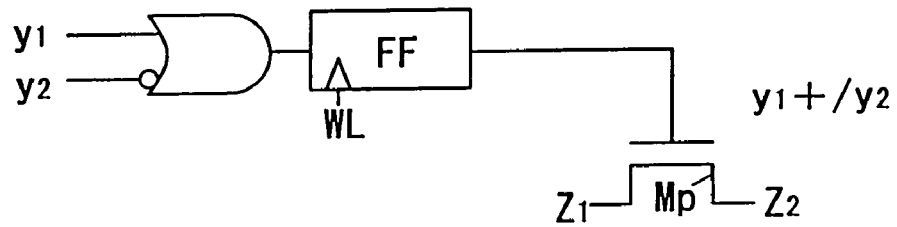
FIGS. 11B and 11D are respectively an equivalent circuit and a symbol diagram of the logical calculation circuit 21 assuming s=0 in the s-initializing operation of the example of FIG. 10.
Figure 11C:
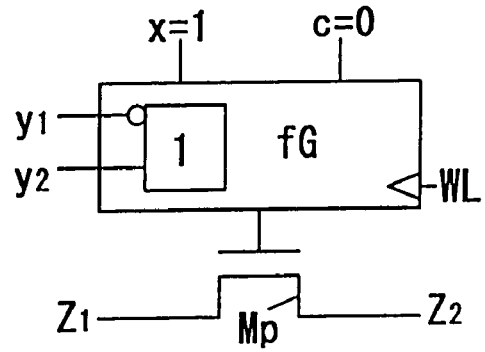

FIGS. 11A and 11C are respectively the equivalent circuit and symbolic diagram of the logical calculation circuit 21 of the example of FIG. 10.

On the other hand, assuming s=0 in the s-initializing operation permits the following calculation.

$$z = y1 \text{ OR } /y2$$

Figure 11D:
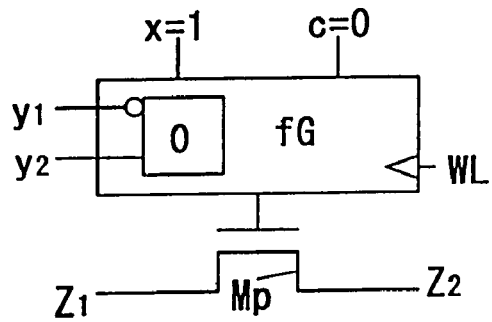

FIGS. 11B and 11D are respectively the equivalent circuit and symbolic diagram of the logical calculation circuit 21 with s=0 in the s-initializing operation. In this way, it is possible to perform intended logical calculation utilizing the data write operation to the ferroelectric capacitor Cs.

Incidentally in the calculation operation (Op.) as shown in FIG. 10, because the preset line PRE is given "1", the potential of the output line ML becomes "L" and "H" respectively corresponding to z=1 and z=0. Further, in operations other than the calculation operation (Op.), because the preset line PRE is given "0", the potential of the output line ML becomes "H" in level (in the state of the transistor MP being off).

Figure 12:
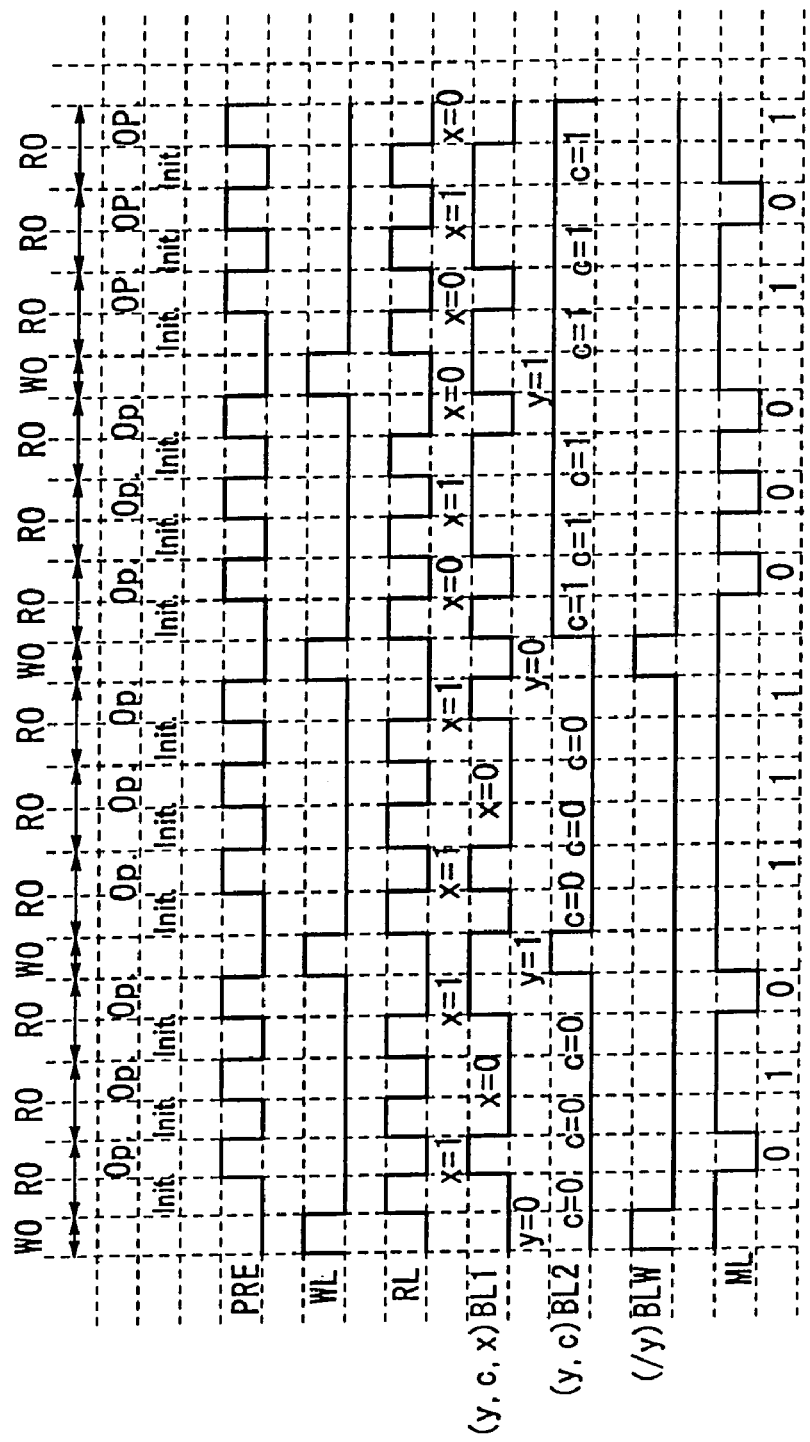
FIG. 12 is a timing chart for performing logical calculation using the data read operation of the logical calculation circuit 21.

Next, FIG. 12 is a timing chart for performing logical calculation using the data read operation of the logical calculation circuit 21. Referring to FIG. 12, operation of read logical calculation with the logical calculation circuit 21 is described. In the case of read logical calculation, as shown in FIG. 12, data write operation (WO) is followed by data read operation (RO).

First, in the data write operation (WO), the control lines WL and RL are respectively given "1" and "0". The bit line BLw is given y1=/y. The bit lines BL1 and BL2 are given y2=y.

With this operation, the residual polarized state s of the ferroelectric capacitor Cs and the residual polarized state s' of the ferroelectric capacitor Cs' are updated. In other words, with the write operation (WO), the following calculation is initiated and the result is stored.

$$s = /sb \text{ AND } /y1 \text{ AND } y2 \text{ OR } sb \text{ AND } (/y1 \text{ OR } y2)$$

Because the example of FIG. 12 is asssumed with y1=/y and y2=y, the above equation is expressed as follows.

$$s = y$$

In other words, with the data write operation (WO.), y is stored as the first data to be calculated s.

The subsequent data read operation (RO) is performed in the order of an initialize operation (Init.) followed by a calculation operation (Op.). In the initialize operation (Init.), the control lines WL and RL are respectively given "0" and "1". The bit lines BL1 and BL2 are given the reference potential c.

The initializing operation allows the coupling node 11 to be pre-charged to the reference potential c corresponding to a specified logical operator without changing the residual polarized states s and s' of the ferroelectric capacitor Cs and the ferroelectric capacitor Cs'.

In the calculation operation (Op.) performed after the initialize operation (Init.), as shown in FIG. 12, the control lines WL and RL are respectively given "0" and "0". The bit lines BL1 and BL2 are respectively given the second data to be calculated x and the reference potential c. With this operation, the transistor MP turns on or off according to the potential generated at the coupling node 11.

With on and off states of the transistor MP made to correspond to z=1 and z=0, they are expressed as follows.

$$z = /c \text{ AND } x \text{ AND } /s \text{ OR } c \text{ AND } (x \text{ OR } /s)$$

Putting the calculation contents of the data write operation (WO) into the above equation, the example of FIG. 12 is to perform the following calculation.

$$z = /c \text{ AND } x \text{ AND } /y \text{ OR } c \text{ AND } (x \text{ OR } /y)$$

Figure 13A:
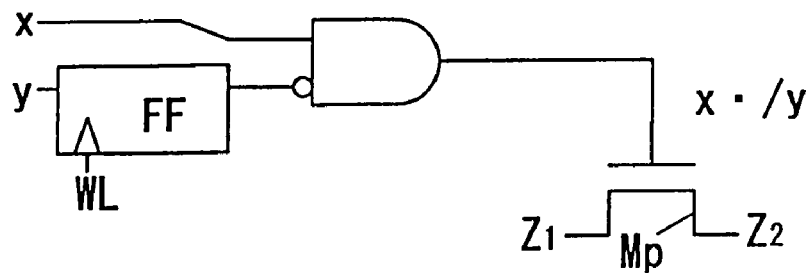
FIGS. 13A and 13C are respectively an equivalent circuit and a symbol diagram of the logical calculation circuit 21 assuming the reference potential c=0 in the example of FIG. 12.
Figure 13B:
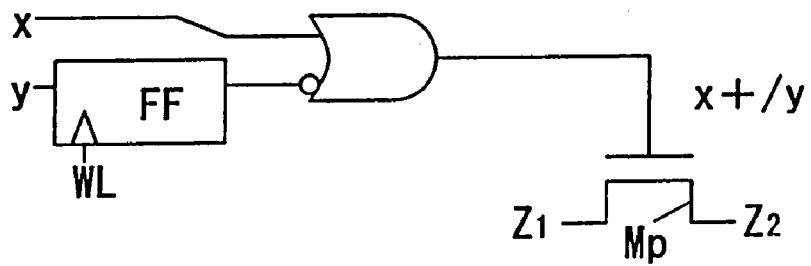
FIGS. 13B and 13D are respectively an equivalent circuit and a symbol diagram of the logical calculation circuit 21 assuming the reference potential c=1 in the example of FIG. 12.
Figure 13C:
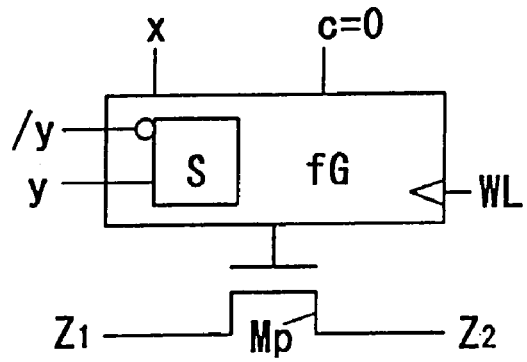
Figure 13D:
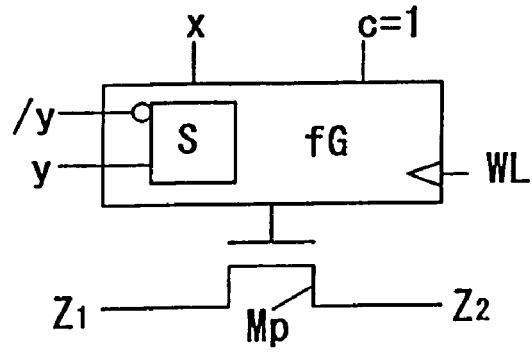

FIGS. 13A and 13C are respectively an equivalent circuit and a symbol diagram of the logical calculation circuit 21 assuming the reference potential c=0 in the example of FIG. 12. FIGS. 13B and 13D are respectively an equivalent circuit and a symbol diagram of the logical calculation circuit 21 assuming the reference potential c=1 in the example of FIG. 12. In this way, it is possible to perform intended logical calculation utilizing the data read operation to the ferroelectric capacitor Cs.

Incidentally in the calculation operation (Op.) as shown in FIG. 12, because the preset line PRE is given "1", the potential of the output line ML becomes "L" and "H" respectively corresponding to z=1 and z=0. Further, in operations other than the calculation operation (Op.), because the preset line PRE is given "0", the potential of the output line ML becomes "H" in level (in the state of the transistor MP being off).

Figure 14:
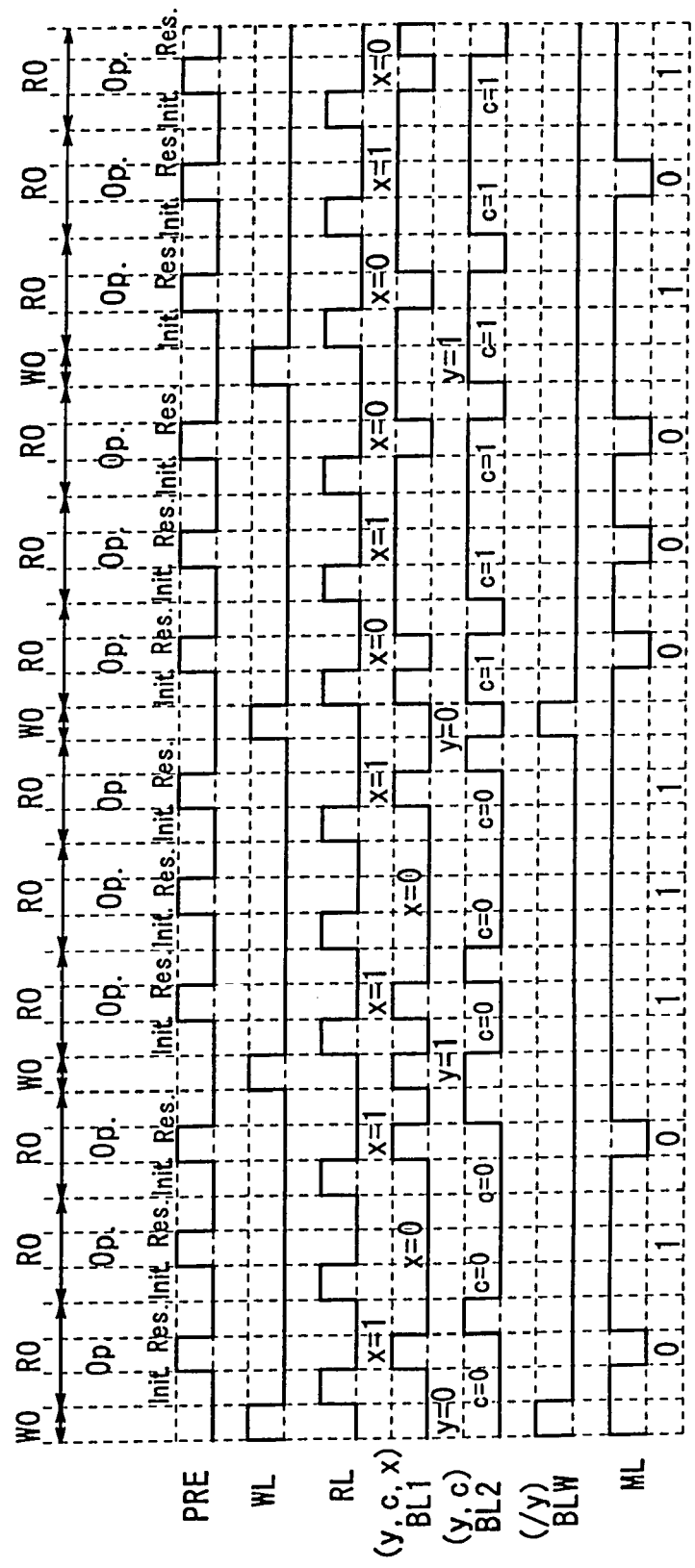
FIG. 14 is another example timing chart for performing logical calculation using the data read operation of the logical calculation circuit 21.

Also FIG. 14 is another timing chart for performing logical calculation using the data read operation of the logical calculation circuit 21. While this is the same as the example of FIG. 12 regarding the performing of the read logical calculation by using the logical calculation circuit 21, the example of FIG. 14 is different in that a restoration operation (Res.) is performed at the end of the data read operation (RO).

As shown in FIG. 14, in the restoration operation (Res.) ensuing on the calculation operation (Op.), the control lines WL and RL are respectively given "0" and "0" in the same manner as the calculation operation. On the other hand, the bit lines BL1 and BL2 are respectively given the reference potential c and the second data to be calculated x, contrary to the calculation operation.

FIGS. 15A, 15B, and 15C respectively show the polarized states of the ferroelectric capacitor Cs and the ferroelectric capacitor Cs' of the example shown in FIG. 14 respectively in initialize operation (Init.), calculating operation (Op.), and restoring operation (Res.).

Referring to FIGS. 15A, 15B, and 15C, and taking note of the ferroelectric capacitor Cs, its polarized state is described. The ferroelectric capacitor Cs in the (residual) polarized state P2 with the initialize operation (Init.) shown in FIG. 15A is changed to the polarized state P5 by the calculation operation (Op.) shown in FIG. 15B.

Although polarity of the ferroelectric capacitor Cs is not reversed in the state indicated with P5, it is displaced to some extent from the original residual polarized state indicated with P2. Therefore, if this state is left as it is or the same data read operation is repeated, the hysteresis characteristic of the ferroelectric capacitor Cs might change and correct data reading might be hindered.

Therefore, in the example of FIG. 14, the restoration operation (Res.) shown in FIG. 15C is performed to forcibly change the polarized state of the ferroelectric capacitor Cs to the state indicated with P6. With this operation, it is possible to correct the displacement of the polarized state of the ferroelectric capacitor Cs caused by the calculation operation (Op.).

Figure 16A:
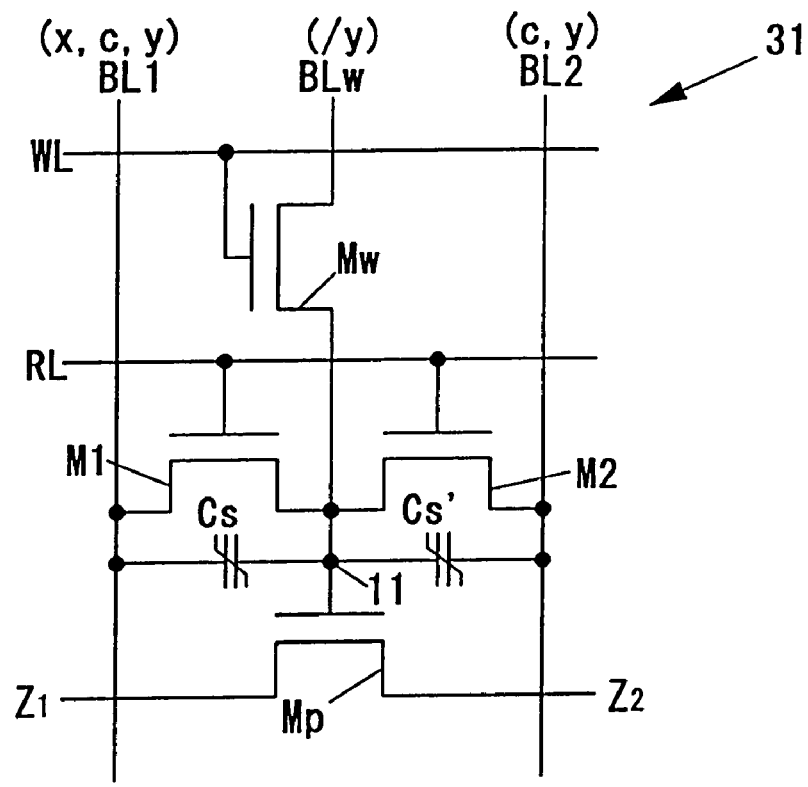
FIG. 16A is a diagram of a logical calculation circuit 31 according to still another embodiment of the invention.

Next, FIG. 16A is a diagram of a logical calculation circuit 31 according to still another embodiment of the invention. The logical calculation circuit 31 is of the same constitution as that of the logical calculation circuit 1 shown in FIG. 1.

Figure 16B:
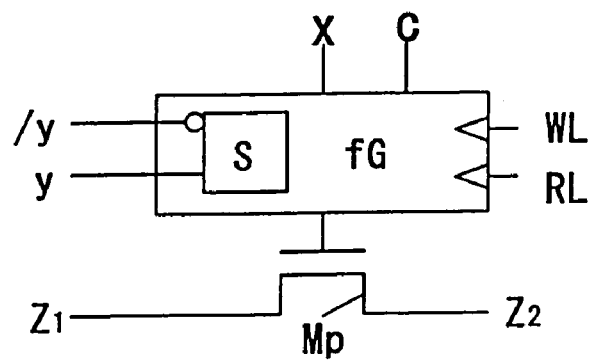
FIG. 16B shows the logical calculation circuit 31 indicated with symbols.

However, in the data write operation (WO) using the logical calculation circuit 31, as the third data to be calculated y1, /y is given to the bit line BLw, and as the fourth data to be calculated y2, y is given to the bit lines BL1 and BL2. Therefore, the logical calculation circuit 31 is expressed with symbols as shown in FIG. 16B.

Figure 17:
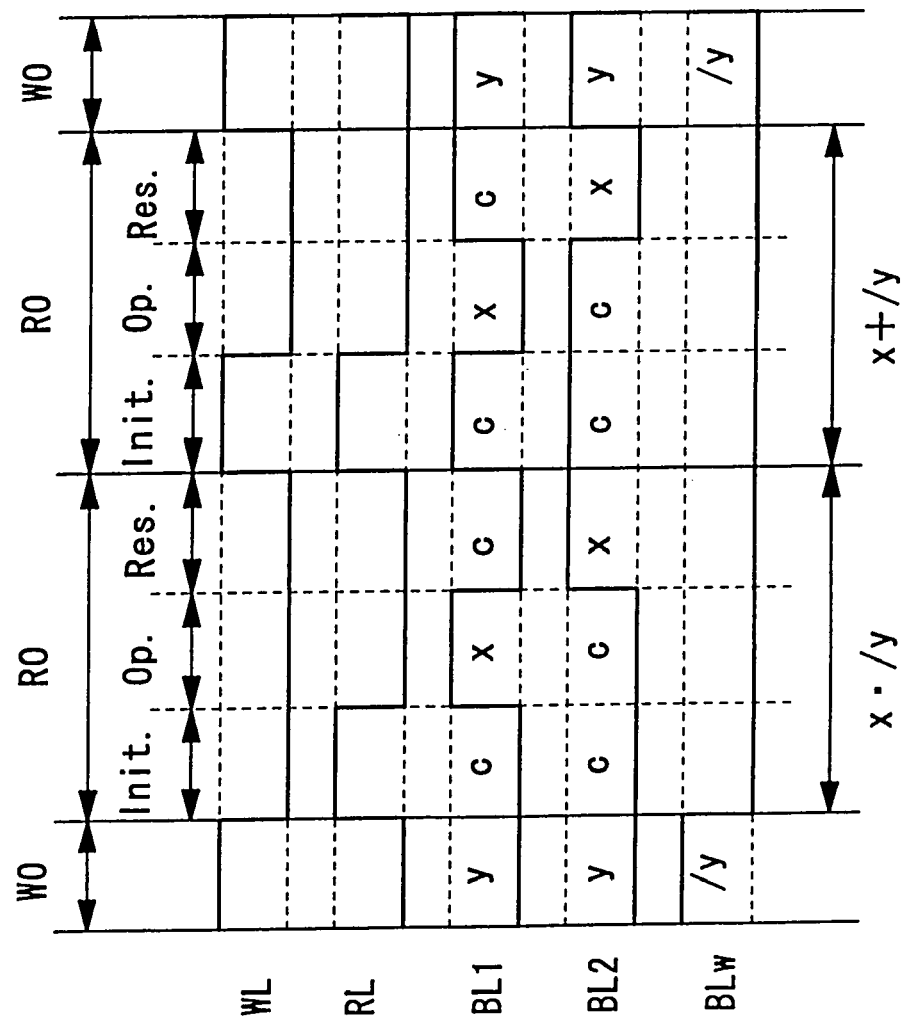
FIG. 17 is an example timing chart of the operation of the logical calculation circuit 31.
Figure 18A:
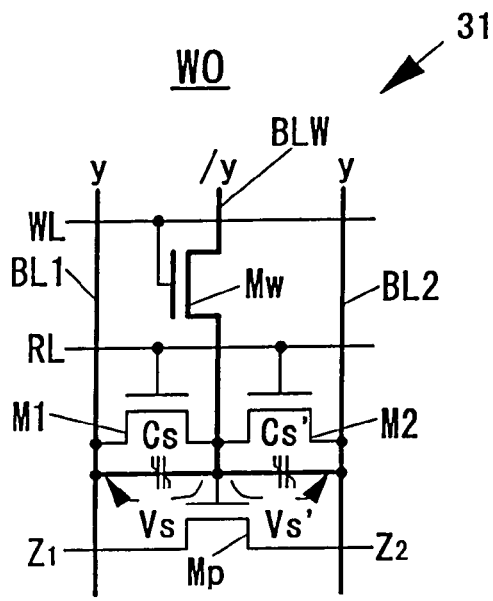
FIGS. 18A, 18B, and 18C are circuit diagrams for explaining respectively the data write operation (WO), the initializing operation in the data read operation (Init., RO), and the calculation operation in the data read operation (Op., RO) of the logical calculation circuit 31.
Figure 18B:
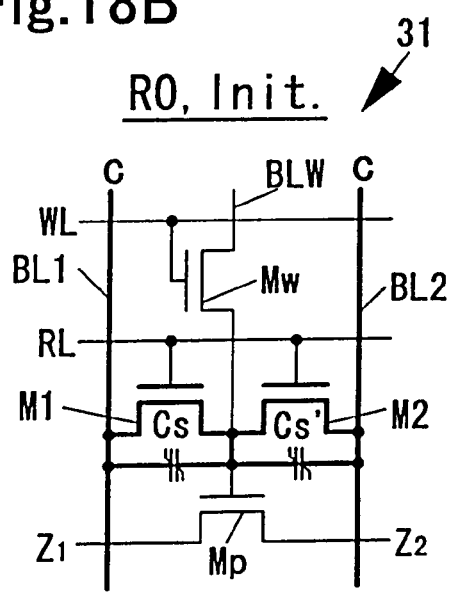
Figure 18C:
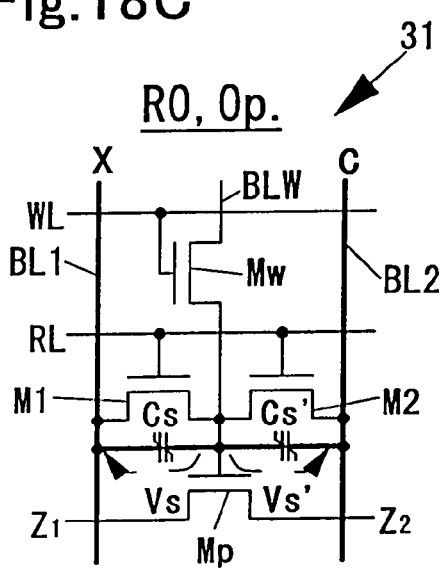
Figure 19A:
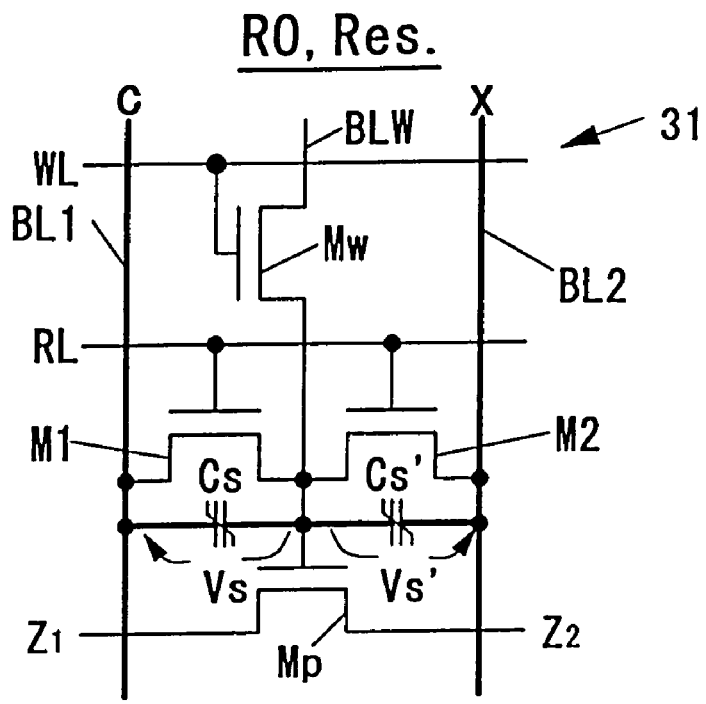
FIGS. 19A and 19B are respectively circuit diagrams for explaining the restoration operation in data reading operation (Res., RO) and standby state (Standby) of the logical calculation circuit 31.
Figure 19B:
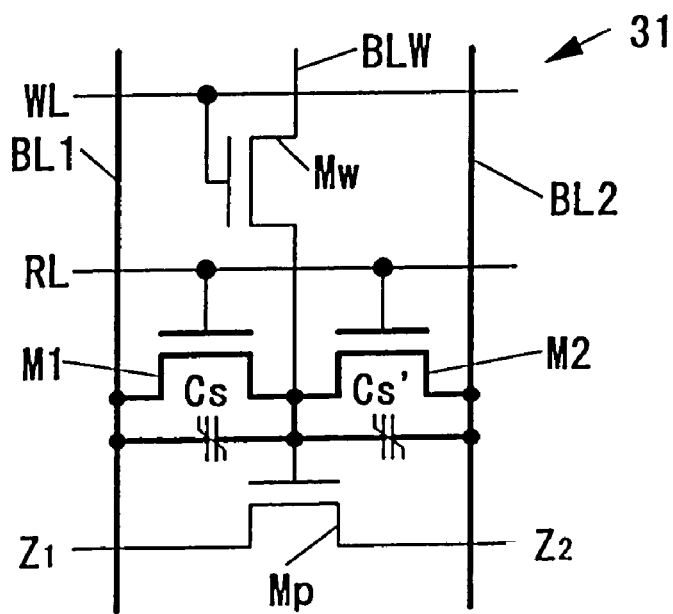

FIG. 17 is an example timing chart of the operation of the logical calculation circuit 31. This timing chart is based on the timing chart of the operation of the logical calculation circuit 1 (See FIG. 2), assuming that the third data to be calculated y1=/y and the fourth data to be calculated y2=y.

Therefore, also in the example of FIG. 17, assuming that on and off states of the transistor MP correspond to z=1 and z=0, they are expressed as follows, like in the examples shown in FIGS. 12 and 14.

$$z = /c \text{ AND } x \text{ AND } /y \text{ OR } c \text{ AND } (x \text{ OR } /y)$$

Therefore, as shown in FIG. 17, with the reference potential c=0 and c=1, the same logical calculation circuit 31 permits the following two kinds of logical calculations.

$$z = x \text{ AND } /y \text{ and } z = x \text{ OR } /y$$

Incidentally, FIGS. 18A, 18B, 18C, 19A, and 19B are circuit diagrams for explaining, respectively, the data write operation (WO), the initializing operation in the data read operation (RO, Init.), the calculation operation in the data read operation (RO, Op.), the restoration operation in the data read operation (RO, Res.) and standby state (Standby) of the logical calculation circuit 31.

These circuit diagram for explaining respective operations are based on the circuit diagrams (FIGS. 3A, 5A-5C, and 3B) for explaining respective operations of the logical calculation circuit 1, assuming that the third data to be calculated y1=/y and the fourth data to be calculated y2=y. Therefore, their explanations are not repeated here.

A plural number of the above-described, various kings of logical calculation circuits may be arranged in series and/or parallel to realize a logical calculation device to permit intended logical calculations.

Figure 20:
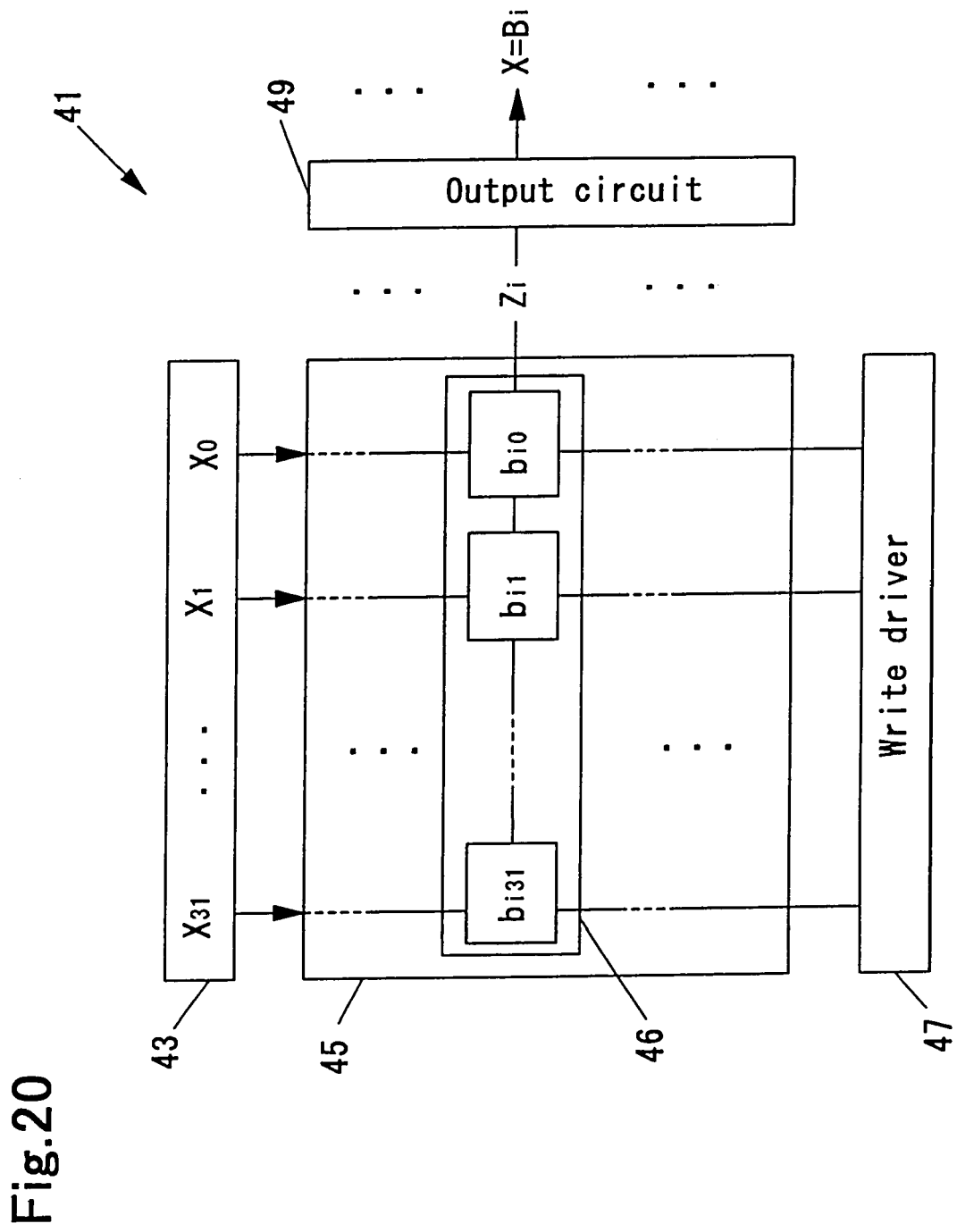
FIG. 20 is a block diagram of a logical calculation device, a content addressable memory 41, utilizing the logical calculation circuit 31.

FIG. 20 is a block diagram of a content addressable memory 41, which is a logical calculation device utilizing the logical calculation circuit 31. The content addressable memory 41 is made to serve as a coincidence search device including a search word holding section 43, a word circuit array section 45, a write drive section 47, and an output circuit section 49.

The search word holding section 43 holds a search word X, an object of search. The word circuit array section 45 is made up of a plural number of word circuits 46, . . . . The write drive section 47 performs the operation of writing a plural number of reference words Bi into the word circuit array section 45. The output circuit section 49 performs specified processes according to the output of the word circuit array section 45.

Figure 21:
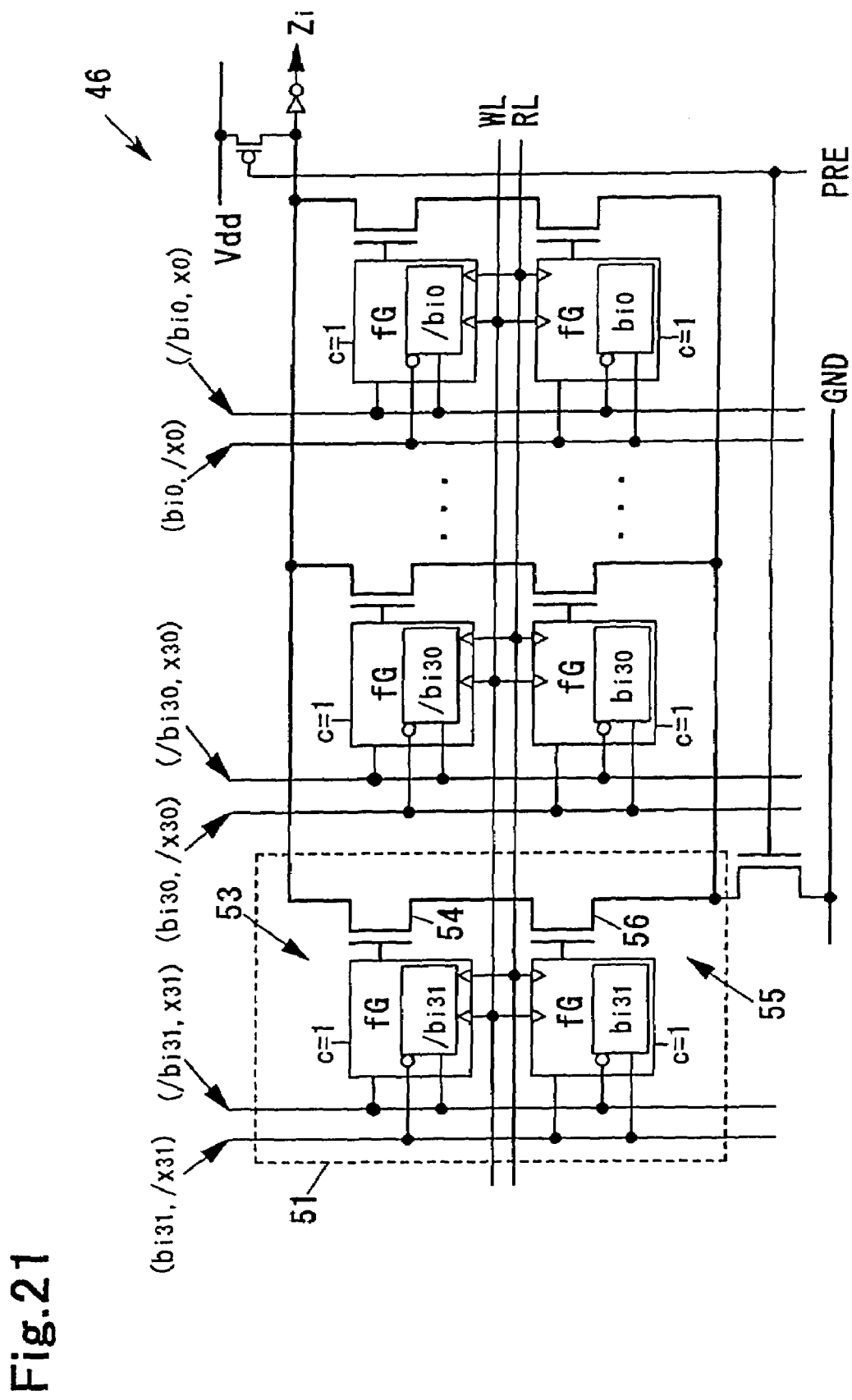
FIG. 21 is a diagram of a word circuit 46 constituted using logical calculation circuits 53, 55, . . . similar to the logical calculation circuit 31.
Figure 22A:
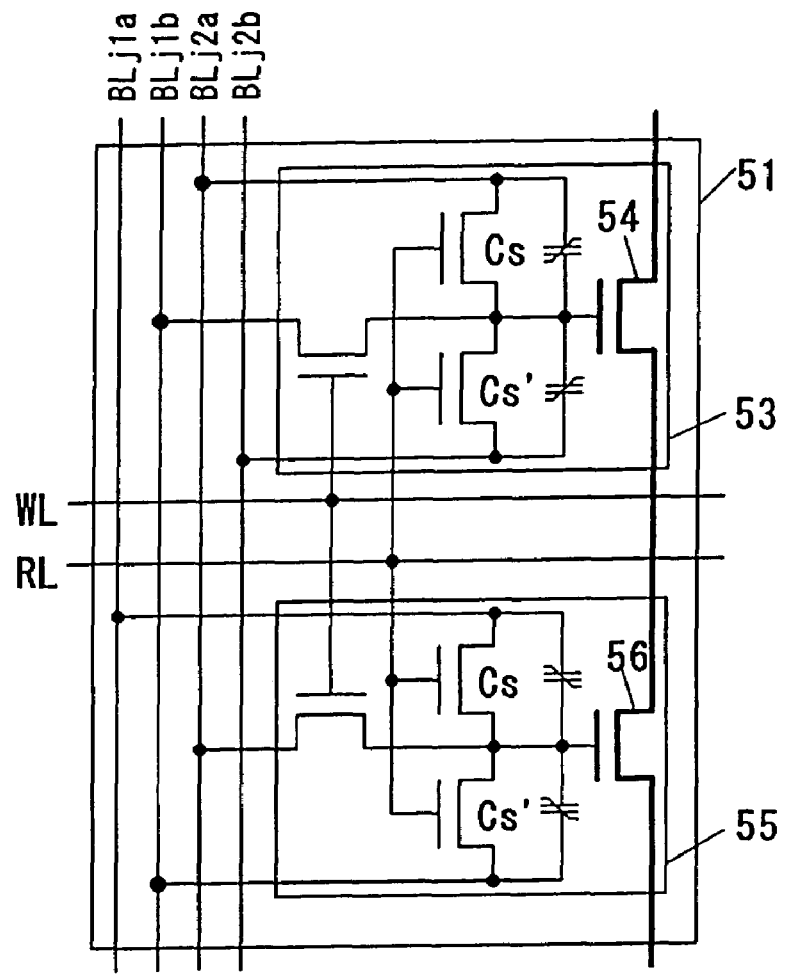
FIG. 22A is a circuit diagram of a CAM cell (content addressable memory cell) 51 made up of components, a pair of logical calculation circuits 53 and 55.

FIG. 21 is a circuit diagram of the word circuit 46 constituted using logical calculation circuits 53, 55, . . . similar to the logical calculation circuit 31. FIG. 22A is a circuit diagram of a CAM cell (content addressable memory cell) 51 made up of a pair of logical calculation circuits 53 and 55 as components. One CAM cell 51 performs one-bit coincidence judgment process.

Figure 23:
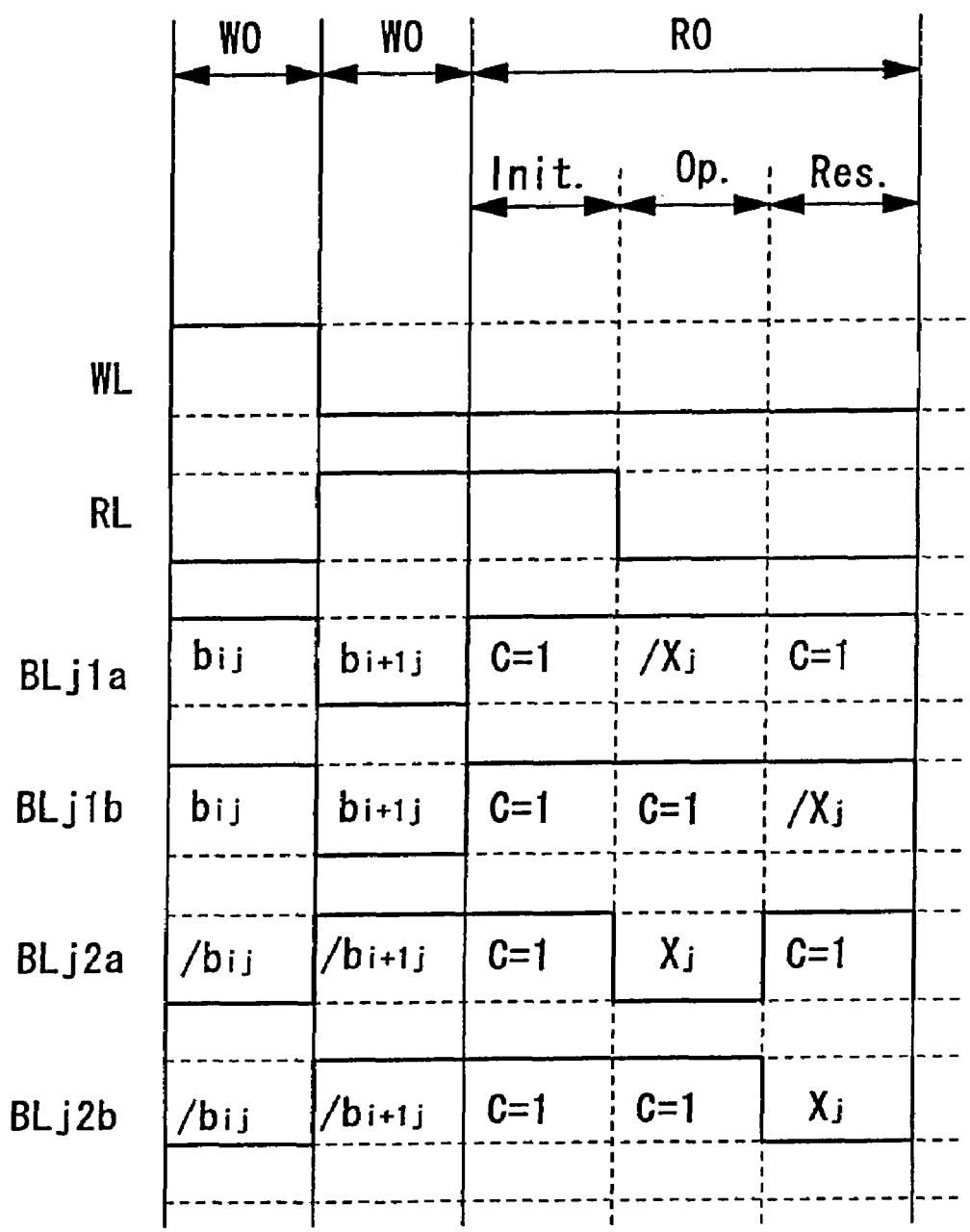
FIG. 23 is a timing chart of the operation of the CAM cell 51.

FIG. 23 is a timing chart showing the operation of the CAM cell 51. The CAM cell 51 performs a data write operation (WO) followed by a data read operation (RO). In FIG. 23, the first column (leftmost) indicates the data write operation (WO) to the CAM cell 51. The second (from the left) column shows that the data to be written to the CAM cell of the same column constituting the word circuit of the next line are transmitted through bit lines $BLj1a$, $BLj1b$, $BLj2a$, and $BLj2b$.

The bit lines $BLj2a$, $BLj2b$, and $BLj1b$, of the logical calculation circuit 53 constituting the CAM cell 51 shown in FIG. 22A correspond to the bit lines BL1, BL2, and BLw of the logical calculation circuit 31 shown in FIG. 16. Further, bit lines $BLj1a$, $BLj1b$, and $BLj2a$ in the logical calculation circuit 55 constituting the CAM cell 51 correspond to the bit lines BL1, BL2, and BLw in the logical calculation circuit 31.

Therefore, comparing the timing chart of FIG. 23 with that of FIG. 17, it is understood that the logical calculation circuits 53 and 55 of the CAM cell 51 respectively perform the following logical calculations.

$zi31u=x31$ OR $bi31$ and $zi31d=/x31$ OR $/bi31$

Figure 22B:
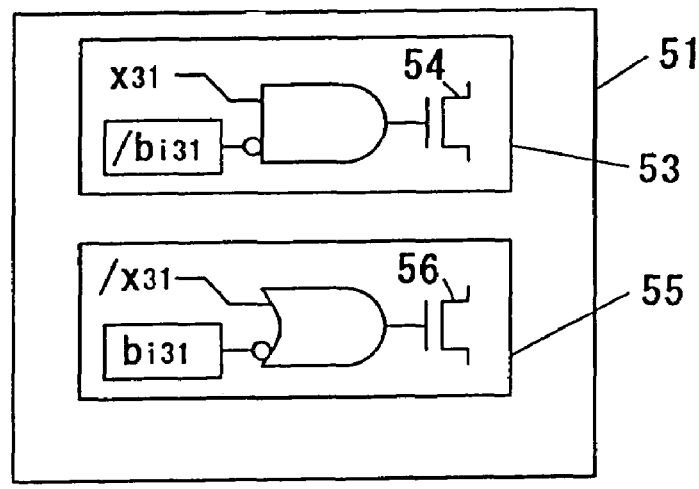
FIG. 22B shows the CAM cell 51 expressed as a logical circuit.

FIG. 22B shows the CAM cell 51 expressed as a logical circuit. When the left equation, $zi31u$, of the two equations above becomes "1", the transistor 54 of the logical calculation circuits 53 turns on. When the right equation, $zi31d$, of the two equations above becomes "1", the transistor 56 of the logical calculation circuits 55 turns on.

Therefore, in the case x31 and bi31 are different, both the transistors 54 and 56 turn on. In the case x31 and bi31 are the same, one of the transistors 54 and 56 turns off. Further, the transistors 54 and 56 are connected in series.

Therefore, it is understood by referring to FIG. 21 that the output potential of the CAM cell 51 is "0" when x31 is different from bi31, and is "1" when x31 is equal to bi31. In other words, the CAM cell 51 may be seen as a circuit for calculating x31 EXNOR bi31 (negation of exclusive OR of x31 and bi31).

As shown in FIG. 21, other CAM cells constituting the word circuit 46 are also of the same constitution as that of the CAM cell 51 and their outputs are all connected in parallel.

Therefore, with the word circuit 46, $Zi(X, Bi)=0$ only when the 32-bit search word X and the reference word Bi are in complete coincidence, otherwise $Zi(X, Bi)=1$. In other words, the work circuit 46 calculates $Zi(X, Bi)$ according to the equation given below.

$Zi(X, Bi)=0$ $(X=Bi)$ or 1 $(X \neq Bi)$

A coincidence search device having functions of both memory and calculation may be realized as described above using the logical calculation circuit 31 shown in FIG. 16.

Figure 24:
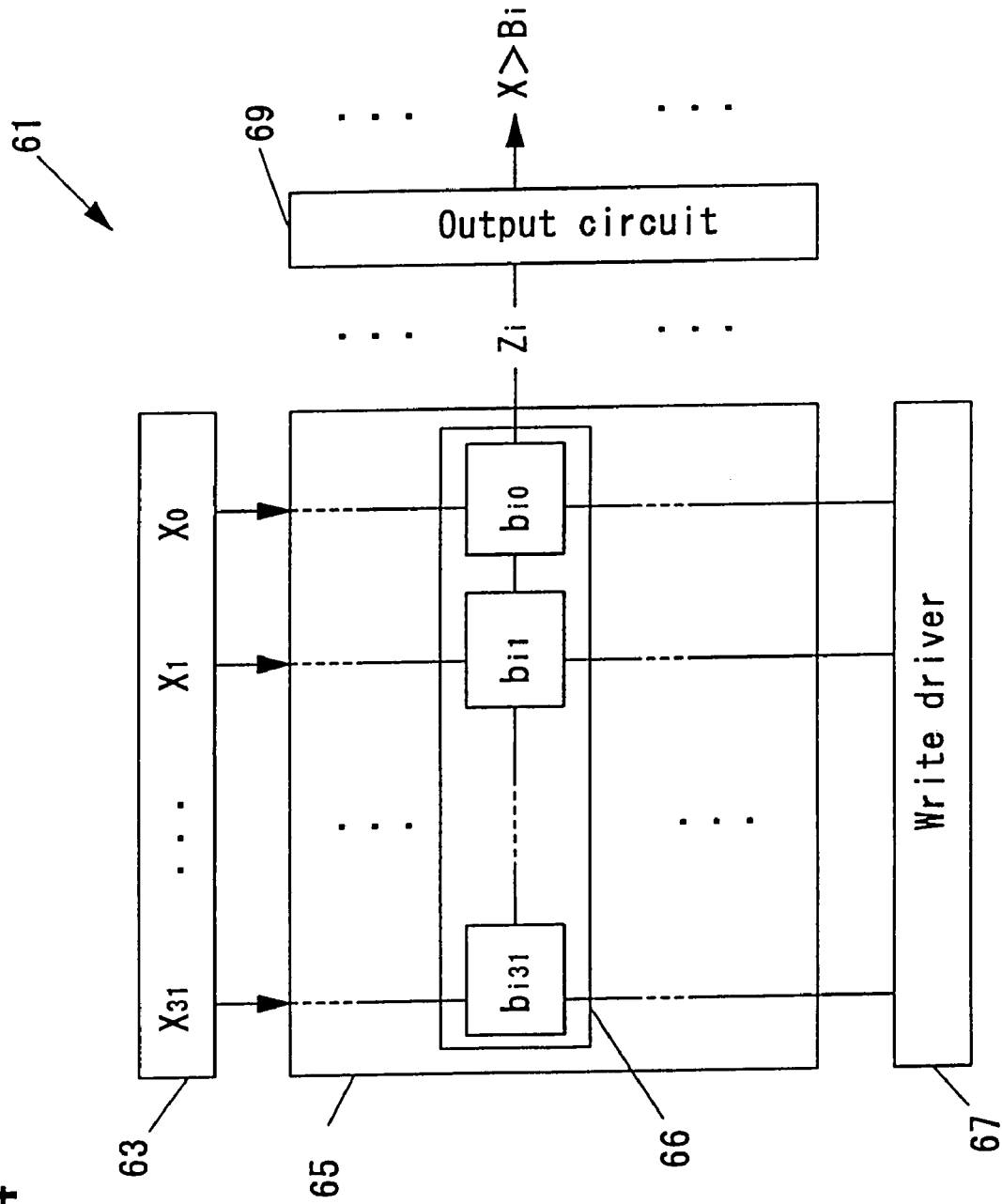
FIG. 24 is a block diagram of a content addressable memory 61, a logical calculation device utilizing the logical calculation circuit 31 above.

Next, FIG. 24 is a block diagram of a content addressable memory 61 as a logical calculation device utilizing the logical calculation circuit 31 above. The content addressable memory 61 is constituted as a device for comparing magnitudes, and includes a search word holding section 63, a word circuit array section 65, a write drive section 67, and an output circuit section 69.

The search word holding section 63 holds the search word X to be searched. The word circuit array section 65 is made up of a plural number of word circuits 66, . . . . The write drive section 67 performs the operation of writing a plural number of reference words Bi into the word circuit array section 65. The output circuit section 69 performs specified processes according to the output of the word circuit array section 65.

Figure 25:
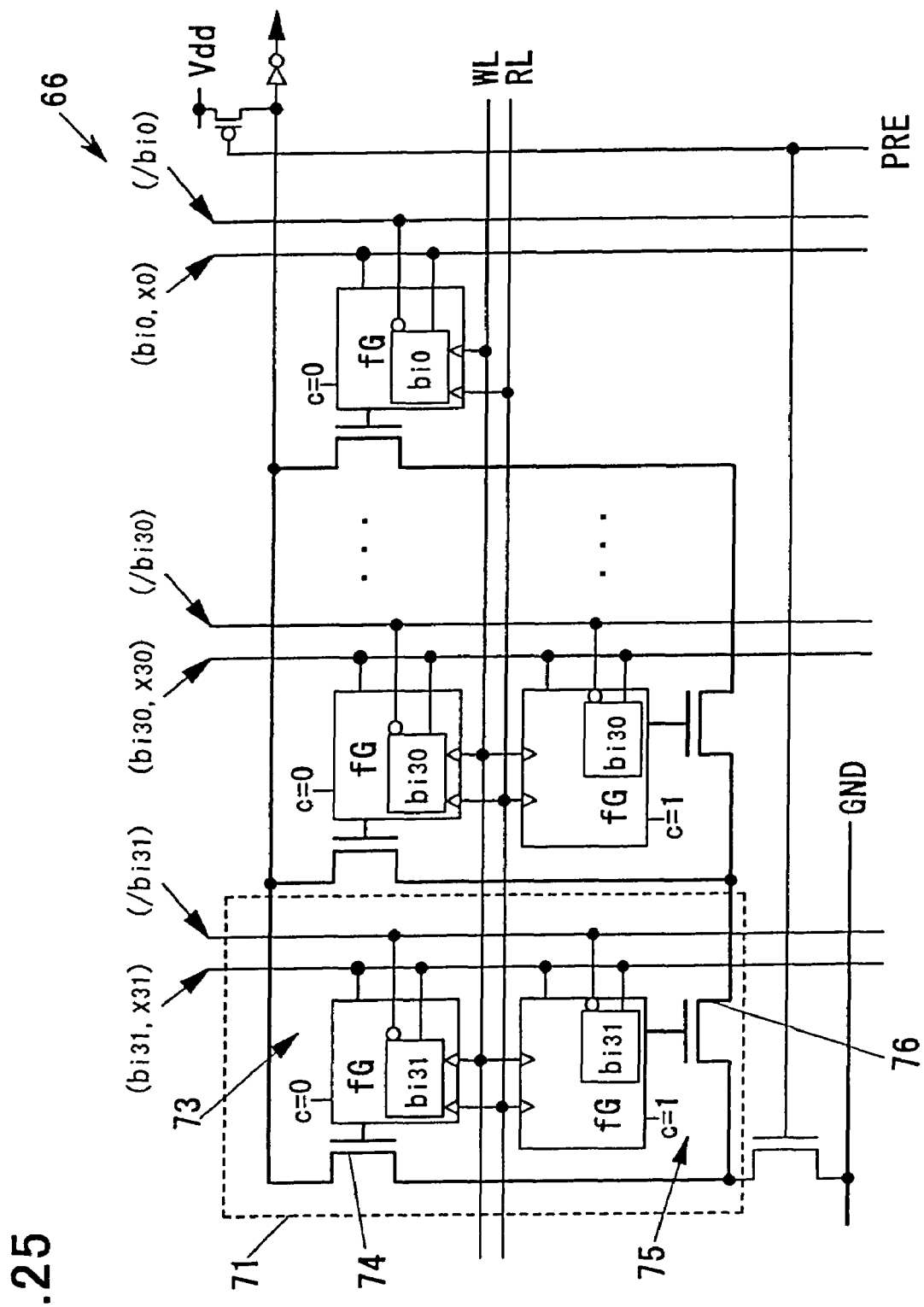
FIG. 25 is a diagram of a word circuit 66 constituted using logical calculation circuits 73, 75, . . . similar to the logical calculation circuit 31.
Figure 26A:
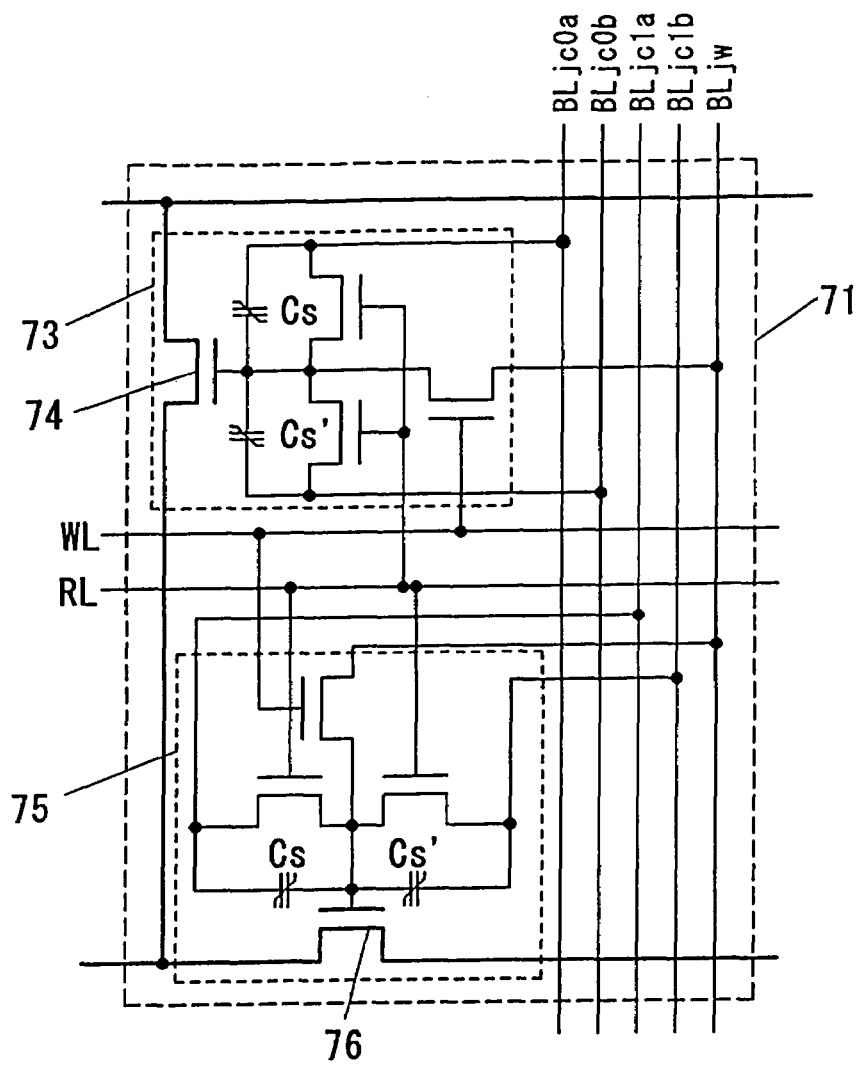
FIG. 26A is a circuit diagram of a CAM cell 71 made up of components, a pair of logical calculation circuits 73 and 75.

FIG. 25 is a diagram of the word circuit 66 constituted using logical calculation circuits 73, 75, . . . similar to the logical calculation circuit 31. FIG. 26A is a circuit diagram of a CAM cell (Content Addressable Memory Cell) 71 made up of components, a pair of logical calculation circuits 73 and 75.

Figure 27:
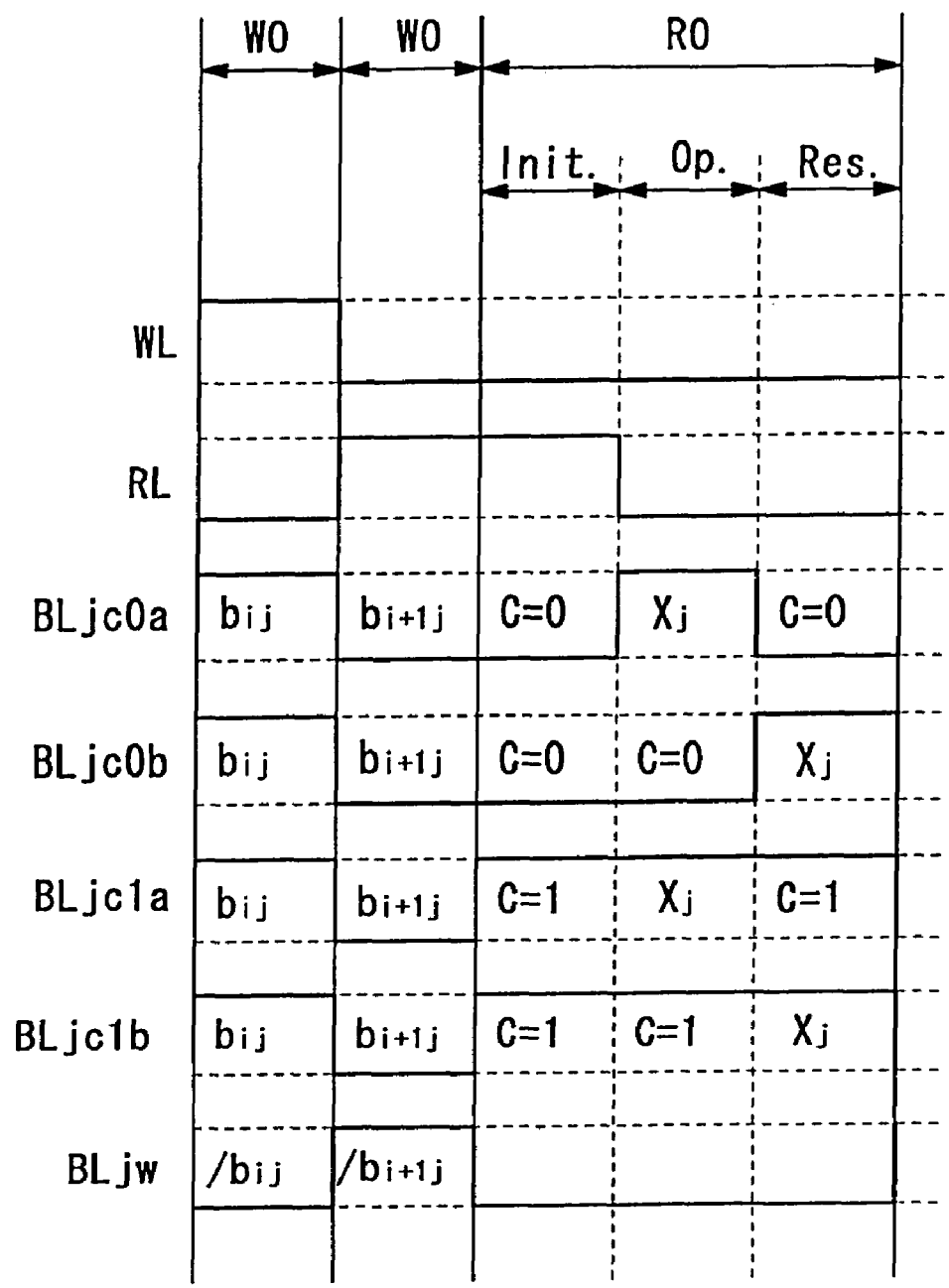
FIG. 27 is a timing chart of the operation of the CAM cell 71.

FIG. 27 is a timing chart of the operation of the CAM cell 71. In the CAM cell 71, the data write operation (WO) is followed by the data read operation (RO). In FIG. 27, the first column (leftmost) indicates the data write operation (WO) to the CAM cell 71. The second (from the left) column shows that the data to be written to the CAM cell of the same column constituting the word circuit of the next line are transmitted through bit lines $BLjc0a$, $BLjc0b$, $BLjc1a$, $BLjc1b$ and $BLjw$.

The bit lines $BLjc0a$, $BLjc0b$, and $BLjw$, of the logical calculation circuit 73 constituting the CAM cell 71 of FIG. 26A correspond to the bit lines BL1, BL2, and BLw of the logical calculation circuit 31 shown in FIG. 16. Further, bit lines $BLjc1a$, $BLjc1b$, and $BLjw$ in the logical calculation circuit 55 of the CAM ell 51 correspond to the bit lines BL1, BL2, and BLw in the logical calculation circuit 31.

Therefore, by comparing the timing chart of FIG. 27 with that of FIG. 17, it is understood that the logical calculation circuits 73 and 75 of the CAM cell 71 respectively perform the following logical calculations.

$zi31u=x31$ AND $/bi31$ and $zi31d=x31$ OR $/bi31$

Figure 26B:
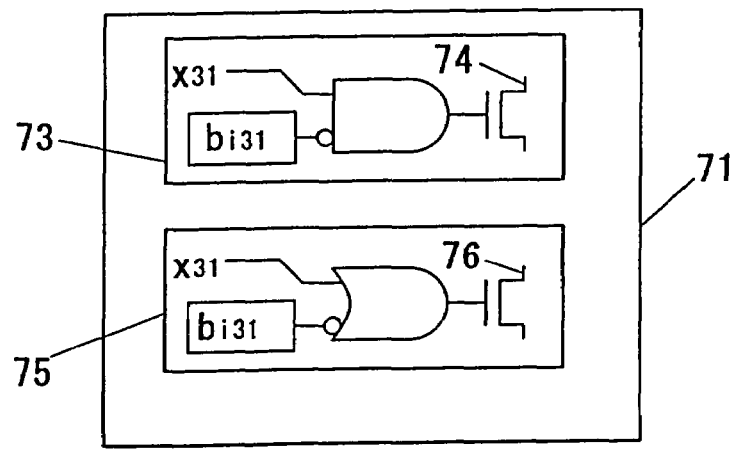
FIG. 26B shows the CAM cell 71 expressed as a logical circuit.

FIG. 26B shows the CAM cell 71 expressed as a logical circuit. When the left equation, $zi31u$, of the two equations above becomes "1", the transistor 74 of the logical calculation circuits 73 turns on. When the right equation, $zi31d$, of the two equations above becomes "1", the transistor 76 of the logical calculation circuits 75 turns on.

On the other hand, x31 AND /bi31=1 means x31>bi31; and x31 AND /bi31=0 means x31<=bi31. Further, x31 OR /bi31=1 means x31>=bi31; and x31 OR /bi31=0 means x31<bi31.

Therefore, if x31>bi31, the transistor 74 turns on; if x31<=bi31, the transistor 74 turns off. Further, if x31>=bi31, the transistor 76 turns on; if x31<bi31, the transistor 76 turns off.

As shown in FIG. 25, other CAM cells, excluding that in the lowermost position (rightmost in the figure) constituting the word circuit 66, are the same in constitution as the CAM cell 71. The lowermost CAM cell is made of only a logical calculation circuit, a counterpart of the logical calculation circuit 73 of the CAM cell 71.

Therefore, referring to FIG. 25, it is understood that the word circuit 66 is constituted to produce a comparison decision output to the effect that the search word X is greater than the reference word Bi in the case the value of at least one bit xm in question out of respective bits xj constituting the search word X is greater than the value of a counterpart bit bim of the reference word Bi, and the values of respective bits xk higher in position than the bit xm in question out of the respective bits xj constituting the search word X are respectively equal to the values of respective counterpart bits bik of the reference word Bi.

In other words, the word circuit 66 compares the magnitudes of the search word X and the reference word Bi, both having the same 32 bits. This results in $Zi(X, Bi)=1$ only when the search word X is greater than the reference word Bi, otherwise results in $Zi(X, Bi)=0$. In other words, it is understood that the word circuit 66 calculates $Zi(X, Bi)$ according to the equations given below.

$Zi(X, Bi)=1$ $(X>Bi)$ or $0$ $(X<=Bi)$, where $Zi(X, Bi)=gn-1$ OR $gen-1$ AND $(gn-2$ OR $gen-2$ AND $(gn-3$ OR $\ldots$ $ge2$ AND $(g1$ OR $ge1$ AND $g0))\ldots)$ In other words, $Zi(X, Bi)=gn-1$ OR $gen-1$ AND $gn-2$ OR $gen-1$ AND $gen-2$ AND $gn-3$ OR $\ldots$ $ge2$ AND $ge1$ AND $g0$, where $gj=xj$ AND $/bij$ and $gej=xj$ OR $/bij$.

In this way, a magnitude comparison device having functions of both memory and calculation may be realized by the use of the logical calculation circuit 31 shown in FIG. 16.

Figure 28A:
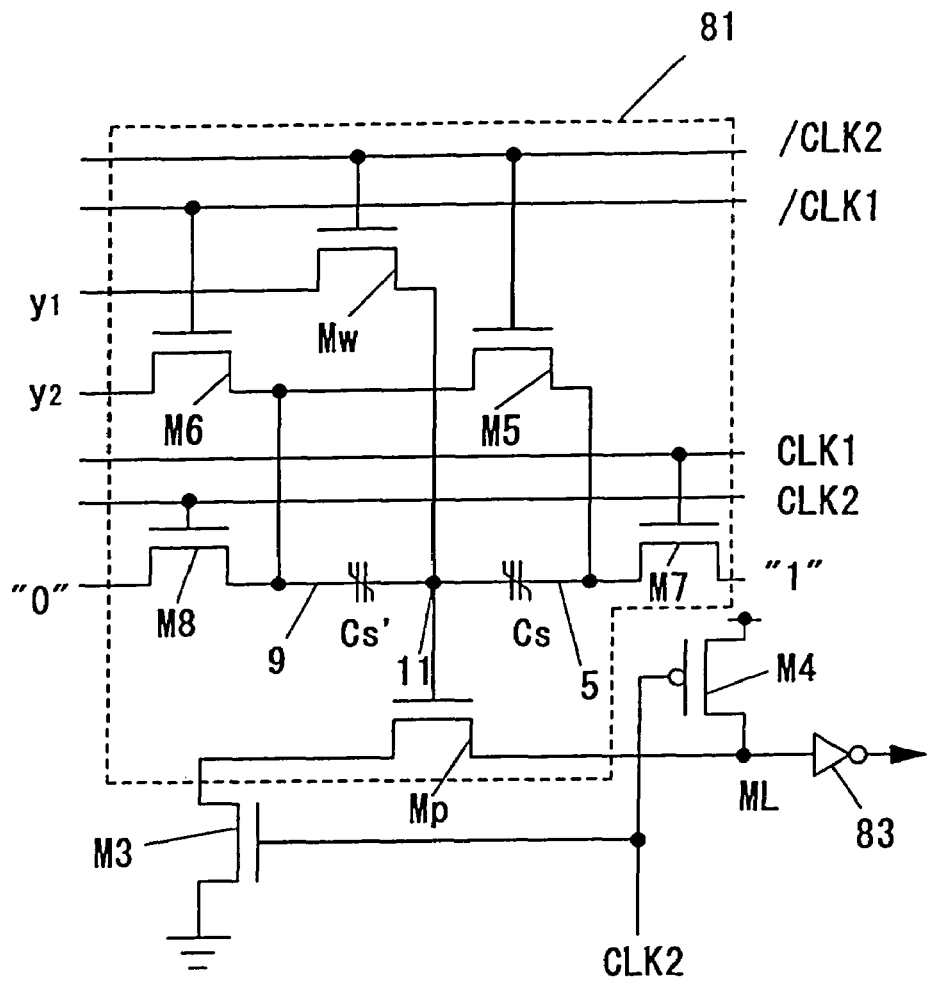
FIG. 28A shows a logical calculation circuit 81 in still another embodiment of the invention.

Next, FIG. 28A shows a logical calculation circuit 81 in still another embodiment of the invention. The logical calculation circuit 81 is an example of logical calculation circuit for use in the logical calculation device that performs pipelined process.

The logical calculation circuit 81 is similar to the logical calculation circuit 21 shown in FIG. 9 in that it includes: a storage ferroelectric capacitor Cs and a load ferroelectric capacitor Cs' connected at the coupling node 11, a transistor MP with its gate terminal connected to the coupling node 11, and transistors Mw, M3, and M4.

However, it is different from the logical calculation circuit 21 in that it includes transistors M5, M6, M7, and M8 in place of the transistors M1 and M2, and further an inverter 83.

In other words, the logical calculation circuit 81 is constituted so that the second terminal 5 of the ferroelectric capacitor Cs is given "1" through the transistor M7, and the fourth terminal 9 of the ferroelectric capacitor Cs' is given "0" through the transistor M8. The gate terminals of the transistors M7 and M8 are connected respectively clock lines CLK1 and CLK2.

It is constituted that the coupling node 11 is given the third data to be calculated y1 through the transistor Mw, and the fourth terminal 9 of the ferroelectric capacitor Cs' is given the fourth data to be calculated y2 through the transistor M6. It is also constituted that the fourth terminal 9 of the ferroelectric capacitor Cs' and the second terminal 5 of the ferroelectric capacitor Cs are interconnected through the transistor M5.

Therefore, the second terminal 5 of the ferroelectric capacitor Cs is given the fourth data to be calculated y2 through the transistors M5 and M6. The gate terminals of the transistors Mw and M5 are both connected to the clock line /CLK2. The gate terminal of the transistor M6 is connected to the clock line /CLK1.

Figure 28B:
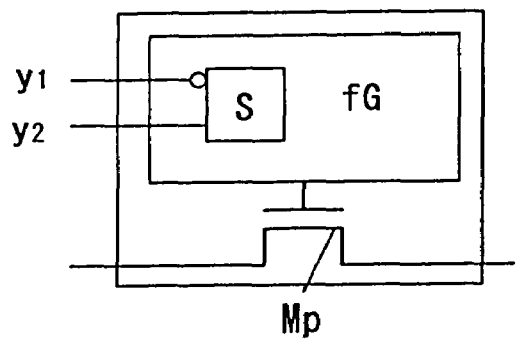
FIG. 28B is a symbol diagram of the logical calculation circuit 81.

The gate terminals of the transistors M3 and M4 are both connected to the clock line CLK2. The output signal from the transistor MP is taken out through the output line ML and the inverter 83. FIG. 28B is a symbol diagram of the logical calculation circuit 81.

Figure 29:
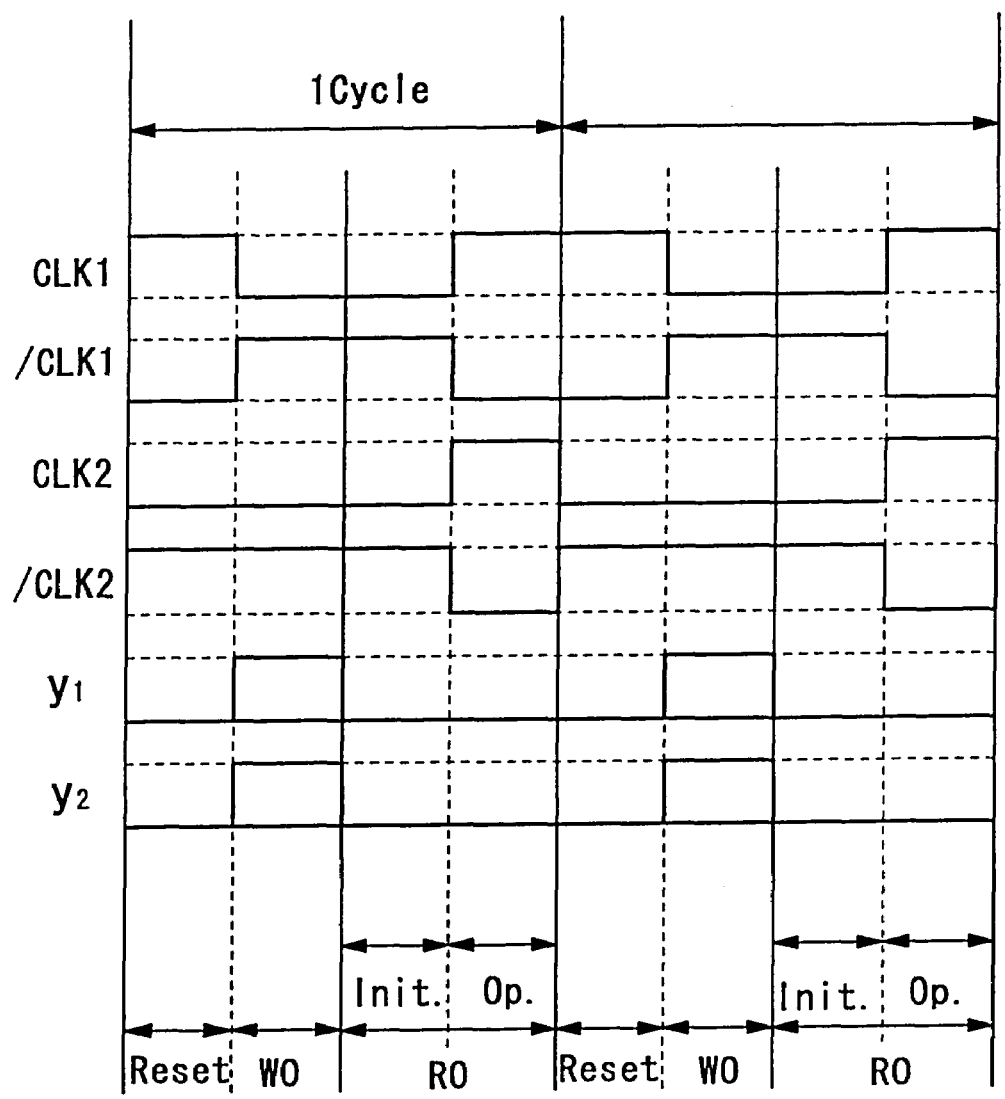
FIG. 29 is an example timing chart of the operations of the logical calculation circuit 81.
Figure 30A:
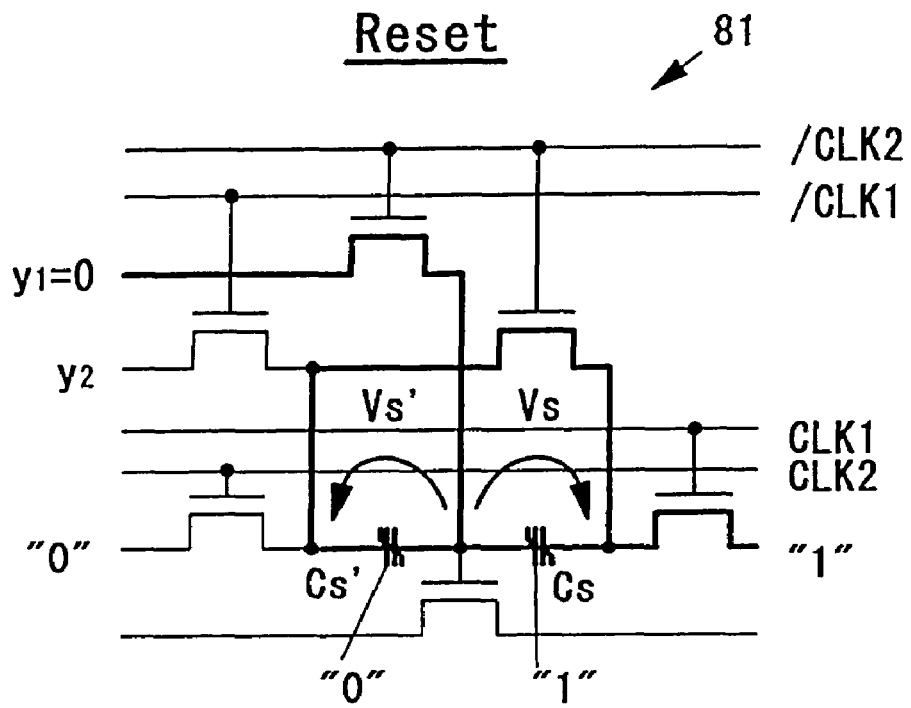
FIGS. 30A and 30B are respectively circuit diagrams for explaining the reset operation (Reset) and data write operation (WO) of the logical calculation circuit 81.
Figure 30B:
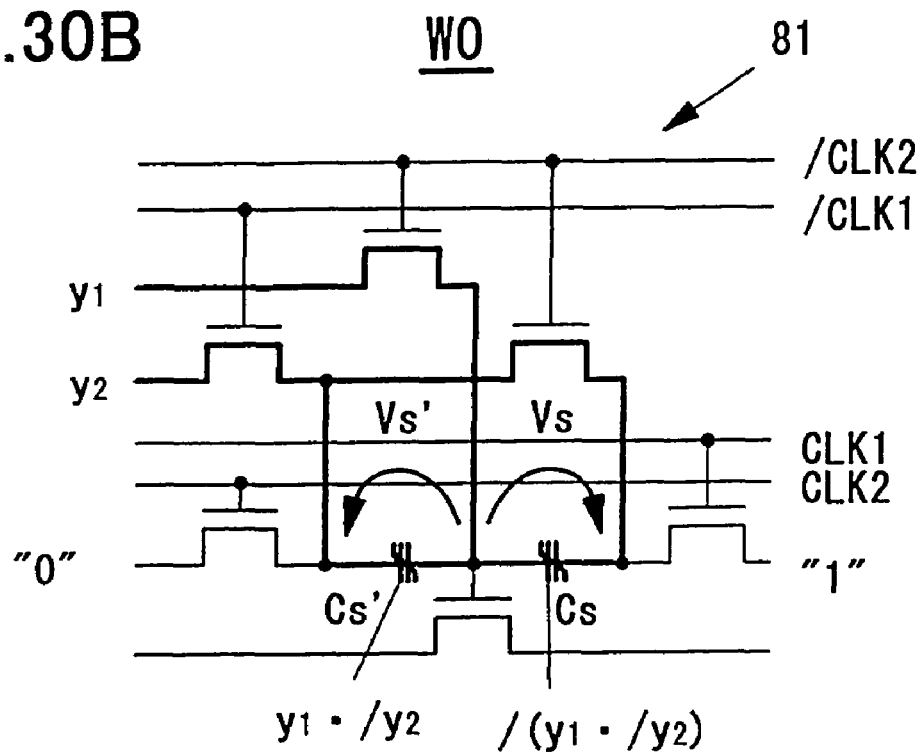
Figure 31A:
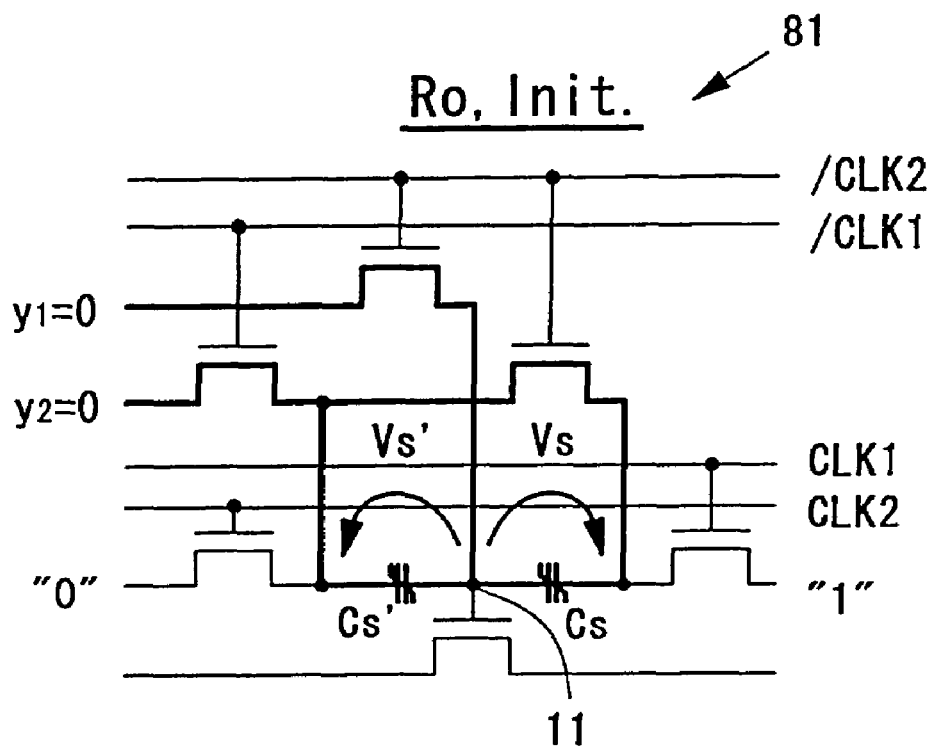
FIGS. 31A and 31B are respectively circuit diagrams for explaining the data read operation (RO) of the logical calculation circuit 81.
Figure 31B:
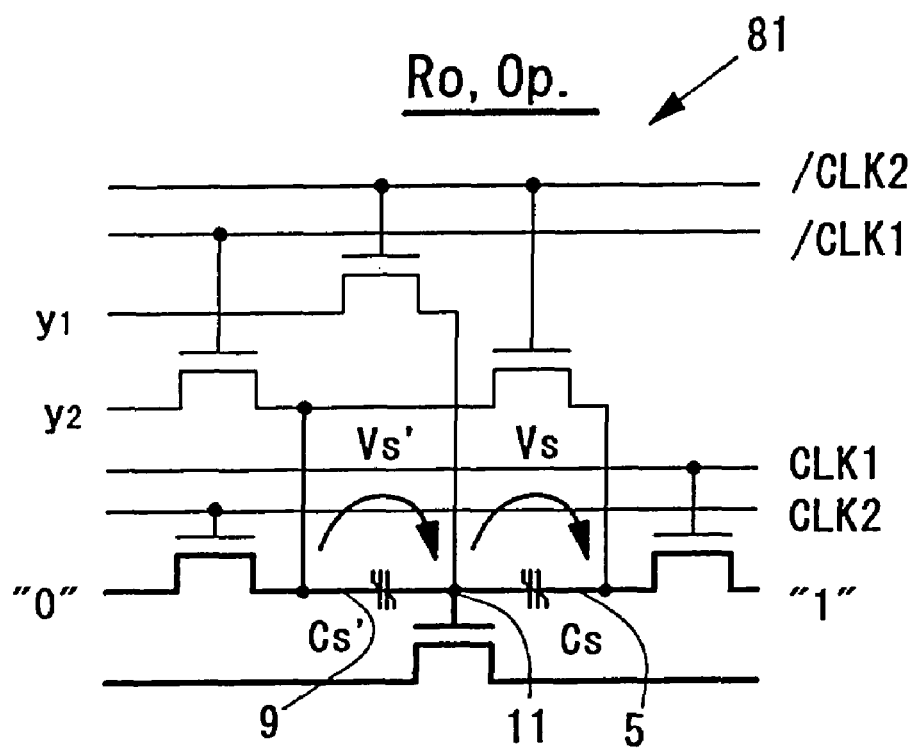

Next, the operations of the logical calculation circuit 81 are described. FIG. 29 is an example timing chart of the operation of the logical calculation circuit 81. FIGS. 30A and 30B are respectively circuit diagrams for explaining the reset operation (Reset) and data write operation (WO) of the logical calculation circuit 81. FIGS. 31A and 31B are respectively circuit diagrams for explaining the data read operation (RO) of the logical calculation circuit 81.

As shown in FIG. 29, the logical calculation circuit 81 performs one cycle of operations in the order of reset operation (Reset), data write operation (WO), and data read operation (RO).

In the reset operation (Reset), the clock lines CLK1, /CLK1, CLK2, and /CLK2 are respectively given "1", "0", "0", and "1". Further, y1 is equal to 0. Therefore, as shown in FIG. 30A, the reset operation (Reset) makes the residual polarized states of the ferroelectric capacitor Cs and the ferroelectric capacitor Cs' respectively $s=1$ and $s'=0$.

As shown in FIG. 29, in the ensuing data write operation (WO), the clock lines CLK1, /CLK1, CLK2, and /CLK2 are respectively given "0", "1", "0", and "1".

Therefore, as shown in FIG. 30B, the residual polarized state s of the ferroelectric capacitor Cs and the residual polarized state s' of the ferroelectric capacitor Cs' are updated. That is, the data write operation (WO) makes the following calculation and the results are stored.

$s=/sb$ AND $/y1$ AND $y2$ OR $sb$ AND $(/y1$ OR $y2)$

In this example, because $sb=1$ by the reset operation (Reset), the above expression becomes as follows.

$s=/y1$ OR $y2=/(y1$ AND $/y2)$

Here, a new polarized state s' of the ferroelectric capacitor Cs' is expressed with the following equation.

$s'=y1$ AND $/y2$

As shown in FIG. 29, the ensuing data read operation (RO) is performed in the order of initialize operation (Init.) and calculation operation (Op.). In the initialize operation (Init.), the clock lines CLK1, /CLK1, CLK2, and /CLK2 are respectively given "0", "1", "0", and "1". Further, it is made that y1=0 and y2=0.

As shown in FIG. 31A, the above operations allows the coupling node 11 to be pre-charged with the reference potential c corresponding to a specified logical operator without changing the residual polarized states s and s' of the ferroelectric capacitors Cs and Cs'. In this example, the reference potential c=0.

In the calculation operation (Op.) subsequent to the initialize operation (Init.), the clock lines CLK1, /CLK1, CLK2, and /CLK2 are respectively given "1", "0", "1", and "0".

As shown in FIG. 31B, the second terminal 5 of the ferroelectric capacitor Cs and the fourth terminal 9 of the ferroelectric capacitor Cs' are respectively given "1" and "0". That is, the second data to be calculated x and the reference potential c corresponding to a specified logical operator are respectively x=1 and c=0. This operation causes the transistor MP to turn on or off according to the potential occurring at the coupling node 11.

With the on and off states of the transistor MP made to correspond to z=1 and z=0, they are expressed with the equation below.

$$z = /c \text{ AND } x \text{ AND } /s \text{ OR } c \text{ AND } (x \text{ OR } /s)$$

In this example, because x=1 and c=0, the above equation is expressed as $$z = /s.$$

Putting the calculation contents of the above data write operation (WO) into the above equation results in that the logical calculation circuit 81 of FIG. 28 performs the following calculation.

$$z = //(y1 \text{ AND } /y2) = y1 \text{ AND } /y2$$

Further, if it is made that s=0 in the above reset process (Reset), it ia possible to perform the following calculation.

$$z = y1 \text{ OR } /y2$$

Figure 32:
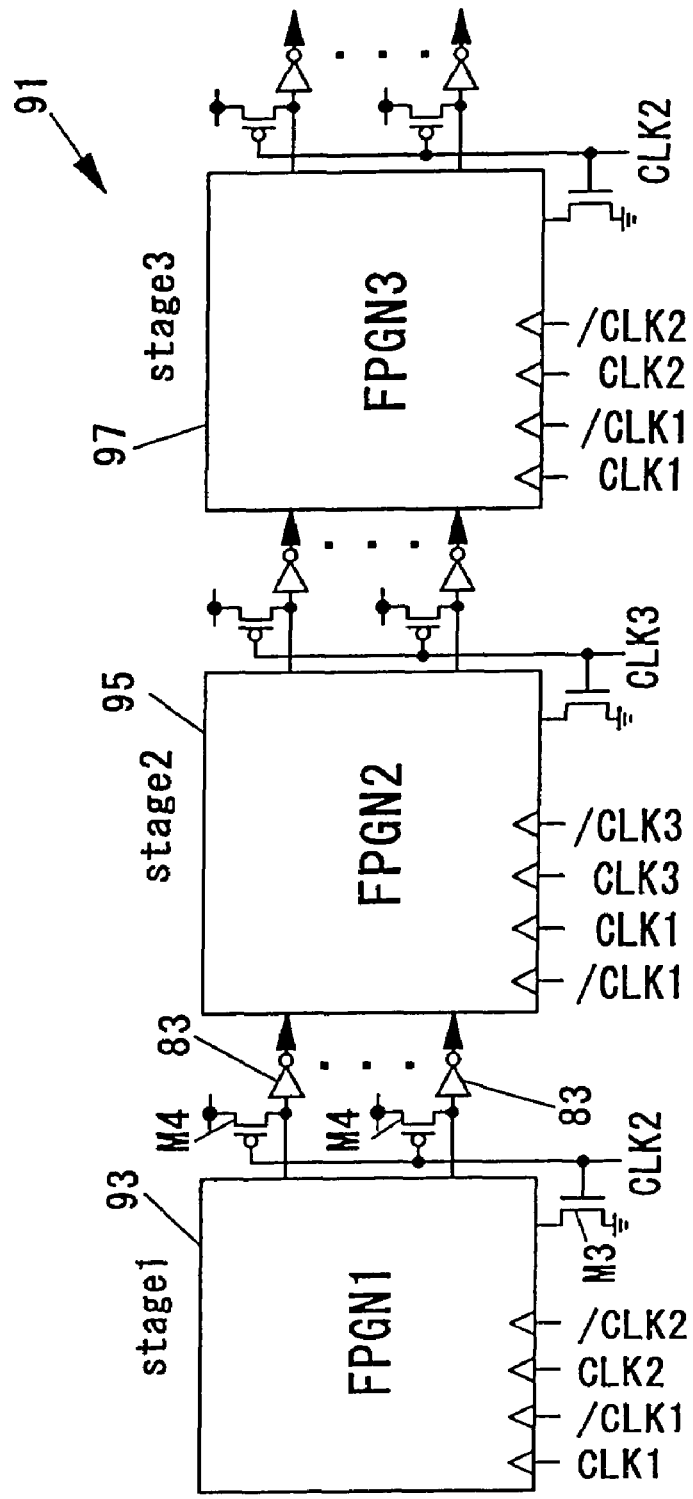
FIG. 32 is an example block diagram of a pipelined logical calculation device 91 using a plural number of logical calculation circuits.

FIG. 32 is an example block diagram of a pipelined logical calculation device 91 using a plural number of logical calculation circuits. The pipelined logical calculation device 91 of FIG. 32 is a device for performing a pipelined process in which a series of logical calculations are divided into a plural number of stages to be implemented sequentially.

This example is constituted to perform logical calculations in three stages. To perform calculations in the first stage (Stage 1), the second stage (Stage 2), and the third stage (Stage 3), the first stage calculation section 93, the second stage calculation section 95, and the third stage calculation section 97 are connected in series.

In this example, the respective calculation sections 93, 95, and 97 are constituted as a functional pass-gate network (FPGN) using a plural number of the above logical calculation circuits 81.

It is constituted that the first and third stage calculation sections 93 and 97 operate according to signals of the clock lines CLK1 and CLK2, and the second stage calculation section 95 operates according to the signals of the clock lines CLK1 and CLK3.

Figure 33:
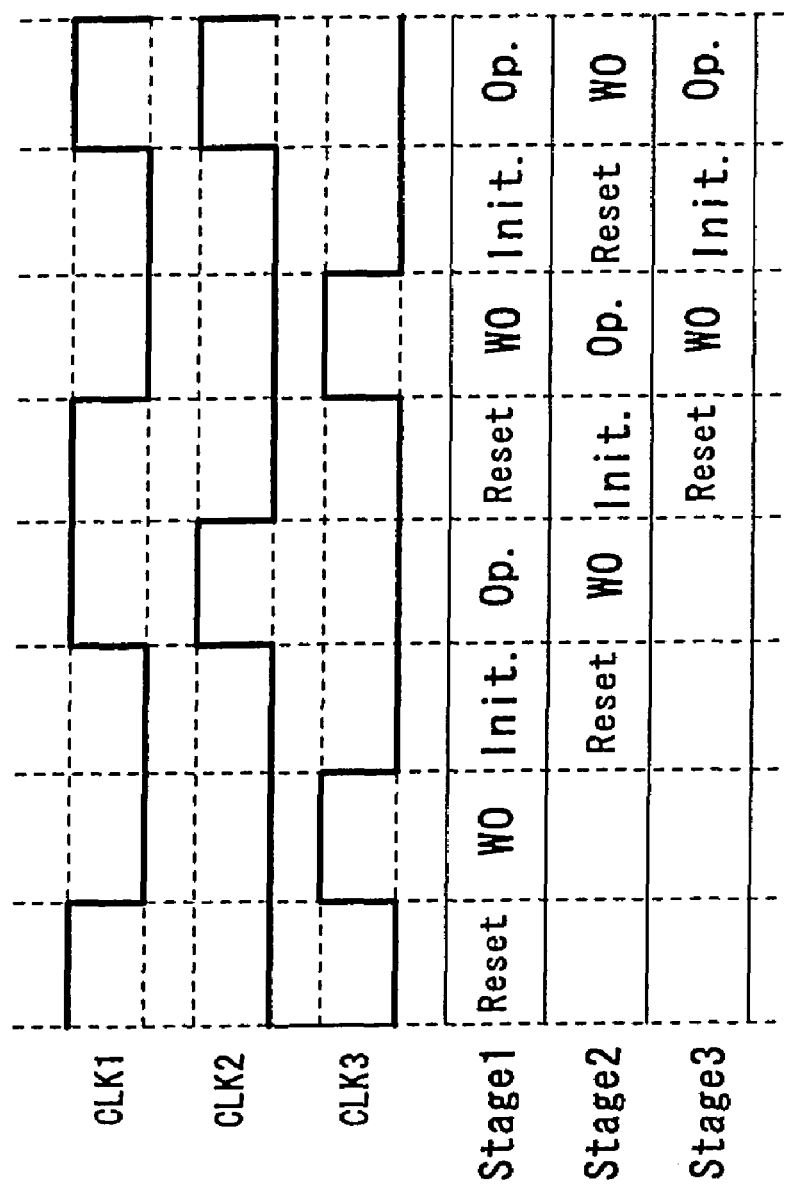
FIG. 33 is an example timing flowchart of the operations of the pipelined logical calculation device 91.

FIG. 33 is an example timing flowchart of the operation of the pipelined logical calculation device 91. As shown in FIG. 33, the signal of the clock line CLK3 is delayed by a half cycle from the signal of the clock line CLK2. Therefore, calculation operations go on sequentially with a half-cycle delay one after another in the order of the first stage (Stage 1), second stage (Stage 2), and the third stage (Stage 3).

As described above, when the pipelined process is performed, for example, using a plural number of the logical calculation circuits 81, storage and calculation indispensable for the pipelined process need not be performed with different circuits, so that the space required for wiring is reduced by a great margin.

Figure 34:
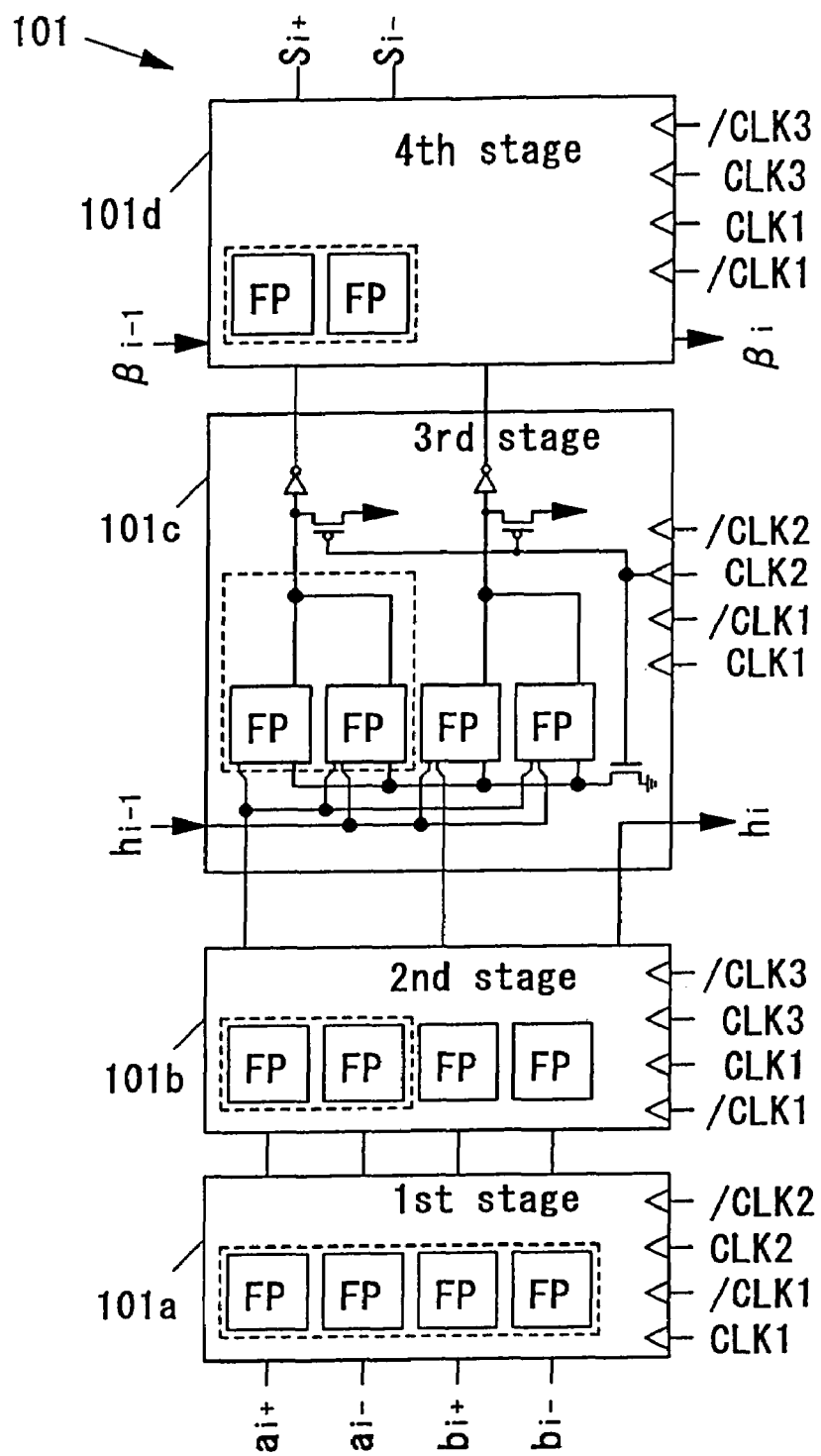
FIG. 34 is a block diagram of constitution of the pipelined logical calculation device of FIG. 32 embodied as a full adder 101.

FIG. 34 is a block diagram of constitution of the pipelined logical calculation device of FIG. 32 embodied as a full adder 101. The full adder 101 shown in FIG. 34 is a pipelined signed-digit full adder for performing addition of signed-digit binary numbers by pipelines process.

The full adder 101 divides addition of signed-digit binary numbers into four states and sequentially performs calculation stages. To perform calculations in the first stage, the second stage, the third stage, and the fourth stage, the first stage calculation section 101a, the second stage calculation section 101b, the third stage calculation section 101c, and the fourth stage calculation section 101d are connected in series.

In this example, the first to fourth stage calculation sections 101a-101d are each embodied as a functional pass-gate network (FPGN) respectively using the above logical calculation circuit 81 as a functional pass-gate (FP).

It is constituted that both the first and third stage calculation sections 101a and 101c operate according to the signals of the clock lines CLK1 and CLK2, and both the second and fourth stage calculation sections 101b and 101d operate according to the signals of the clock lines CLK1 and CLK3.

Figure 35:
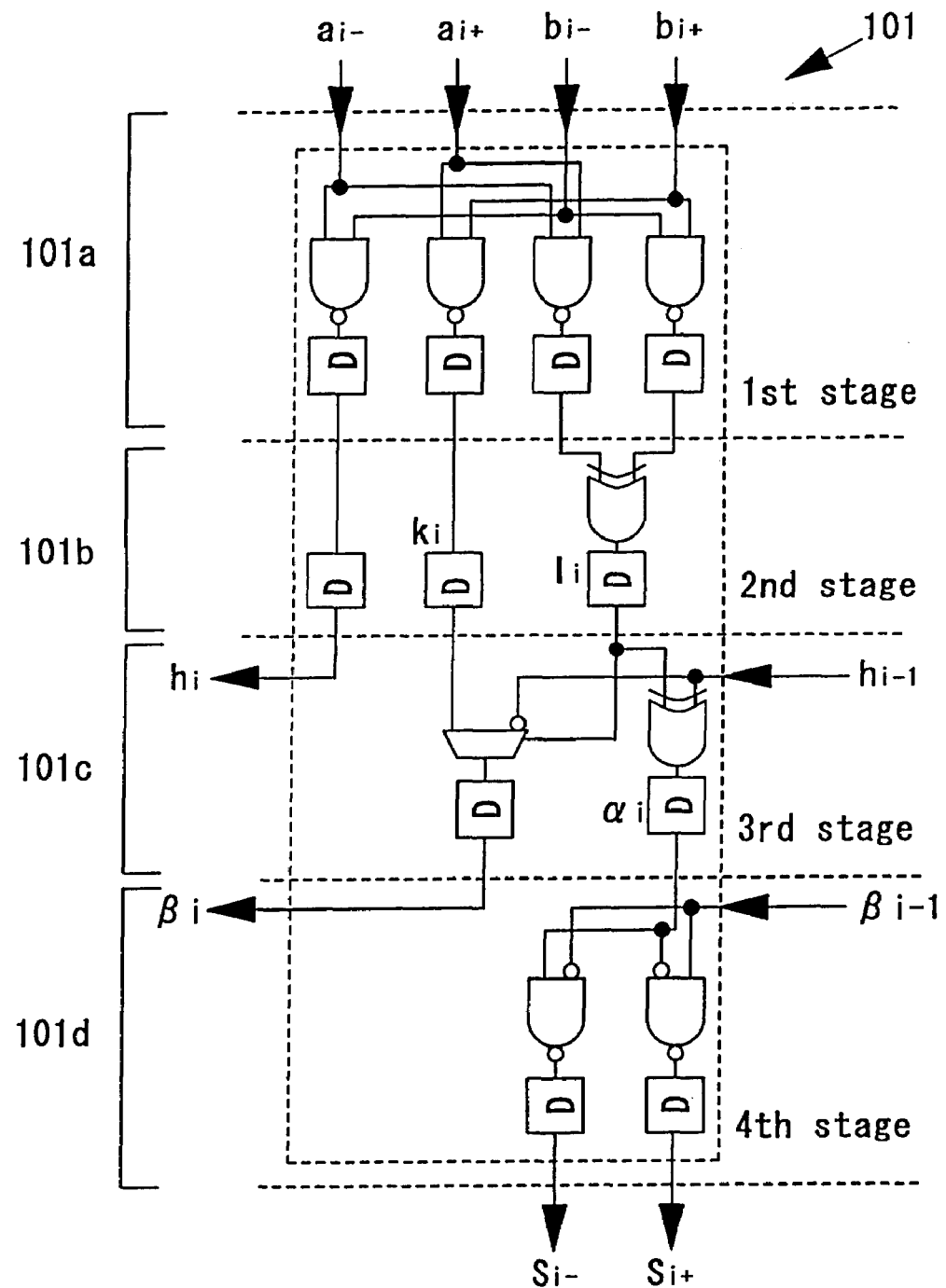
FIG. 35 is an equivalent circuit diagram of the full adder 101 expressed as a logical circuit.

Therefore, with the full adder of FIG. 34, operations of addition go on in the order of the first, second, third, and fourth stages with a half-cycle delay one after another. FIG. 35 is an equivalent circuit diagram of the full adder 101 expressed with logical circuits.

As is seen from FIGS. 34 and 35, the first stage calculation section 101a of the full adder 101, using two logical calculation circuits 81, calculates two binary numbers ($ai^+$ OR $ai^-$) and ($bi^+$ OR $bi^-$) corresponding to signed-digit binary numbers, an augend ($ai^+$, $ai^-$) and an addend ($bi^+$, $bi^-$).

The first stage calculation section 101a, using other two logical calculation circuits 81, and based on the augend ($ai^+$, $ai^-$) and the addend ($bi^+$, $bi^-$), calculates $ki = ai^+$ OR $bi^+$ and a first carry information $hi = ai^-$ OR $bi^-$ of the bit in question, and stores them.

The second stage calculation section 101b, using a pair of logical calculation circuits 81 connected in parallel, calculates one binary number $1i = (ai^+$ OR $ai^-)$ EXOR ($bi^+$ OR $bi^-$) corresponding to the exclusive OR of two binary numbers ($ai^+$ OR $ai^-$) and ($bi^+$ OR $bi^-$) stored in the previous stage, as a first addition result and stores it.

The second stage calculation section 101b takes in ki and the first carry information hi both stored in the previous stage and stores them using two logical calculation circuits 81.

The third stage calculation section 101c, using another pair of the logical calculation circuits 81 connected in parallel, calculates one binary number $\alpha i = 1i$ EXOR $hi-1$ corresponding to the exclusive OR of the first addition result $1i$ stored in the previous stage and the first carry information $hi-1 = ai-1^-$ OR $bi-1^-$ from the previous bit as the second addition result and stores it.

Also the third stage calculation section 101c, based on the ki, the first addition result li, both stored in the previous stage, and the first carry information hi−1 from the previous bit, and using two logical calculation circuits 81, calculates the second carry information in the bit in question $\beta i = /li$ AND $ki$ OR $li$ AND $/hi-1$, and stores it.

The fourth stage calculation section 101d, based on the second addition result $\alpha i$ stored in the previous stage, and the second carry information $\beta i-1 = /li-1$ AND $ki-1$ OR $li-1$ AND $/hi-2$ from the previous bit, and using two logical calculation circuits 81, calculates a signed-digit binary number ($si^+$, $si^-$) as an addition result of the logical calculation device 101 according to the equation given below.

$$si^+ = /\alpha i \text{ AND } \beta i-1 \text{ and } si^- = \alpha i \text{ AND } /\beta i-1$$

Here, the signed-digit binary number ($ai^+$, $ai^-$) is assumed to take one of values (1, 0), (0, 0), and (0, 1), and respectively corresponds to 1, 0, and −1. In other words, it may be defined that the signed-digit binary number ($ai^+$, $ai^-$) = $ai^+ - ai^-$. This is also true for other signed-digit binary numbers.

Approximately the right half of the logical calculation circuit 101 shown in FIG. 35 corresponds to the addition result calculation section, and approximately the left half to the carry information calculation section.

Figure 36:
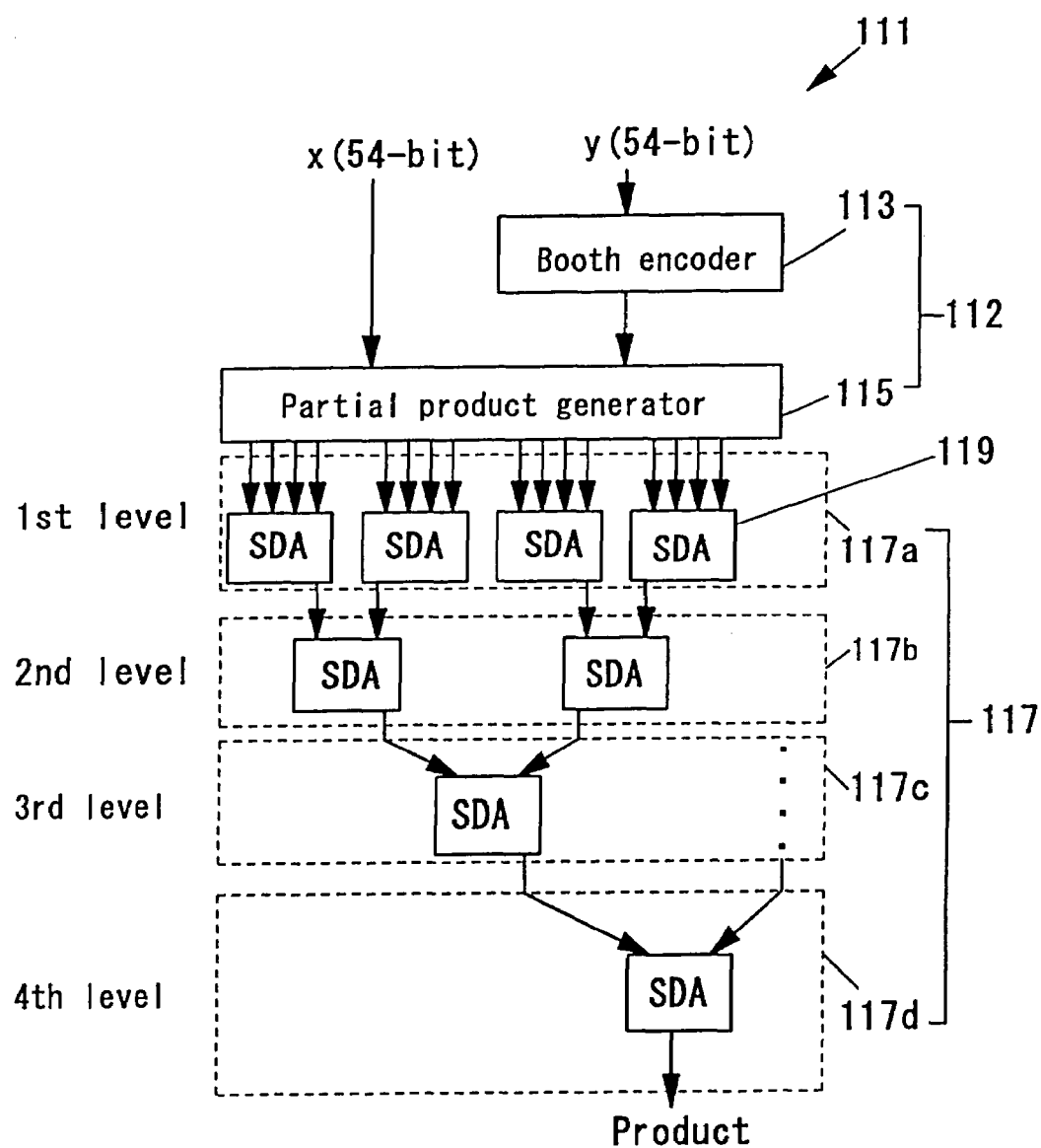
FIG. 36 is an example block diagram of a pipelined multiplier using a plural number of the full adder 101 of FIG. 34 as element calculation devices.

FIG. 36 is an example block diagram of a pipelined multiplier using a plural number of the full adder 101 of FIG. 34 as element calculation devices. The pipelined multiplier 111 shown in FIG. 36 is a device for performing pipelined multiplication process in which multiplication is divided into a plural number of levels to be sequentially processed. In this example, the multiplier 111 is assumed to be constituted to perform multiplication of binary numbers of 54×54 bits.

The multiplier 111 includes a partial product generating section 112 and an addition section 117. The partial product generating section 112 includes a booth encoder 113 and a partial product generator 115 to generate a partial product corresponding to a multiplicand and a multiplier.

That is, the partial product generating section 112 first uses a second-order Booth's algorithm to produce, from a 54-bit multiplicand x and a 54-bit multiplier y, 27 pieces of partial products corresponding to approximately half the number of bits of the multiplier y. Approximately half of these partial products, or 13 partial products corresponding to even number-th partial products, are inverted partial products (with all the component bits inverted). The inverted partial products are named as /PP2, /PP4, . . . , /PP26 and non-inverted partial products as PP1, PP3, . . . , PP27.

Next, the partial product generating section 112 produces one signed-digit partial product for a pair of adjacent partial products. In other words, signed-digit partial products SDPP1, SDPP2, . . . , SDPP13 are produced respectively from partial products PP1 and /PP2, PP3 and /PP4, . . . , PP25 and /PP26.

It is constituted for example on the assumption that the i-th bits of the partial products PP3 and /PP4 are respectively ppi3 and /ppi4, the signed-digit partial product SDPP2 with the i-th bit being a signed-digit binary number (ppi3, /ppi4) is produced. According to the above definition of the signed-digit binary number $(ai^+, ai^-)=ai^+-ai^-$, $(ppi3, /ppi4)=ppi3-/ppi4$. It is assumed to express the above relationship of the partial products PP3, /PP4, and the signed-digit partial product SDPP2 as SDPP2=(PP3, /PP4)=PP3−/PP4.

Because an expression using a complement of 2 results in PP3+PP4=PP3−/PP4−1, it becomes PP3+PP4=SDPP2−1=SDPP2+(0, 1). In other words, the sum of a pair of PP3 and PP4 may be expressed as a signed-digit binary number obtained by adding an additional binary signed-digit binary number (0, 1) to the lowermost bit of one signed SDPP2.

Likewise, the sum of the other pair of partial products PP5 and PP6 may be expressed as a signed-digit binary number obtained by adding an additional binary signed-digit binary number (0, 1) to the lowermost bit of one signed SDPP3. In other words, PP5+PP6=SDPP3+(0, 1). Other pairs of partial products are similar to the above.

Further, as for the last partial product PP27, only itself is used to produce a signed-digit partial product SDPP14. Furthermore, a signed-digit partial product SDPP15, with component element of a signed-digit binary number (0, 1) to be added to the lowermost bit of respective signed-digit partial products SDPP1 through SDPP14, is produced. In this way, 15 pieces, approximately one fourth of the bit number of the multiplier y, of signed-digit partial products SDPP1 through SDPP15 are produced.

An addition section 17 includes a first level calculation section 117a, a second level calculation section 117b, a third level calculation section 117c, and a fourth level calculation section 117d respectively for performing addition of the first, second, third, and fourth levels. The addition section 117 performs sequentially addition of respective levels using the Wallace-tree method and based on the signed-digit partial products SDPP1 through SDPP15 produced with the partial product generating section 112 to obtain results.

Figure 37:
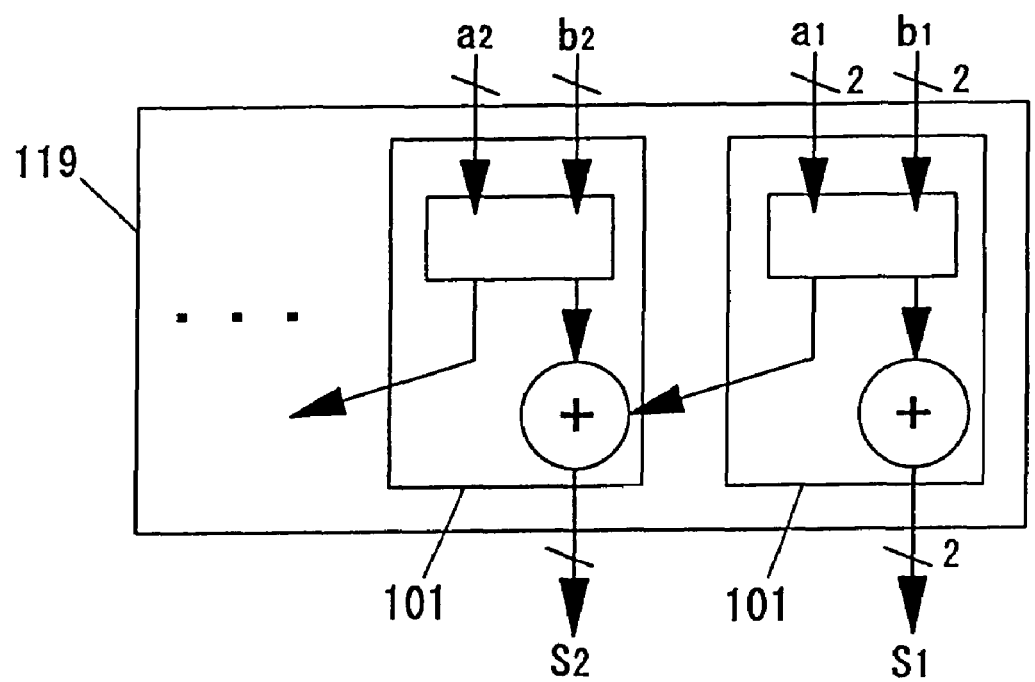
FIG. 37 is a block diagram of constitution of an adder unit 119.

The respective level calculation sections 117a-117d each includes one or more addition units 119 (signed-digit adders: SDA). FIG. 37 is a block diagram of constitution of an adder unit 119. Each addition unit 119 is made by parallel connection of full adders 101 in a number corresponding to the bit number of the signed-digit partial product produced with the partial product generating section 112 to output addition results, signed-digit binary numbers in a number corresponding to the relevant bit number. In this embodiment, the bit number of the addition unit 119 is made to be approximately the same as that of the product of the multiplicand x and the multiplier y.

The first level calculation section 117a, using seven pieces of addition units 119 connected in parallel, performs additions in parallel operation using inputs of the signed-digit partial products SDPP15, and SDPP1 through SDPP13 to obtain the first level addition results, seven in number that is substantially half the number of the signed-digit partial products produced in the partial product generating section 112, and stores the results.

In the example of FIG. 36, the addition unit 119 in the leftmost position of the first level calculation section 117a adds together the signed-digit partial products SDPP15 and SDPP1, the addition unit 119 second from the left adds together the signed-digit partial products SDPP2 and SDPP3, and the rightmost addition unit (not shown) adds together the signed-digit partial products SDPP12 and SDPP13.

For example, the addition unit 119, second from the left of the first level calculation section 117a, adds together the signed-digit partial products SDPP2 and SDPP3. Therefore, the above-mentioned (ppi3, /ppi4) or the respective bit values of the signed-digit partial product SDPP2 are inputted as the respective bit values $ai=(ai^+, ai^-)$ of the augend "a" as shown in FIG. 37. The above-mentioned (ppi5, /ppi6) or the respective bit values of the signed-digit partial product SDPP3 are inputted as the respective bit values $bi=(bi^+, bi^-)$ of the addend "b" as shown in FIG. 37.

The second level calculation section 117b, using the four addition units 119 arranged in parallel, and using the addition results of the previous level as inputs, calculates the second level addition results in a number that is substantially half that of the previous level, and stores the results.

In the example of FIG. 36, the addition unit 119 in the leftmost position of the second level calculation section 117b adds together two first level addition results calculated with the leftmost-located addition unit 119 and the addition unit 119 located second from the left of the first level calculation section 117a to obtain one second level addition result. The addition units 119 located second and third (not shown) from the left of the second level calculation section 117b perform similar calculations.

Further, the rightmost-located addition unit 119 (not shown) of the second level calculation section 117b adds together the signed-digit partial product SDPP14 and one first level addition result obtained with the rightmost-located addition unit 119 (not shown) of the first level calculation section 117a. In this way, four pieces of the second level addition results are obtained.

The third level calculation section 117c, using two addition units 119 located in parallel and using the four addition results calculated in the previous level as inputs, performs addition to obtain third level addition results, two in number that substantially corresponds to half the number in the previous level, and stores the results.

The fourth, last level calculation section 117d, using one addition unit 119 and the two addition results calculated in the previous level as inputs, performs addition to obtain the one, last level addition result, and stores the calculated last level addition result as a signed-digit binary number corresponding to the product of the above-described multiplicand and multiplier.

As described above, in the pipelined multiplier 111, the partial product generating section 112, using the second-order Booth's algorithm, produces 27 pieces of partial products PP1-PP27 for the multiplicand x and the multiplier y. At the same time, based on the 27 partial products produced, the partial product generating section 112 produces 15 pieces of signed-digit partial products SDPP1 through SDPP15. The addition section 117 of the pipelined multiplier 111, using the Wallace-tree method, produces a signed-digit binary number corresponding to the product of the multiplicand x and the multiplier y by adding up the 15 pieces of signed-digit partial products SDPP1-SDPP15. After that, specified conversion is made to obtain a product of the multiplicand x and the multiplier y.

Figure 38:
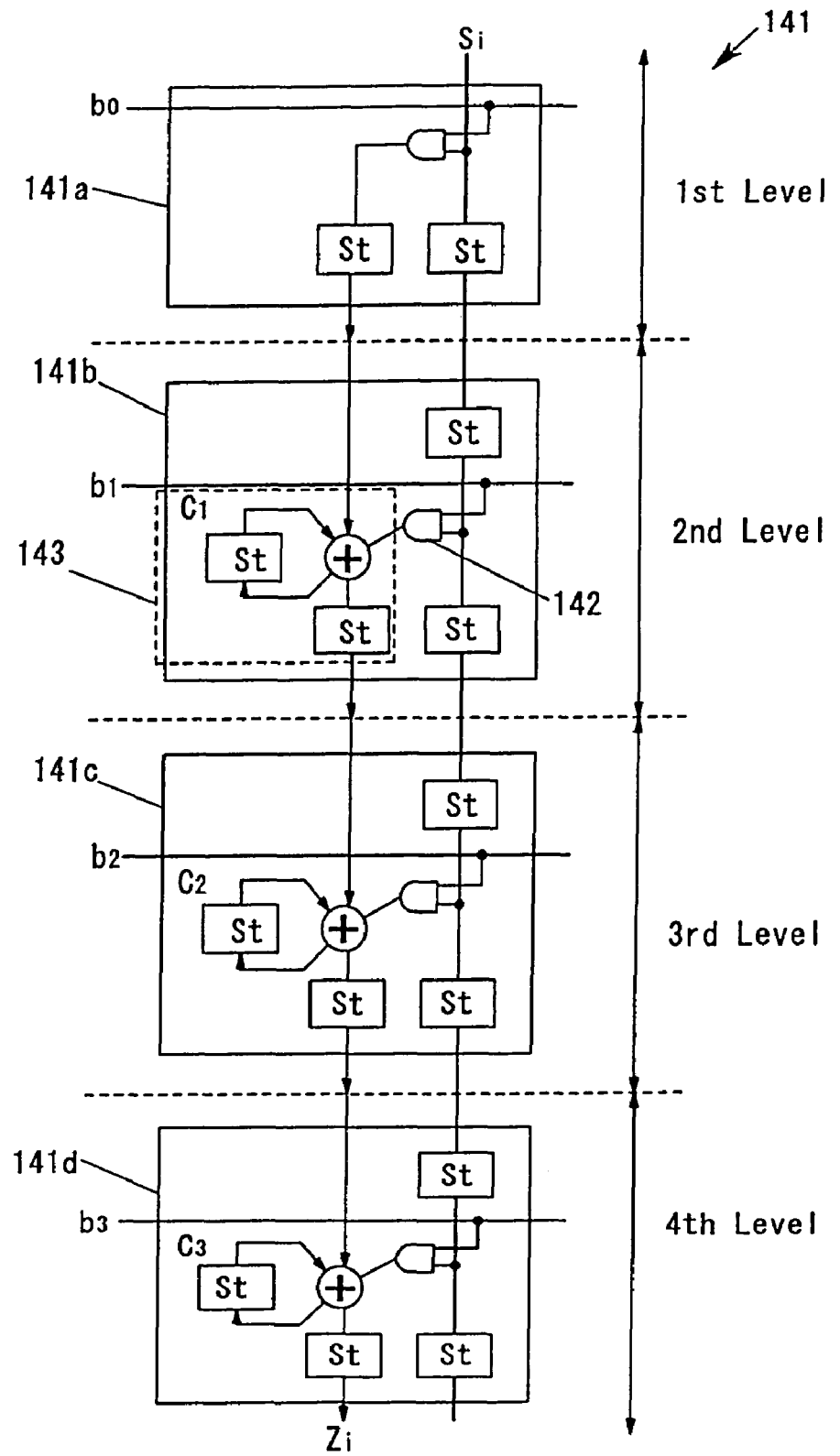
FIG. 38 is an example constitution of a pipelined multiplier of series-parallel type using the logical calculation circuit 81 shown in FIG. 28A.

FIG. 38 is an example constitution of a pipelined multiplier of series-parallel type using the logical calculation circuit 81 shown in FIG. 28A. The pipelined multiplier 141 is constituted to perform multiplication of a four-bit multiplicand s and a four-bit multiplier b in a number of levels in succession, with the number being four, the number of bits of the multiplier b. As shown in FIG. 38, the first through fourth level calculation sections 141a-141d perform calculations of the first through fourth levels.

For example, the second level calculation section 141b includes an elementary partial product generating section or a logical product circuit 142, and an elementary calculation device or a pipelined full adder 143 of series type. In the figure, the symbol st in a square denotes a memory section, and the symbol + in a circle denotes a full adder. The second and third level calculation sections 141c and 141d are of similar constitution, except that the first level calculation section 141a does not include the full adder.

Figure 39:
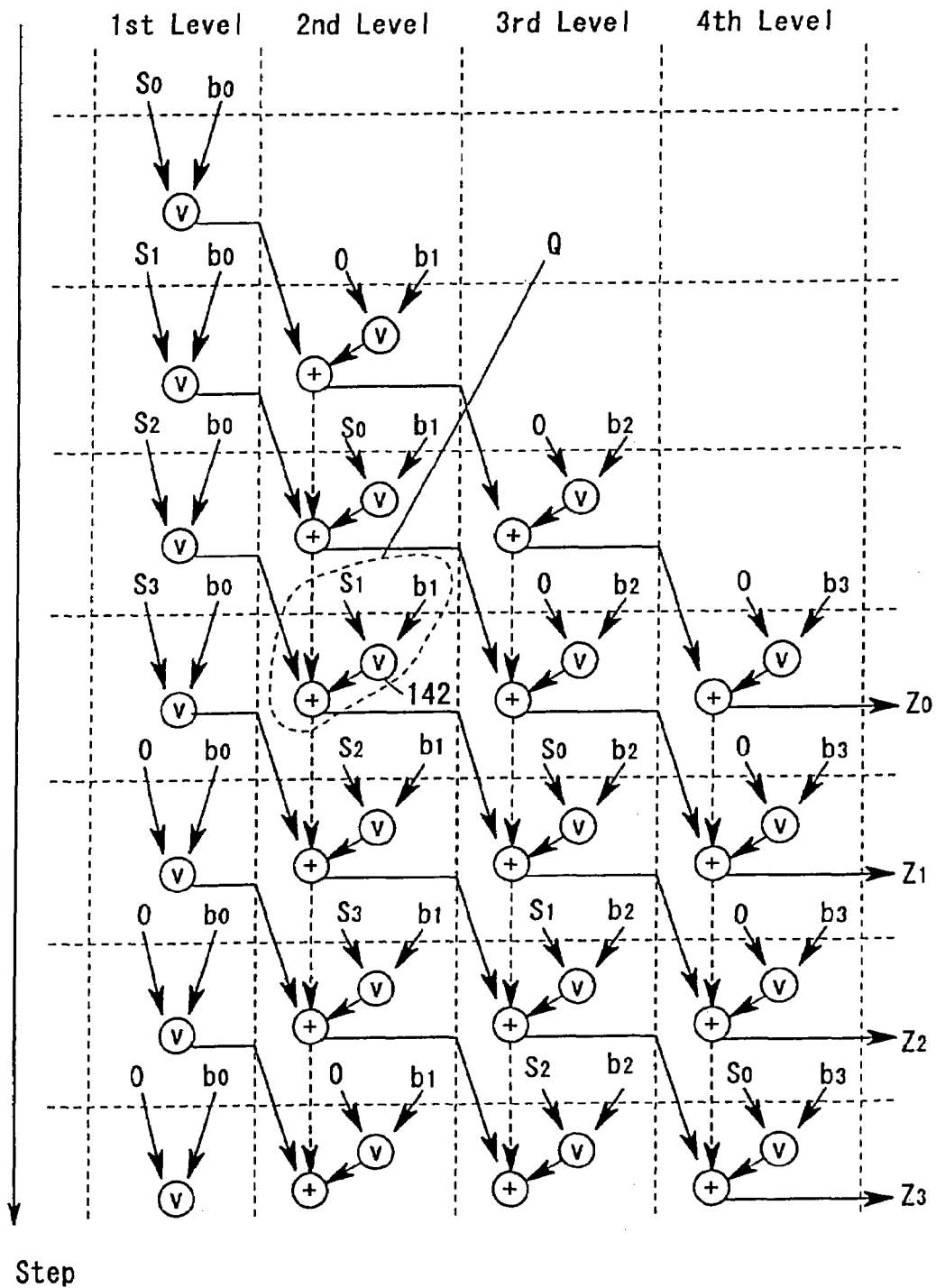
FIG. 39 is an explanatory diagram of the operations of a pipelined multiplier 141.

FIG. 39 is an explanatory diagram of the operation of the pipelined multiplier 141. The figure shows sequential operations of the first to fourth levels from left to right. The operations in each level are shown to proceed from top to bottom (with the lapse of time). In the figure, the encircled letter V is a symbol showing the logical product circuit 142. In the second through fourth levels in the figure, the broken line with arrow connecting adjacent full adders in the same level indicates the flow of carry.

For example, the operation in the second level calculation section 141b of the pipelined multiplier 141, or the second level operation, is indicated with the column second from the left in FIG. 39. Therefore, the operation of for example the third step (third cycle) of the second level calculation section 141b is indicated with the operation located second from left and third from top in FIG. 39, indicated with Q. The operation in the third step of the second level calculation section 141b of the pipelined multiplier 141 is described below.

First, the logical product circuit 142 calculates a logical product of a multiplicand bit s1 to be currently calculated in the second level out of four bits constituting the multiplicand s, that is, a calculation object bit s1 of the multiplicand s, and a bit b1 corresponding to the second level out of four bits constituting the multiplier b. Next, using the pipelined full adder 143, a sum is calculated for three binary numbers: the above calculated logical product; the partial product in the previous, first level; and the carry in the second level for the bit s0 preceding the calculation object bit s1 of the multiplicand.

The result obtained with the pipelined full adder 143 is sent as a partial product in the second level of the calculation object bit s1 of the multiplicand to the next, third level. The carry produced by this addition is stored as the carry in the second level of the calculation object bit s1 of the multiplicand.

The operations in the third and fourth level calculation sections 141c and 141d are the same as the above. However, the first level calculation section 141a calculates a logical product or an elementary product but does not perform addition.

Figure 40:
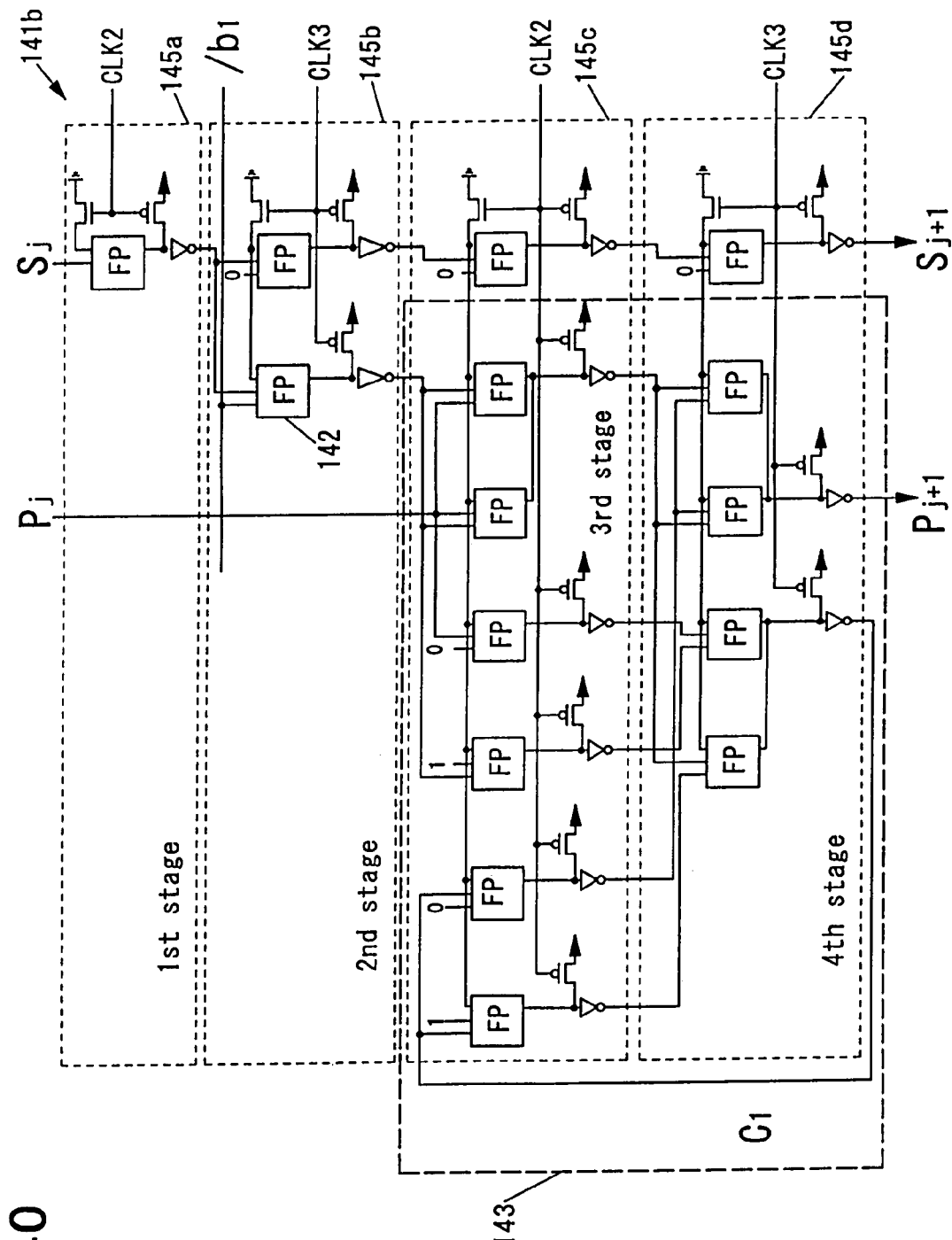
FIG. 40 is a block diagram of constitution of the second level calculation section 141b of the pipelined multiplier 141.
Figure 41:
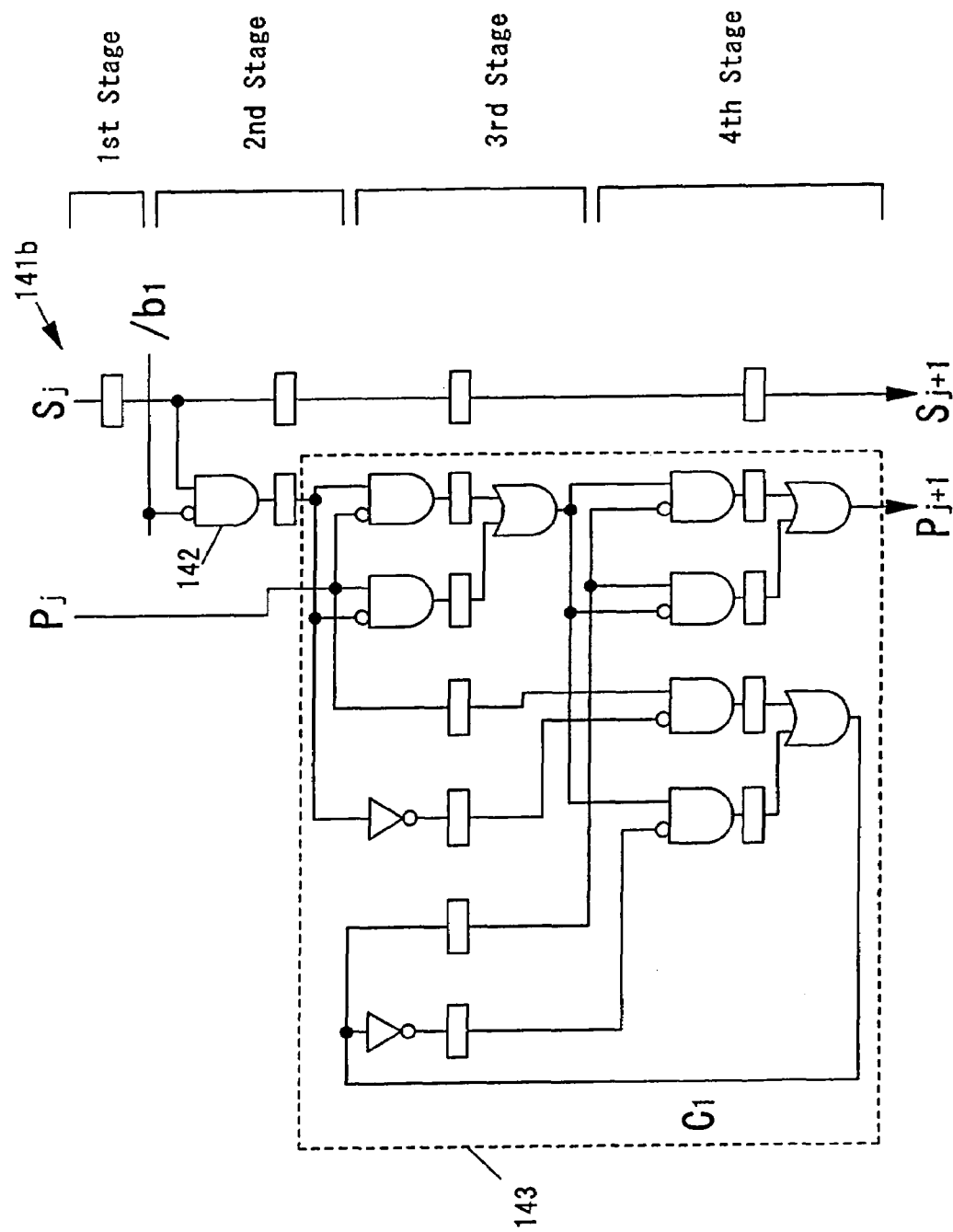
FIG. 41 shows a logical circuit constitution of the second level calculation section 141b.

FIG. 40 is a block diagram of constitution of the second level calculation section 141b of the pipelined multiplier 141. FIG. 41 shows a logical circuit constitution of the second level calculation section 141b. A large number of oblong rectangles in FIG. 41 are respectively memories. The second level calculation section 141b is constituted to perform logical calculation of the second level in four divided stages in succession.

As shown in FIG. 40, the first to fourth stage calculation sections 145a-145d of the second level calculation section 141b perform calculations in the first to fourth stages. In the figure, each symbol FP in a squares denotes a logical calculation circuit (or functional pass gate) 81 shown in FIG. 28A.

The first stage calculation section 145a takes in one bit as an object of calculation out of bits constituting the multiplicand s and stores it as a calculation object bit sj of the multiplicand.

The second stage calculation section 145b, using the logical product circuit 142, calculates the logical product, of the calculation object bit sj of the multiplicand stored in the previous stage and the bit b1 corresponding to the second level out of the bits constituting the multiplier b, as an elementary product in the second level of the calculation object bit sj of the multiplicand, and stores the result. Further, the second stage calculation section 145b takes in the calculation object bit sj of the multiplicand stored in the first stage.

The third and fourth stage calculation sections 145c and 145d, using the pipelined full adder 143, calculate the sum of three binary numbers: the elementary partial product in the second level calculated in the previous stage; the partial product Pj in the first level; and the carry C1 in the second level for the bit before the calculation object bit sj of the multiplicand, and stores the result as the partial product Pj+1 in the second level of the calculation object bit sj of the multiplicand, and stores the carry produced by this addition as a new carry in the second level for the calculation object bit sj of the multiplicand.

The third and fourth stage calculation sections 145c and 145d take in the calculation object bit sj of the multiplicand, stored in the second stage and stores it as the calculation object bit sj+1 of the multiplicand for the next, third level.

The third and fourth level calculation sections 141c and 141d are of the same constitution as the above second level calculation section b, except, as described above, the first level calculation section 141a does not include a logical calculation section for full addition.

Incidentally, the pipelined full adder 143 as shown in FIG. 40 may also be seen as a logical calculation device for performing first and second addition stages corresponding to the above third and fourth stages. In that case, the pipelined full adder 143 includes the first and second addition stage calculation sections for performing the first and second stage calculations.

The first and second addition stage calculation sections constituting the pipelined full adder 143 is made by dropping the logical calculation circuit 81 (functional pass gate) indicated at the right end in the figure from both the third and fourth level calculation sections 145c and 145d shown in FIG. 40.

In other words, the first addition stage calculation section, using a pair of the parallel-connected logical calculation circuits 81, calculates a binary number corresponding to the exclusive OR of the binary numbers corresponding to the addend and augend as a first addition result, stores the result and stores the carry outputted in the second addition stage implemented immediately before.

The second addition stage calculation section, using another pair of parallel-connected logical calculation circuit 81, calculates a binary number corresponding to the binary number corresponding to the exclusive OR of the first addition result obtained in the first addition state and the binary number corresponding to the carry stored in the first addition stage as a second addition result, stores the result, as well as outputs the second addition result as a addition result of the pipelined full adder 143, calculates the carry in this addition using a plural number of the logical calculation circuits 81, and stores it.

Further, while the above embodiments are described assuming that the transistors MP are N-channel MOSFETs, this invention is not limited by the assumption. For example, this invention may also be embodied with the transistors MP being P-channel MOSFETs.

Furthermore, while the above embodiments are described with an example of the calculation result output section being the field effect transistor, the calculation result output section is not limited to it. In effect, the calculation result output section may be of any type as long as it outputs the logical calculation result of the first and second data to be calculated according to the state change amounts of both non-volatile memory element and non-volatile load element obtained by giving the second data to be calculated.

While the above embodiments are also described on the assumption that ferroelectric capacitors are used as the non-volatile memory element and non-volatile load element, the non-volatile memory element and/or non-volatile load element in this invention are not limited to the ferroelectric capacitors. Generally, elements having hysteresis characteristic may be taken into consideration as the non-volatile elements.

For example, elements using paraelectric capacitors may be used as the non-volatile memory element and/or non-volatile load element, which will be described later.

Further, the non-volatile memory element and/or non-volatile load element are not limited to those using capacitors. They can also use elements using resistances.

In the case elements using resistances are used as the non-volatile memory elements, both ends of the relevant resistance become the first and second terminals. In the case elements using resistances are used as the non-volatile load elements, both ends of the relevant resistance become the third and fourth terminals. In such cases, it is appropriate for example to make resistance values different according to the first data to be calculated.

It is also possible to use elements using transistors as the non-volatile memory element and/or non-volatile load element. In the case for example an element using field effect transistors (FETs) is used as the non-volatile memory element, a pair of input and output terminals (drain and source terminals) of the relevant FET become the first and second terminals.

In the case an element using FETs is used as the non-volatile load element, a pair of input and output terminals (drain and source terminals) of the relevant FET become the third and fourth terminals. In such cases, it is appropriate to constitute for example that an appropriate bias voltage according to the first data to be calculated is given to the gate terminal of the relevant FET.

It is further possible to use elements using the capacitors, resistances, and transistors in appropriate combination as the non-volatile memory element and/or non-volatile load element.

Figure 42A:
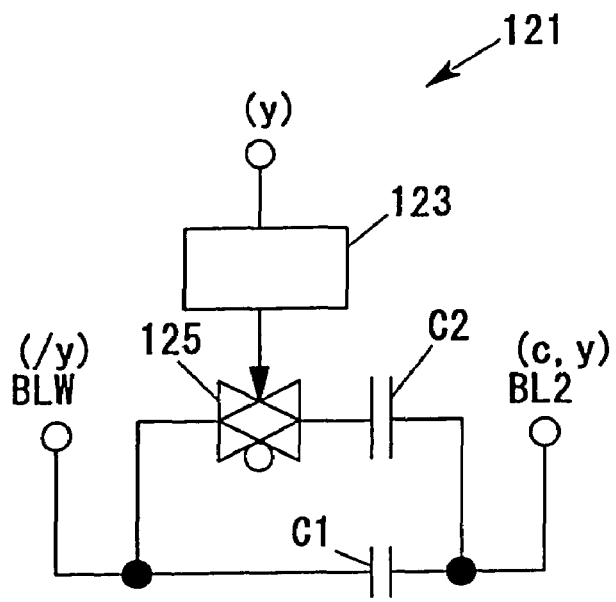
FIG. 42A is an example circuit diagram of a non-volatile load element using paraelectric capacitor.

FIG. 42A is an example circuit diagram of a non-volatile load element utilizing paraelectric capacitor. The load element 121 shown in FIG. 42A is used for example in the logical calculation circuit 31 shown in FIG. 16 in place of the load ferroelectric capacitor Cs', and includes two paraelectric capacitors C1 and C2, a switch (transfer gate) 125, and a memory device 123.

The two paraelectric capacitors C1 and C2 are connected in parallel through the switch 125 to serve as a compound capacitor. One end of the compound capacitor is connected through a coupling node 11 to the gate terminal of the transistor MP while the other end is connected to the bit line BL2. The memory device 123 stores data corresponding to the first data to be calculated s in non-volatile manner. The switch 125 turns on and off according to the data stored in the memory device 123.

Figure 43A:
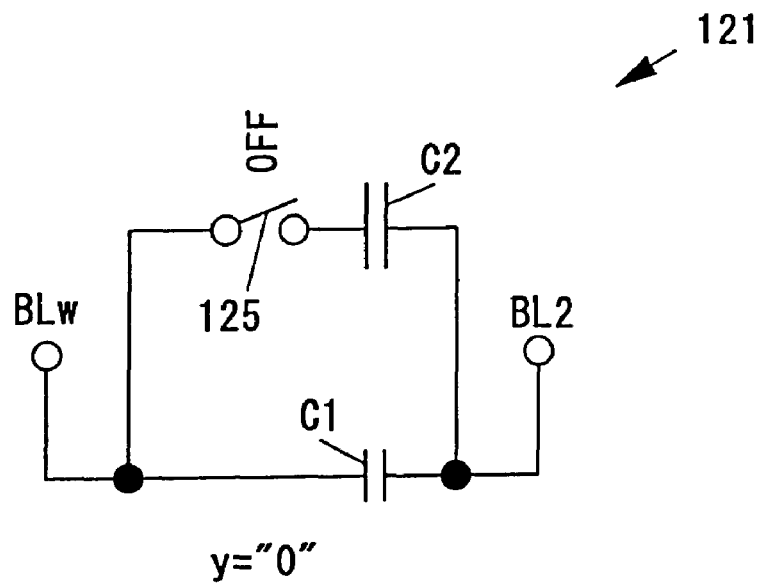
FIG. 43A shows an equivalent circuit of the load element 121 in the data read operation (RO) when y=0 is given to the bit line BL2 in the data write operation (WO) of FIG. 17.

FIG. 43A shows an equivalent circuit of the load element 121 in the data read operation (RO) when y=0 is given to the bit line BL2 in the data write operation (WO) of FIG. 17 (in other words when the first data to be calculated s=0).

Figure 43B:
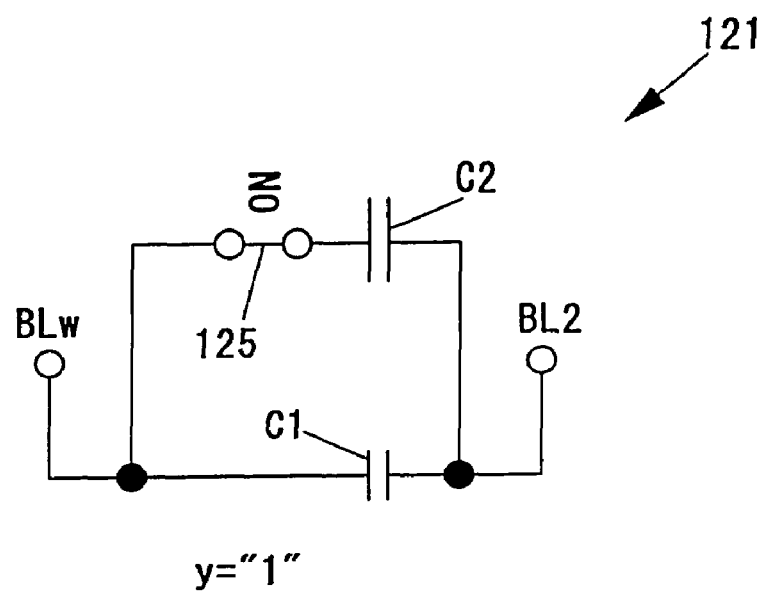
FIG. 43B shows an equivalent circuit of the load element 121 in the data read operation (RO) when y=1 is given to the bit line BL2 in the data write operation (WO) of FIG. 17.

On the other hand, FIG. 43B shows an equivalent circuit of the load element 121 in the data read operation (RO) when y=1 is given to the bit line BL2 in the data write operation (WO) of FIG. 17 (in other words when the first data to be calculated s=1).

It is understood from FIGS. 43A and 43B that the compound capacitance of the load element 121 at the time of the data read operation (RO) is C1 or C1+C2, corresponding to the first data to be calculated s=0 or s=1.

Figure 42B:
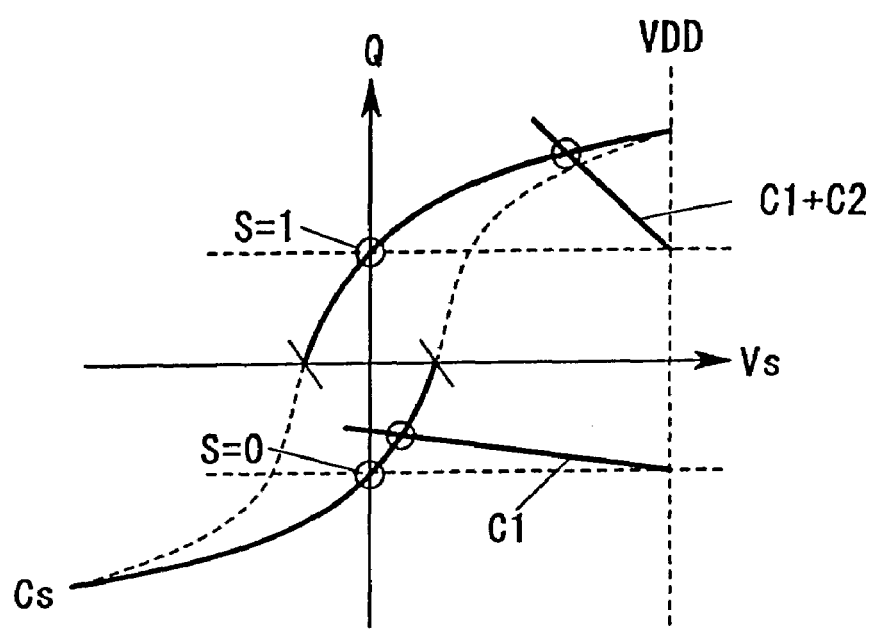
FIG. 42B is a hysteresis diagram for explaining the data read operation of the logical calculation circuit 31 using a load element 121 as the non-volatile load element.

FIG. 42B is a hysteresis diagram for explaining the data read operation of the logical calculation circuit 31 using a load element 121 as the non-volatile load element. In this embodiment, the reference potential is made c=0. It is understood from this figure that changing the capacitance of the load element 121 according to the first data to be calculated s provides the same effect as that when the ferroelectric capacitor Cs' is used as the non-volatile load element.

Figure 44A:
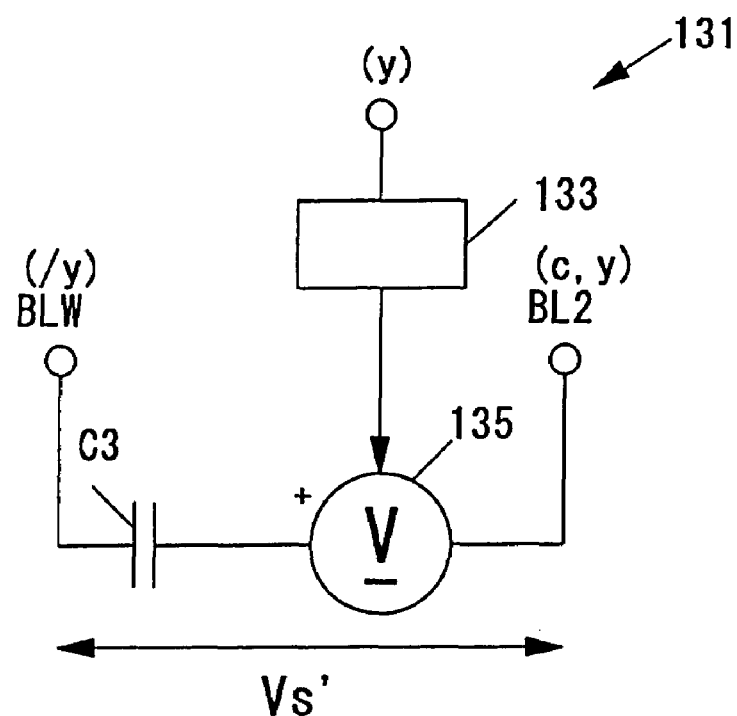
FIG. 44A is another example circuit diagram of a non-volatile load element using a paraelectric capacitor.

FIG. 44A is another example circuit diagram of a non-volatile load element using a paraelectric capacitor. The load element 131 shown in FIG. 44A is used for example in the logical calculation circuit 31 shown in FIG. 16 in place of the ferroelectric capacitor Cs' and includes a paraelectric capacitor C3, a memory device 133, and a load power source 135.

One end of the paraelectric capacitor C3 is connected through the coupling node 11 to the gate terminal of the transistor MP, while the other end is connected through the load power source 135 to the bit line BL2. The memory device 133 stores data corresponding to the first data to be calculated s in non-volatile manner. The load power source 135 is a DC power source constituted to reverse in polarity according to the data stored in the memory device 133.

Figure 45A:
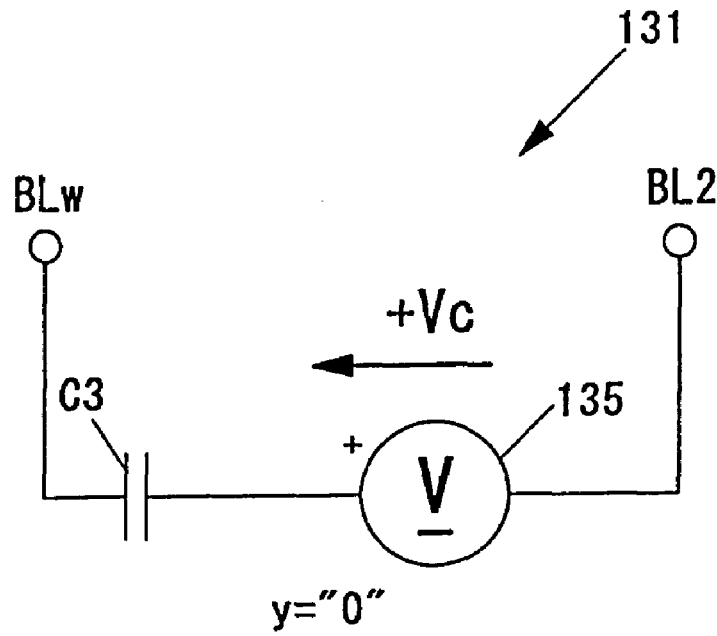
FIG. 45A shows an equivalent circuit of the load element 131 in the data read operation (RO) when y=0 is given to the bit line BL2 in the data write operation (WO) of FIG. 17.

FIG. 45A shows an equivalent circuit of the load element 131 in the data read operation (RO) when y=0 is given to the bit line BL2 in the data write operation (WO) of FIG. 17 (in other words when the first data to be calculated s=0). In this case, the polarity of the load power source 135 is such that the other end of the paraelectric capacitor C3 is positive relative to the bit line BL2.

Figure 45B:
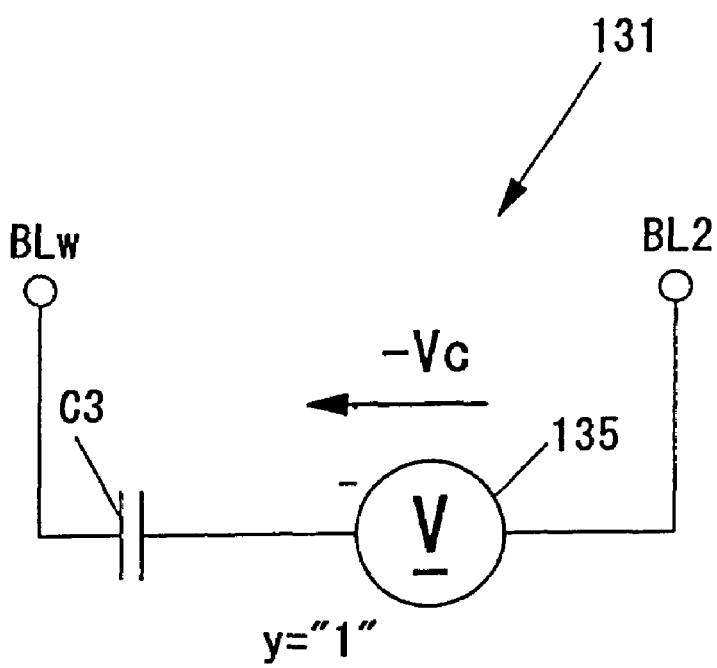
FIG. 45B shows an equivalent circuit of the load element 131 in the data read operation (RO) when y=1 is given to the bit line BL2 in the data write operation (WO) of FIG. 17.

On the other hand, FIG. 45B shows an equivalent circuit of the load element 131 in the data read operation (RO) when y=1 is given to the bit line BL2 in the data write operation (WO) of FIG. 17 (in other words when the first data to be calculated s=1). In this case, the polarity of the load power source 135 is such that the other end of the paraelectric capacitor C3 is negative relative to the bit line BL2.

It is understood from FIGS. 45A and 45B that the potential of the other end of the paraelectric capacitor C3 of the load element 131 at the time of the data read operation (RO) is +Vc or −Vc, corresponding to the first data to be calculated s=0 or s=1.

Figure 44B:
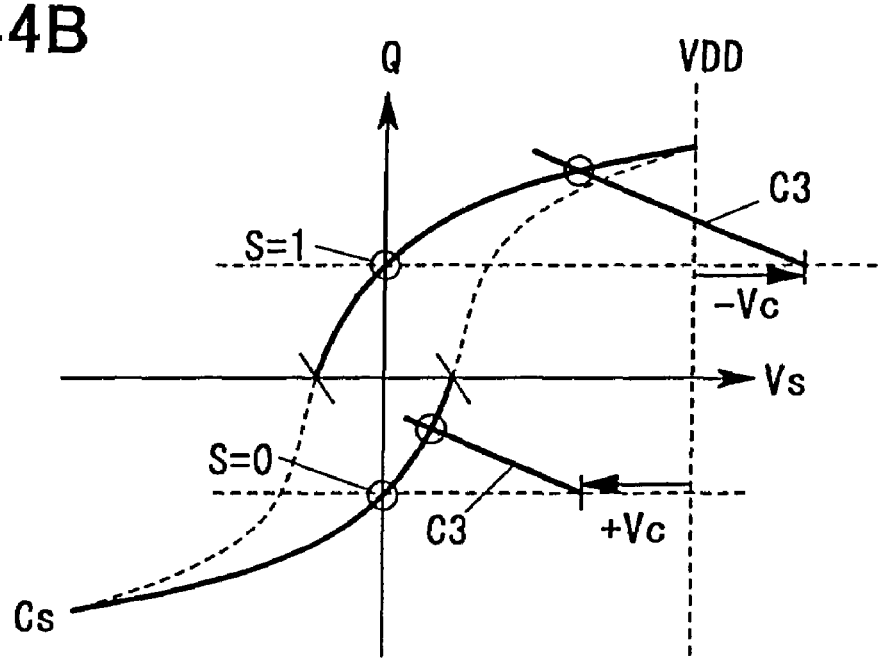
FIG. 44B is a hysteresis diagram for explaining data read operation of the logical calculation circuit 31 using a load element 131 as the non-volatile load element.

FIG. 44B is a hysteresis diagram for explaining data read operation of the logical calculation circuit 31 using a load element 131 as the non-volatile load element. In this embodiment, the reference potential is made c=0. It is understood from this figure that changing the potential at the other end of the load element 131 (the end on the bit line BL2 side) according to the first data to be calculated s provides the same effect as that when the ferroelectric capacitor Cs' is used as the non-volatile load element.

Figure 46A:
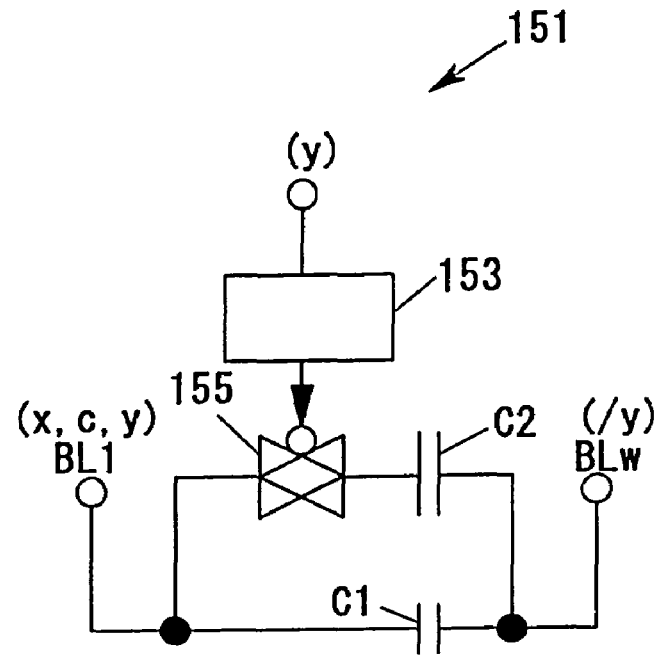
FIG. 46A is an example circuit diagram of a non-volatile memory element using dielectric capacitors.

FIG. 46A is an example circuit diagram of a non-volatile memory element using paraelectric capacitors. The memory element 151 shown in FIG. 46A is used for example in place of the storage ferroelectric capacitor Cs in the logical calculation circuit 31 shown in FIG. 16, and includes two paraelectric capacitors C1, C2, a switch (transfer gate) 155, and a memory device 153.

The two paraelectric capacitors C1 and C2 are interconnected parallel through the switch 155 to form a compound capacitor. One end of the compound capacitor is connected to the bit line BL1 while its other end is connected through the coupling node 11 to the gate terminal of the transistor MP. The memory device 153 stores data corresponding to the first data to be calculated s in non-volatile manner. The switch 155 turns on and off according to the data stored in the memory device 153.

Figure 47A:
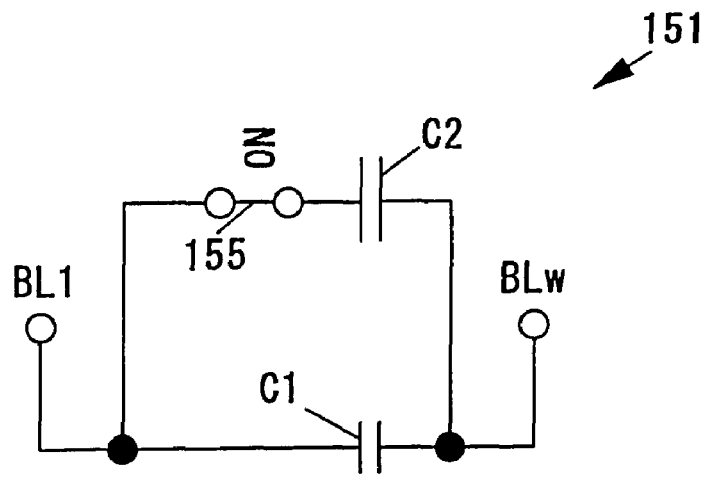
FIG. 47A shows an equivalent circuit of the load element 151 in the data read operation (RO) when y=0 is given to the bit line BL1 in the data write operation (WO) of FIG. 17.

FIG. 47A shows an equivalent circuit of the memory element 151 in the data read operation (RO) when y=0 is given to the bit line BL1 (in other words when the first data to be calculated s=0) in the data write operation (WO) of FIG. 17.

Figure 47B:
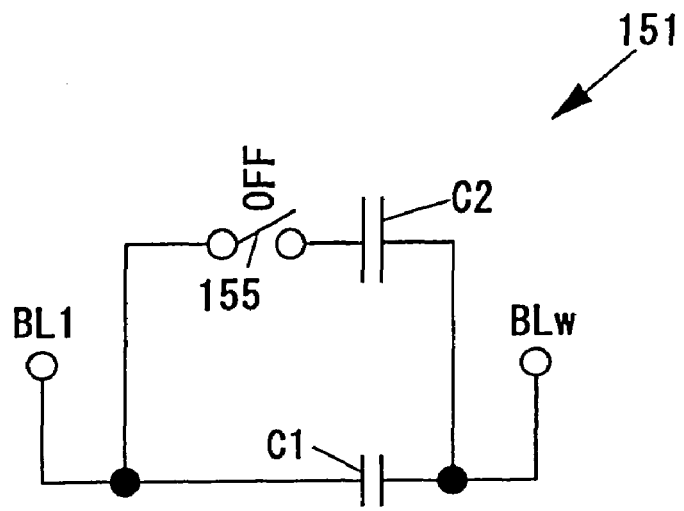
FIG. 47B shows an equivalent circuit of the load element 151 in the data read operation (RO) when y=1 is given to the bit line BL1 in the data write operation (WO) of FIG. 17.

On the other hand, FIG. 47B shows an equivalent circuit of the memory element 151 in the data read operation (RO) when y=1 is given to the bit line BL1 (in other words when the first data to be calculated s=1) in the data write operation (WO) of FIG. 17.

It is understood from FIGS. 47A and 47B that the compound capacitance of the memory element 151 at the time of the data read operation (RO) is C1+C2 or C1, corresponding to the first data to be calculated s=0 or s=1.

Figure 46B:
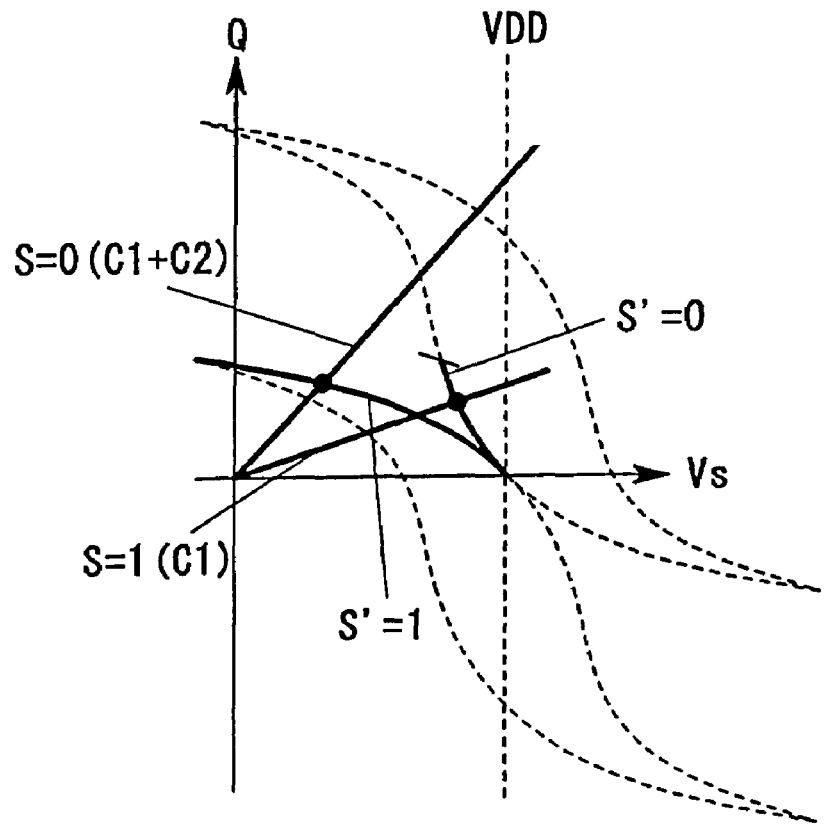
FIG. 46B is a diagram for explaining the data read operation of the logical calculation circuit 31 using a memory element 151 as the non-volatile memory element.

FIG. 46B is a diagram for explaining the data read operation of the logical calculation circuit 31 using a memory element 151 as the non-volatile memory element. In this embodiment, the reference potential is made c=0. It is understood from this figure that changing the capacitance of the memory element 151 according to the first data to be calculated s provides the same effect as that when the ferroelectric capacitor Cs is used as the non-volatile memory element.

Figure 48A:
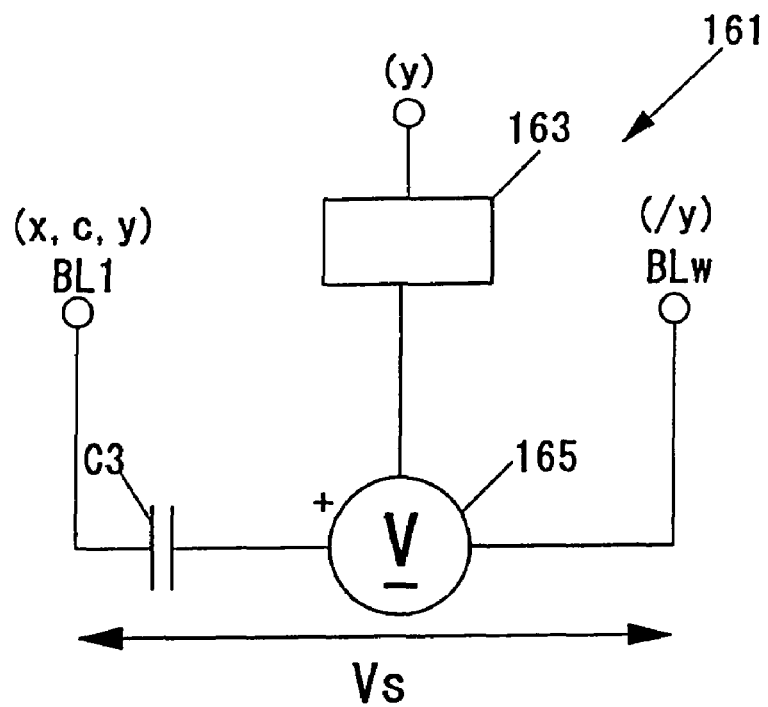
FIG. 48A is another example circuit diagram of a non-volatile memory element using paraelectric capacitors.

FIG. 48A is another example circuit diagram of a non-volatile memory element using paraelectric capacitors. The memory element 161 shown in FIG. 48A is used for example in place of the ferroelectric capacitor Cs in the logical calculation circuit 31, and includes a paraelectric capacitor C3, a memory device 163, and a storage power source 165.

One end of the paraelectric capacitor C3 is connected to the bit line BL1 while its other end is connected through the storage power source 165 and the coupling node 11 to the gate terminal of the transistor MP. The memory device 163 stores data corresponding to the first data to be calculated s in non-volatile manner. The storage power source 165 is a DC power source constituted to reverse in polarity according to the data stored in the memory device 163.

Figure 49A:
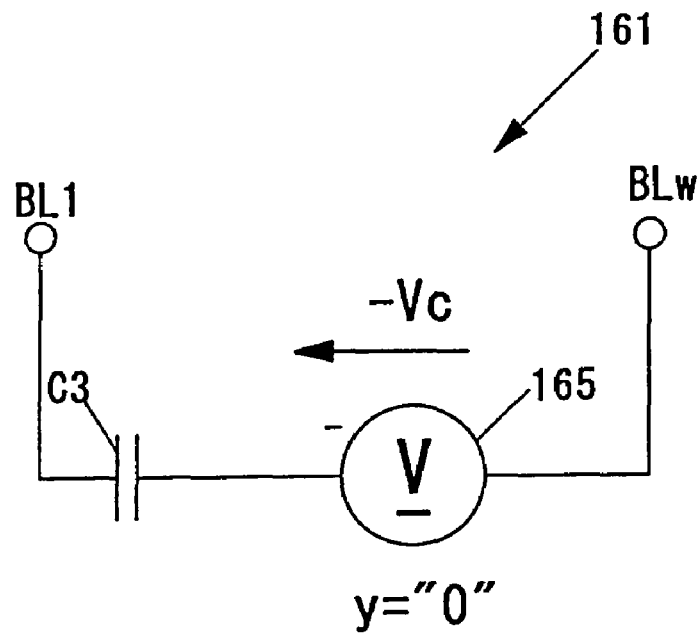
FIG. 49A shows an equivalent circuit of the memory element 161 in the data read operation (RO) when y=0 is given to the bit line BL1 in the data write operation (WO) of FIG. 17.

FIG. 49A shows an equivalent circuit of the memory element 161 in the data read operation (RO) when y=0 is given to the bit line BL1 in the data write operation (WO) of FIG. 17 (in other words when the first data to be calculated s=0). In this case, the polarity of the storage power source 165 is such that the other end of the paraelectric capacitor C3 is negative relative to the bit line BLw.

Figure 49B:
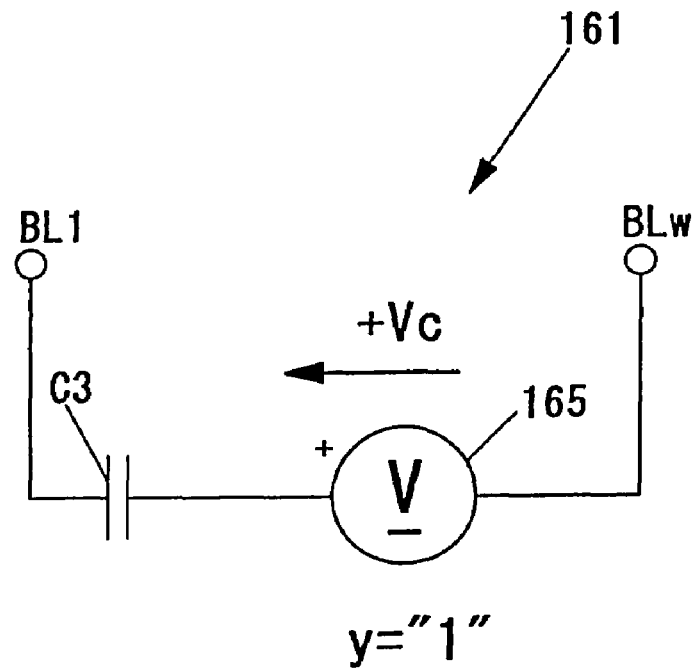
FIG. 49B shows an equivalent circuit of the memory element 161 in the data read operation (RO) when y=1 is given to the bit line BL1 in the data write operation (WO) of FIG. 17.

On the other hand, FIG. 49B shows an equivalent circuit of the memory element 161 in the data read operation (RO) when y=1 is given to the bit line BL1 (in other words when the first data to be calculated s=1) in the data write operation (WO) of FIG. 17. In this case, the polarity of the storage power source 165 is such that the other end of the paraelectric capacitor C3 is positive in reference to the bit line BLw.

It is understood from FIGS. 49A and 49B that the potential of the other end of the paraelectric capacitor C3 of the memory element 161 at the time of the data read operation (RO) is −Vc or +Vc, corresponding to the first data to be calculated s=0 or s=1.

Figure 48B:
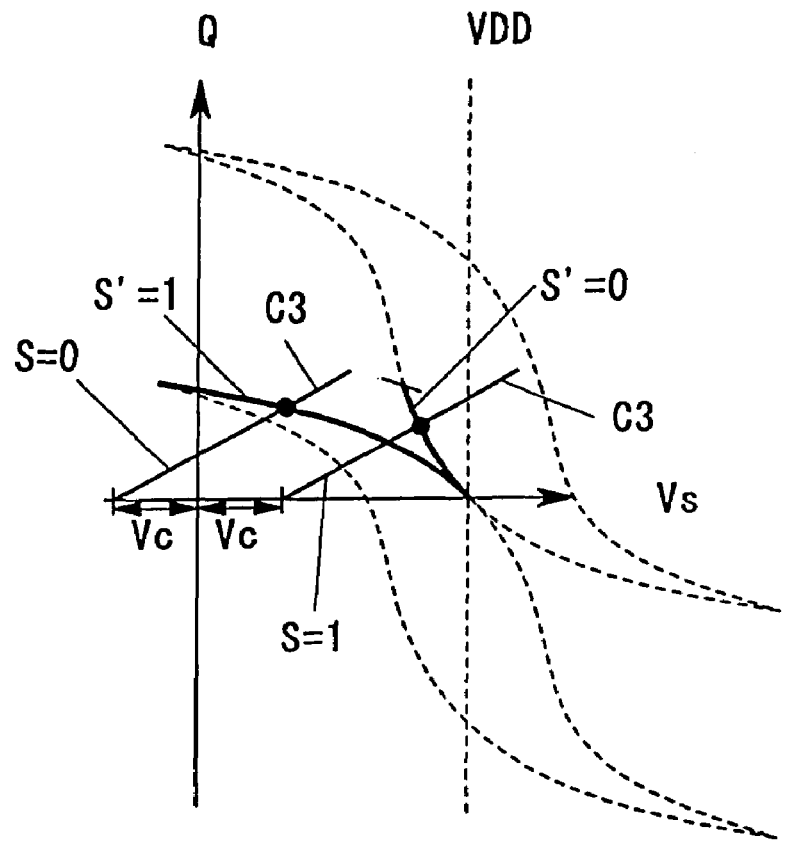
FIG. 48B is a diagram for explaining the data read operation of the logical calculation circuit 31 using a memory element 161 as the non-volatile memory element.

FIG. 48B is a diagram for explaining the data read operation of the logical calculation circuit 31 using a memory element 161 as the non-volatile memory element. In this embodiment, the reference potential is made c=0. It is understood from this figure that changing the potential at the other end of the memory element 161 (the end on the bit line BLw side) according to the first data to be calculated s provides the same effect as that when the ferroelectric capacitor Cs is used as the non-volatile memory element.

As described above, it is possible to use an element in which one of the non-volatile load element and the non-volatile memory element is a ferroelectric capacitor while the other is a paraelectric capacitor.

As a matter of course, it is also possible to use an element in which both of the non-volatile load element and the non-volatile memory element are paraelectric capacitors. For example, it is possible to use one of the above load elements 121 and 131 as the non-volatile load element, and use one of the memory elements 151 and 161 as the non-volatile memory element.

Incidentally in this specification, the expression "A <=B" means that A is smaller than or equal to B.

A logical calculation circuit of this invention is characterized by comprising: a storage ferroelectric capacitor for retaining a polarized state corresponding to the first data to be calculated and having a first and a second terminals; a load ferroelectric capacitor for retaining a polarized state corresponding to the first data to be calculated and substantially complementary to the polarized state of the storage ferroelectric capacitor and having a third terminal connected to the first terminal of the storage ferroelectric capacitor, and a fourth terminal; and a calculation result output section connected to a coupling node between the first terminal of the storage ferroelectric capacitor and the third terminal of the load ferroelectric capacitor to output a logical calculation result of the first and second data to be calculated for a specified logical operator according to the potential of the coupling node obtained by connecting the fourth terminal of the load ferroelectric capacitor to a specified reference potential and by giving a second data to be calculated to the second terminal of the storage ferroelectric capacitor.

In other words, the storage ferroelectric capacitor storing the first data to be calculated and the load ferroelectric capacitor storing a data of complementary relationship to the first data to be calculated are interconnected in series at the coupling node to obtain a compound ferroelectric capacitor. When one end of the compound ferroelectric capacitor is given a specified reference potential while its other end is given the second data to be calculated, a potential occurring at the coupling node is read as the result of logical calculation on the first and second data to be calculated for the specified logical operator.

Therefore, the operation of reading data from the compound ferroelectric capacitor may be utilized to perform logical calculation. In other words, storage of data and logical calculation of data may be performed with a single logical calculation circuit.

Constituting that the load ferroelectric capacitor is complementary in polarity to the storage ferroelectric capacitor makes it possible to arrange that the coupling node potential at the time of reading data is greatly different corresponding to the logical calculation result and that the residual polarization of the storage ferroelectric capacitor does not reverse by the data read operation. Therefore, it is possible to realize a logical calculation circuit capable of performing logical calculations reliably at high speeds.

The logical calculation circuit of this invention is characterized in that the specified reference potential is selectable from two or more different reference potentials corresponding to two or more different logical operators, and that the specified logical operator is determined by connecting the chosen reference potential to the fourth terminal of the load ferroelectric capacitor and by pre-charging the coupling node with the specified reference potential before giving the second data to be calculated.

Therefore, it is possible to perform plural kinds of logical calculations using a single logical calculation circuit by a simple operation of choosing a specified reference potential in the data read operation.

The logical calculation circuit is characterized in that the third data to be calculated is given to the coupling node and the fourth data to be calculated is given to both the second terminal of the storage ferroelectric capacitor and the fourth terminal of the load ferroelectric capacitor, and that the polarized states of the storage ferroelectric capacitor and the load ferroelectric capacitor corresponding to the first data to be calculated are determined with both the third and fourth data to be calculated given and the polarized states of the storage ferroelectric capacitor and the load ferroelectric capacitor before the third and fourth data to be calculated are given.

In other words, the first data to be calculated, determined with the old first data to be calculated present as stored in the compound capacitor before a data is written and the third and fourth data to be calculated respectively given to the coupling node and to both ends of the compound capacitor at the time of data writing, is written into the compound capacitor at the time of data writing.

Therefore, it is possible to perform logical calculations utilizing the data write operation to the compound capacitor.

The logical calculation circuit of this invention is characterized in that: a non-volatile memory element for retaining non-volatile state corresponding to a binary data, a first data to be calculated s, and having first and second terminals; a non-volatile load element for retaining non-volatile state corresponding to /s, an inverted value of the first data to be calculated s, having a third terminal connected to the first terminal of the non-volatile memory element, and a fourth terminal; and a calculation result output section for outputting a logical calculation result of the first and second data to be calculated s and x, as a calculation result data z as a binary data, for a specified logical operator corresponding to a reference potential according to the states of the non-volatile memory element and the non-volatile load element obtained by pre-charging the coupling node of the first terminal of the non-volatile memory element and the third terminal of the non-volatile load element with the reference potential and then giving the second data x as a binary data, to the second terminal of the non-volatile memory element while maintaining the fourth terminal of the non-volatile load element at the reference potential arbitrarily chosen out of two complementary reference potentials, in which the calculation result data z substantially meets the following equation when the binary data corresponding to the two complementary reference potentials are assumed to be c and /c, $$z=/c \text{ AND } x \text{ AND } /s \text{ OR } c \text{ AND } (x \text{ OR } /s).$$

In other words, the non-volatile memory element having stored the first data s to be calculated and the non-volatile load element having stored the reversal data /s of the first data s to be calculated are connected in series at the coupling node to form a compound capacitor. While maintaining one end of the compound capacitor at a reference potential c chosen arbitrarily from mutually complementary two reference potentials, the coupling node is pre-charged with the reference potential c. Then, when the second data x to be calculated is given to the other end, the state of the compound capacitor is read as the calculation result substantially meeting the equation given below.

$$z=/c \text{ AND } x \text{ AND } /s \text{ OR } c \text{ AND } (x \text{ OR } /s)$$

Therefore, it is possible to perform logical calculations utilizing the operation of reading data from the compound non-volatile element. In other words, storage and logical calculations of data may be performed with a single logical calculation circuit.

Further, constituting that the non-volatile states of the non-volatile load element and the non-volatile memory element are complementary makes it possible that the state of the compound non-volatile element at the time of reading data is greatly different corresponding to the logical calculation result. That is, data reading with great margin can be achieved. Therefore, it is possible to realize a logical calculation circuit capable of performing logical calculations reliably at high speeds.

It is further possible to perform plural kinds of logical calculations with a single logical calculation circuit by a simple operation of choosing the specified reference potential c from two complementary reference potentials in the data read operation.

The logical calculation circuit of this invention is characterized in that the first data s to be calculated corresponds to a new non-volatile state of the non-volatile memory element obtained by giving a binary data, the third data y1 to be calculated, to the coupling node and by giving a binary data, the fourth data y2 to be calculated, to both the second terminal of the non-volatile memory element and the fourth terminal of the non-volatile load element, and that when the first data to be calculated before the third and fourth data to be calculated are given is assumed to be sb, the following equation is satisfied.

$$s=/sb \text{ AND } /y1 \text{ AND } y2 \text{ OR } sb \text{ AND } (/y1 \text{ OR } y2)$$

In other words, the new first data s to be calculated determined with the old first data sb to be calculated present in store in the compound non-volatile element before data is written and the third and fourth data y1 and y2 to be calculated given to the coupling node and both ends of the compound non-volatile element at the time of writing data are written to the compound non-volatile element in the data write operation.

Therefore, data write operation to the compound ferroelectric capacitor may be utilized to perform logical calculation.

The logical calculation circuit of this invention is characterized by comprising: a non-volatile memory element for retaining non-volatile state corresponding to the first data to be calculated; a non-volatile load element for retaining non-volatile state of a different state change rate depending on the first data to be calculated and connected to the non-volatile memory element through a coupling node; and a calculation result output section for outputting a logical calculation result of the first and second data to be calculated for a specified logical operator based on the state change amount of both the non-volatile memory element and the non-volatile load element obtained by giving the second data to be calculated to the non-volatile memory element.

The logical calculation method of this invention is a method of performing logical calculation of the first and second data to be calculated for a specified logical operator, characterized by comprising: a writing step of preparing a non-volatile memory element for retaining non-volatile state corresponding to the first data to be calculated and having the first and second terminals, and a non-volatile load element for retaining non-volatile state of different state change rate depending on the first data to be calculated and having the third terminal connected to the first terminal of the non-volatile memory element through the coupling node and the fourth terminal; and a reading step of performing logical calculation based on the state change amounts of both the non-volatile memory element and the non-volatile load element obtained by connecting the fourth terminal of the non-volatile load element to a specified reference potential and by giving the second data to be calculated to the second terminal of the non-volatile memory element.

Therefore, according to the logical calculation circuit of this invention or the logical calculation method of this invention, a non-volatile memory element having stored a first data to be calculated and a non-volatile load element for retaining non-volatile state of different state change rate depending on the first data to be calculated are connected at a coupling node to form a compound non-volatile element. When a second data to be calculated is given to the non-volatile memory element forming the compound non-volatile capacitor, the state change amount of the compound non-volatile element is read as the logical calculation result of the first and second data to be calculated for a specified logical operator.

Therefore, it is possible to perform logical calculation utilizing the operation of reading data from the compound non-volatile element. In other words, storage and logical calculation of data may be performed with a single logical calculation circuit.

Further, it is possible to arrange that the state of the compound non-volatile element is greatly different corresponding to the logical calculation result at the time of reading data with a constitution in which the non-volatile state of the non-volatile load element is different in the state change rate depending on the first data to be calculated. Therefore, data reading with a great margin is possible. In other words, a logical calculation circuit is embodied that is capable of performing logical calculations at high speeds with high reliability.

The logical calculation circuit of this invention is characterized in that the specified logical operator is determined by giving one reference potential chosen from two or more reference potentials corresponding to two or more different logical operators to the non-volatile load element prior to giving the second data to be calculated.

The logical calculation method of this invention is characterized in that the specified reference potential is selectable from two or more different reference potentials corresponding to two or more different logical operators, and the reading process includes the steps of: giving the specified reference potential chosen to the fourth terminal of the non-volatile load element and to the coupling node; and stopping giving the specified reference potential to the coupling node while maintaining giving the specified reference potential to the fourth terminal of the non-volatile load element and, in that state, giving the second data to be calculated to the second terminal of the non-volatile memory element.

Therefore, the logical calculation circuit of this invention or the logical calculation method of this invention makes it possible to perform plural kinds of logical calculations using a single logical calculation circuit by the simple operation of choosing the specified reference potential in the data read operation.

The logical calculation circuit of this invention is characterized in that the third and fourth data to be calculated are given to the non-volatile memory element and to the non-volatile load element; and the non-volatile states of the non-volatile memory element and the non-volatile load element corresponding to the first data to be calculated is determined with the third and fourth data to be calculated given and the non-volatile states of the non-volatile memory element and the non-volatile load element before the third and fourth data to be calculated are given.

The logical calculation method of this invention is characterized in that the writing step determines the new non-volatile states of the non-volatile memory element and the non-volatile load element corresponding to the first data to be calculated by giving the third data to be calculated to the coupling node and by giving the fourth data to be calculated to both the second terminal of the non-volatile memory element and the fourth terminal of the non-volatile load element, and according to the third and fourth data to be calculated given and to the non-volatile states of the non-volatile memory element and the non-volatile load element before the third and fourth data to be calculated are given.

Therefore, according to the logical calculation circuit of this invention or the logical calculation method of this invention, a new first data to be calculated is determined with both the old first data to be calculated present as stored before writing data and the third and fourth data to be calculated given to the compound non-volatile element at the time of writing data, and the new first data to be calculated is written to the compound non-volatile element by writing operation.

Therefore, it is possible to perform logical calculation utilizing the data write operation to the compound non-volatile element.

The logical calculation circuit of this invention is characterized in that the calculation result output section is an output transistor, having a control terminal connected to the coupling node and an output terminal for outputting output signals corresponding to the control signal inputted to the control terminal, turning off when a potential as the control signal nearer to the first reference potential than to the threshold voltage of the output transistor is given and turning on when a potential as the control signal nearer to the second reference potential than to the threshold voltage is given, and that the logical calculation result is obtained as the output signal of the output transistor.

Therefore, the output transistor turns off when the potential occurring at the coupling node in the data read operation is nearer to the first reference potential than to the threshold voltage, and the output transistor turns on when the potential occurring at the coupling node in the data read operation is nearer to the second reference potential than to the threshold voltage. Therefore, it is possible to obtain the logical calculation result as the output signal of the output transistor by appropriately setting the threshold voltage of the output transistor.

The logical calculation device of this invention is characterized in that any of the above logical calculation circuits are arranged in series and/or parallel to perform intended logical calculation.

Therefore, performing the intended logical calculations described above by combining a large number of the above-described logical calculation circuits in which a single circuit serves both as the logical calculation section and the memory section, it is possible to reduce considerably the circuit area including the area required for wiring in comparison with conventional device in which the memory section is separately provided. As a result, it is possible to greatly increase the degree of integration of the device while reducing power consumption.

Further, because the memory is non-volatile, power for holding the memory is unnecessary. Therefore, power consumption for operating is kept down and little power is consumed when standing by. Moreover, a backup power source against possible power failure is also unnecessary. Furthermore, in the case a memory element including ferroelectric capacitor is used as the non-volatile memory element, write operation may be accelerated.

Moreover, using a large number of logical calculation circuits capable of reading data with large margin realizes a logical calculation device capable of performing logical calculations with high reliability at high speeds.

The logical calculation device of this invention is characterized by comprising: a search word holding section for holding a search word or a search object, and a word circuit that holds a reference word or a reference object, and for performing coincidence judgment between the reference word and the search word, and is made up of any of the above logical calculation circuits arranged in series and/or parallel to make coincidence judgment of the reference word and the search word.

Therefore, it is possible to form a word circuit for performing coincidence judgment of a reference word and a search word with a large number of the logical calculation circuits, each serving as both a logical calculation section and a memory section, combined together, to considerably reduce circuit area including the area required for wiring in comparison with conventional coincidence search devices. As a result, it is possible to greatly increase the degree of integration while reducing power consumption.

Further, because the memory is non-volatile, power for holding the memory is unnecessary. Therefore, power consumption for operating is kept down and little power is consumed when standing by. Moreover, a backup power source against possible power failure is also unnecessary. Furthermore, in the case a memory element including ferroelectric capacitor is used as the non-volatile memory element, write operation may be accelerated.

Moreover, using a large number of logical calculation circuits capable of reading data with large margin realizes a logical calculation device capable of performing logical calculations with high reliability at high speeds.

The logical calculation circuit of this invention is characterized in that the word circuit, using a pair of logical calculation circuits connected in series for each bit forming a search word, obtains a logical value corresponding to the negation of an exclusive OR of the bit value of the reference word and the corresponding bit value of the search word, connects in parallel all the outputs of respective pairs of the logical calculation circuits to obtain a logical value corresponding to a logical product of all the logical values corresponding to the negation of the exclusive OR calculated for each bit, and handles a logical value corresponding to the calculated logical product as a coincidence judgment output of the word circuit.

Therefore, it is possible to constitute that the coincidence output is produced only when the reference word coincides completely with the search word. Therefore, it is possible to easily constitute a coincidence search device with a high degree of integration, low power consumption, high reliability, and high calculation speed, capable of extracting only the reference word that coincides completely with the search word by carrying out coincidence judgment of the search word from a large number of reference words.

The logical calculation device of this invention is characterized by comprising: a search word holding section for holding a search word or a search object; and a word circuit made up of any of the logical calculation circuits arranged in series and/or parallel for holding a reference word or a reference object as well as for performing magnitude comparison judgment for the reference word and the search word.

Therefore, forming a word circuit for performing relative magnitude comparison of the reference word and the search word by combining together a large number of the above logical calculation circuits, each serving both as a logical calculation section and a memory section, makes it possible to reduce considerably the circuit area including the area required for wiring in comparison with conventional relative magnitude comparison devices. As a result, it is possible to greatly increase the degree of integration of the device while reducing power consumption.

Further, because the memory is non-volatile, power for holding the memory is unnecessary. Therefore, power consumption for operating is kept down and little power is consumed in standby. Moreover, a backup power source against possible power failure is also unnecessary. Furthermore, in the case a memory element including ferroelectric capacitor is used as the non-volatile memory element, write operation may be accelerated.

Moreover, using a large number of logical calculation circuits capable of reading data with large margin realizes a relative magnitude comparison device capable of performing calculations with high reliability at high speeds.

The word circuit in the logical calculation device of this invention is characterized in that a plural number of logical calculation circuits are used to produce a comparison decision output to the effect that the search word is greater than the reference word in the case the value of at least one bit in question out of respective bits constituting the search word is greater than the value of a counterpart bit of the reference word, and the values of respective bits higher in position than the bit in question out of the respective bits constituting the search word are respectively equal to the values of respective counterpart bits of the reference word.

Therefore, it is possible to constitute so that a specific comparison judgment output is produced only when the search word is greater than the reference word. As a result, it is possible to easily constitute a relative magnitude comparison device with a high degree of integration, low power consumption, high reliability, and high calculation speed for extracting the only reference word smaller than the search word out of a large number of reference words by performing relative magnitude comparison judgment for a plural number of reference words and the search word.

The logical calculation device of this invention is a logical calculation device for performing addition of two or more pieces of binary numbers, characterized in that any of the above logical calculation circuits are arranged in series and/or parallel to perform the addition.

Therefore, constituting an adder with a combination of a large number of the above logical calculation circuits, each serving both as a logical calculation section and a memory section, makes it possible to reduce considerably the circuit area including the area required for wiring in comparison with conventional adders. As a result, it is possible to increase the degree of integration of the device and keep down power consumption.

Further, because the memory is non-volatile, power for holding the memory is unnecessary. Therefore, power consumption in adding operation is kept down and little power is consumed when standing by. Moreover, a backup power source against possible power failure is also unnecessary. Furthermore, in the case a memory element including ferroelectric capacitor is used as the non-volatile memory element, write operation may be accelerated.

Further, using a large number of logical calculation circuits capable of reading data with large margin makes it possible to realize an adder capable of performing adding operation with high reliability at high speeds.

The logical calculation device of this invention is characterized in that: the logical calculation includes addition of an augend and an addend; the logical calculation device includes an addition result calculation section for calculating the addition result of the augend and the addend, and a carry information calculation section for calculating carry information on the addition; the addition result calculation section using a plural number of logical calculation circuits calculates the addition result according to the augend, addend, and carry information from a previous bit, and makes the addition result obtained the output of the addition result calculation section; and the carry information calculation section using a plural number of logical calculation circuits calculates the carry information for the bit in question according to the augend, addend, and carry information from the previous bit, and makes the carry information obtained the output of the carry information calculation section.

Therefore, it is possible to constitute a full adder using a plural number of logical calculation circuits for calculating and storing addition result and carry information. As a result, it is possible to easily constitute a full adder with a high degree of integration, low power consumption, high reliability, and high calculation speed.

The logical calculation device of this invention is characterized in that the device divides logical calculation into a plural number of stages and implements the stages in sequence and that the device includes any of the above logical calculation circuits arranged in series and/or parallel to perform the logical calculation.

Therefore, constituting each stage with a large number of the above logical calculation circuits, each serving both as a logical calculation section and a memory section, makes it possible to reduce considerably the circuit area including the area required for wiring in comparison with conventional pipelined logical calculation devices. This makes it possible to increase greatly the degree of integration and keep down power consumption.

Further, because the memory is non-volatile, power for holding the memory is unnecessary. Therefore, power consumption in calculation is kept down and little power is consumed when standing by. Moreover, a backup power source against possible power failure is also unnecessary. Furthermore, in the case a memory element including ferroelectric capacitor is used as the non-volatile memory element, write operation may be accelerated.

Further, using a large number of logical calculation circuits capable of reading data with large margin makes it possible to realize a pipelined logical calculation device capable of performing calculation with high reliability at high speeds.

The logical calculation device of this invention is characterized in that the logical calculation includes addition of an augend and an addend both being signed-digit binary numbers; the logical calculation device comprising: a first stage calculation section for performing, using a logical calculation circuit, a first stage calculation including the operations of calculating and storing two binary numbers corresponding to the augend and the addend; a second stage calculation section for performing a second stage calculation, following the first stage calculation, including operations of calculating and storing one binary number as a first addition result corresponding to the exclusive OR of the two binary numbers using a pair of parallel-connected logical calculation circuits, and an operation of storing the first carry information for the bit in question calculated according to the augend and the addend using the logical calculation circuit; a third stage calculation section for performing a third stage calculation, following the second stage calculation, including operations of calculating and storing one binary number as a second addition result corresponding to the exclusive OR of the first addition result and the first carry information from the previous bit using another pair of the parallel-connected logical calculation circuits, and operations of calculating and storing a second carry information for the bit in question according to the augend, the addend, and the first carry information from the previous bit using the logical calculation circuit; and a fourth stage calculation section for performing a fourth stage calculation, following the third stage calculation, including operations of calculating and storing a signed-digit binary number as an addition result of the logical calculation device according to the second addition result and the second carry information from the previous bit using a logical calculation circuit.

Therefore, it is possible to constitute a pipelined full adder capable of performing addition of signed-digit binary numbers, in which carry propagation remains at a high bit only, by dividedly placing two pairs of logical calculation circuits for obtaining addition result and a plural number of logical calculation circuits for obtaining carry information in four stage calculation sections. This makes it possible to easily constitute a pipelined full adder with high degree of integration, low power consumption, high reliability, and high calculation speeds.

The logical calculation device of this invention is a logical calculation device for performing multiplication of two binary numbers sequentially at plural divided levels, characterized by comprising: a partial product generating section for generating a signed-digit partial product corresponding to the partial product of a multiplicand and a multiplier; and an adder made by preparing a plural number of the above logical calculation devices as elementary calculation devices, disposing them in a plural number of stages corresponding to respective levels to obtain a signed-digit binary number corresponding to the product of the multiplicand and the multiplier by performing sequential addition of respective stages using the signed-digit partial product and/or the previous stage's addition result as inputs.

Therefore, it is possible to constitute a pipelined multiplier utilizing addition of signed-digit binary numbers by disposing the above pipelined full adder as an elementary calculation device at a plural number of stages corresponding to respective levels of multiplication. This makes it possible to easily constitute a pipelined multiplier with high degree of integration, low power consumption, high reliability, and high speeds.

In the logical calculation device of this invention, the partial product generating section generates signed-digit partial products about one fourth in number of bits of the multiplier based on the multiplicand and the multiplier, and the addition section is constituted with a plural number of elementary calculation devices connected in parallel to form an addition unit capable of adding two signed-digit partial products, with one or more of the addition units disposed in each level calculation device for performing calculation at each level.

The first level calculation device for performing the first level calculation, using a plural number of addition units connected in parallel, performs addition of inputs or signed-digit partial products to obtain the first level addition results substantially half in number of the total number of the signed-digit partial products generated in the partial product generating section, and stores the results.

Each intermediate level calculation section for performing calculation of the intermediate level, using a plural number of addition units connected in parallel, performs addition of inputs or the addition results of the previous level to obtain the addition results of the intermediate level substantially half in number of the previous level.

The final level calculation section for performing the final level calculation is characterized in that it uses one addition unit, performs addition of inputs or the addition results of the previous level to obtain one addition result of the final level and stores the obtained addition result of the final level as a signed-digit binary number corresponding to the above-mentioned product of the multiplicand and the multiplier.

Therefore, it is possible to obtain a data corresponding to the product of a multiplicand and a multiplier with a limited number of levels by generating signed-digit partial products about one fourth in number of the number of multiplier bits and repeating the operation of halving the obtained signed-digit partial products at each level. This makes it possible to easily constitute a pipelined multiplier capable of performing multiplication utilizing the addition of signed-digit binary numbers with high degree of integration, low power consumption, high reliability, and high speeds.

The logical calculation device of this invention is characterized in that the logical calculation includes the addition of three binary numbers: an augend, an addend, and a carry from a lower bit; and that the logical calculation device includes: a first addition stage calculation section for performing, using a pair of the parallel-connected logical calculation circuits, a first stage addition calculation including the operations of calculating and storing a binary number as a first addition result corresponding to an exclusive OR of binary numbers corresponding to two out of three binary numbers; and a second addition stage calculation section for performing, following the first addition stage calculation, a second addition stage calculation including operations of calculating and storing a binary number as a second addition result corresponding to a binary number corresponding to an exclusive OR of the first addition result and the remaining one of the three binary numbers and outputting the second addition result as an addition result of the logical calculation device using another pair of the parallel-connected logical calculation circuits, and an operation of outputting a carry in the addition of the three binary numbers according to the three binary numbers using a plural number of the logical calculation circuits.

Therefore, it is possible to constitute a pipelined full adder by dividedly disposing two pairs of logical calculation circuits for calculating an addition result and a plural number of logical calculation circuits in two stage calculation sections. Therefore, it possible to easily constitute a pipelined full adder with high degree of integration, low power consumption, high reliability, and high calculation speeds.

The logical calculation device of this invention is the one for performing the multiplication of two binary numbers sequentially in a plural number of divided levels and includes: a partial product generating section for generating the partial product of a multiplicand and a multiplier, and an addition section formed with a plural number of the above logical calculation devices prepared as elementary calculation devices and disposing them in a plural number of stages corresponding to the respective levels for obtaining a calculation result by sequentially performing additions of respective stages using the partial product and/or the addition result of the previous stage as inputs.

Therefore, it is possible to constitute a pipelined multiplier by disposing the above pipelined full adders as elementary calculation devices in a plural number of stages corresponding to the respective levels of the multiplication. Therefore, it is possible to easily constitute a pipelined multiplier with high degree of integration, low power consumption, high reliability, and high operation speeds.

In the logical calculation device of this invention, the plural number of levels correspond in number to at least the number of multiplier bits, the partial product generating section is constituted with elementary product generating sections disposed in respective level calculation sections for performing calculation in respective levels, and the addition section is constituted with elementary calculation devices disposed in respective level calculation sections for performing calculations at least in the second and later levels.

Further, each level calculation section for performing the calculations at least from the second level includes: the first stage calculation section for performing the first stage calculation including an operation of storing one bit, the current calculation object, out of plural bits constituting the multiplicand, as a calculation object bit of the multiplicand; the second stage calculation section for performing the second stage calculation, using the elementary partial product generating section, following the first stage calculation, including operations of calculating and storing a logical product of the calculation object bit of the multiplicand and a bit, corresponding to the relevant level, out of plural bits constituting the multiplier, as the elementary partial product at the relevant level of the relevant calculation object bit of the multiplicand; and the third and fourth stage calculation sections for performing the third and fourth stage calculations, using the elementary calculation device, following the second stage calculation, including operations of calculating a sum of three binary numbers, the elementary partial product at the relevant level, the partial product at the previous level, and the carry at the relevant level for the bit before the relevant calculation object bit of the multiplicand and storing the sum as the partial product at the relevant level for the relevant calculation object bit of the multiplicand, and an operation of storing the carry produced here as the carry at the relevant level of the relevant calculation object bit of the multiplicand.

Therefore, it is possible to constitute a pipelined multiplier of series-parallel type by giving respective bit values of the multiplier in advance to the corresponding level calculation sections the same in number as the number of the multiplier bits, sequentially giving respective bit values of the multiplicand to the first level calculation section, and sequentially giving respective bit values of the multiplicand from the previous level calculation section with a specified delay to the intermediate level calculation section. Therefore, it is possible to easily constitute a pipelined multiplier of series-parallel type with high degree of integration, low power consumption, high reliability, and high speed calculation.

Incidentally, the term "state change rate" used in Claims means the extent of change in the state of non-volatile memory element and non-volatile load element caused by giving the second data to be calculated.

Unless specifically mentioned, negation (inversion signal) of a binary number (binary signal) "A" is to be expressed with "/A."

While this invention is described above by means of preferable embodiments, respective terms are used not for restriction but for explanation, and therefore may be changed within the scope of appended Claims without departing from the scope and spirit of this invention.

The invention claimed is:

1. A logical calculation circuit comprising:
a storage ferroelectric capacitor for retaining a polarized state corresponding to a first data to be calculated and having a first and a second terminals;
a load ferroelectric capacitor for retaining a polarized state in substantially complementary relationship to the polarized state of the storage ferroelectric capacitor, having a third terminal connected to the first terminal of the storage ferroelectric capacitor, and a fourth terminal; and
a calculation result output section connected to a coupling node between the first terminal of the storage ferroelectric capacitor and the third terminal of the load ferroelectric capacitor to output a logical calculation result of the first data to be calculated and a second data to be calculated for a specified logical operator based on the potential of the coupling node obtained by connecting the fourth terminal of the load ferroelectric capacitor to a specified reference potential while giving the second data to be calculated to the second terminal of the storage ferroelectric capacitor.

2. The logical calculation circuit of claim 1, wherein the specified reference potential is selectable from two or more different reference potentials corresponding to two or more different logical operators, and
the specified logical operator is determined by connecting the chosen specified reference potential to the fourth terminal of the load ferroelectric capacitor while precharging the coupling node to the specified reference potential before giving the second data to be calculated.

3. The logical calculation circuit of claim 1 or 2, wherein the coupling node is given a third data to be calculated;
the second terminal of the storage ferroelectric capacitor and the fourth terminal of the load ferroelectric capacitor are given a fourth data to be calculated, and
the polarized states of the storage ferroelectric capacitor and the load ferroelectric capacitor corresponding to the first data to be calculated are determined with both the third and fourth data to be calculated given and the polarized states of the storage ferroelectric capacitor and the load ferroelectric capacitor before the third and fourth data are given.

4. A logical calculation circuit comprising:
a non-volatile memory element for retaining non-volatile state corresponding to a first data to be calculated s as a binary data, and having first and second terminals;
a non-volatile load element for retaining non-volatile state corresponding to the inverted data /s of the first data to be calculated s, and having a third terminal connected to the first terminal of the non-volatile memory element, and a fourth terminal; and
a calculation result output section for outputting a logical calculation result of the first and a second data to be calculated s and x, as a calculation result data z as a binary data, for a specified logical operator corresponding to a reference potential arbitrarily chosen out of two complementary reference potentials, according to the states of the non-volatile memory element and the non-volatile load element obtained by pre-charging the coupling node of the first terminal of the non-volatile memory element and the third terminal of the non-volatile load element with the reference potential and then giving the second data x as a binary data, to the second terminal of the non-volatile memory element while maintaining the fourth terminal of the non-volatile load element at the reference potential, wherein
the calculation result data z substantially meets the following equation when the binary data corresponding to the two complementary reference potentials are assumed to be c and /c, $$z = /c \text{ AND } x \text{ AND } /s \text{ OR } c \text{ AND } (x \text{ OR } /s).$$

5. The logical calculation circuit of claim 4, wherein
the first data s to be calculated corresponds to a new non-volatile state of the non-volatile memory element obtained by giving a third data y1 as a binary data to the coupling node while giving a fourth data y2 as a binary data to both the second terminal of the non-volatile memory element and the fourth terminal of the non-volatile load element, and substantially meets the following equation when the first data before the third and fourth data are given is assumed to be sb, $$s = /sb \text{ AND } /y1 \text{ AND } y2 \text{ OR } sb \text{ AND } (/y1 \text{ OR } y2).$$

6. A logical calculation circuit comprising:
a non-volatile memory element for retaining non-volatile state corresponding to a first data to be calculated,
a non-volatile load element for retaining non-volatile state of different rate of change depending on the first data to be calculated, connected to the non-volatile memory element at a coupling node; and
a calculation result output section for outputting a logical calculation result of the first and second data to be calculated for a specified logical operator according to the state change amounts, of both the non-volatile memory element and the non-volatile load element, obtained by giving a second data to be calculated to the non-volatile memory element.

7. The logical calculation circuit of claim 6, wherein
the specified logical operator is determined by giving a reference potential chosen out of two or more different reference potentials corresponding to two or more different logical operators to the non-volatile load element before giving the second data to be calculated.

8. The logical calculation circuit of claim 6 or 7, wherein
the third and fourth data to be calculated are given to both the non-volatile memory element and the non-volatile load element; and
the non-volatile states of the non-volatile memory element and the non-volatile load element corresponding to the first data to be calculated are determined with the third and fourth data to be calculated and the non-volatile states of the non-volatile memory element and the non-volatile load element before the third and fourth data to be calculated are given.

9. The logical calculation circuit of one of claims 1, 4, or 6, wherein the calculation result output section comprises an output transistor having a control terminal connected to the coupling node and an output terminal for outputting signals corresponding to control signals inputted to the control terminal, and turning off when a potential as the control signal nearer to the first reference potential than to the threshold voltage of the output transistor is given and turning on when a potential nearer to the second reference potential than to the threshold voltage is given, and the logical calculation result is obtained as the output signal of the output transistor.

10. A logical calculation device constituted to perform specified logical calculations with any of the logical calculation circuits of claims 1, 4, or 6 disposed in series and/or parallel.

11. A logical calculation device comprising:
a search word holding section for holding a search word as an object of search, and
a word circuit for holding a reference word as an object of reference, and for performing coincidence judgment between the reference word and the search word, constituted by disposing any of the logical calculation circuits of claim 1, 4, or 6 in parallel and/or series.

12. The logical calculation device of claim 11, wherein
the word circuit, using a pair of the logical calculation circuits connected in series for respective bits constituting the reference word, calculates a logical value corresponding to the negation of exclusive OR of the bit value of the reference word and the bit value of the search word, calculates a logical value corresponding to the logical product of the entire logical values corresponding to the negation of exclusive OR calculated for each bit by connecting all the outputs of the pair of logical circuits in parallel, and makes a logical value corresponding to the calculated logical product a coincidence judgment output of the word circuit.

13. A logical calculation device comprising:
a search word holding section for holding a search word as an object of search; and
a word circuit for holding a reference word and performing magnitude comparison judgment between the reference word and the search word, constituted by disposing any of the logical calculation circuits of claim 1, 4, or 6 in parallel and/or series to perform the reference word holding and the magnitude comparison judgment.

14. The logical calculation circuit of claim 13, wherein
the word circuit, using a plural number of the logical calculation circuits, produces a comparison decision output to the effect that the search word is greater than the reference word in the case the value of at least one bit in question out of respective bits constituting the search word is greater than the value of a counterpart bit of the reference word, and the values of respective bits higher in position than the bit in question out of the respective bits constituting the search word are respectively equal to the values of respective counterpart bits of the reference word.

15. A logical calculation device for performing addition of two or more pieces of binary numbers, constituted with any of the logical calculation circuits of claim 1, 4 or 6 in series and/or parallel to perform the addition.

16. The logical calculation device of claim 15, wherein
the logical calculation includes addition of an augend and an addend;
the logical calculation device comprises an addition result calculation section for calculating the addition result of the augend and the addend, and a carry information calculation section for calculating carry information on the addition;
the addition result calculation section using a plural number of the logical calculation circuits calculates the addition result according to the augend, addend, and carry information from a previous bit, and makes the addition result obtained the output of the addition result calculation section; and
the carry information calculation section, using a plural number of logical calculation circuits, calculates the carry information for the bit in question according to the augend, addend, and carry information from the previous bit, and makes the carry information obtained the output of the carry information calculation section.

17. A logical calculation device for performing logical calculation in sequence of a plural number of divided stages with any of the logical calculation circuits of claim 1, 4 or 6 disposed in series and/or parallel.

18. The logical calculation device of claim 15, wherein
the logical calculation includes addition of an augend and an addend, both signed-digit binary numbers;
the logical calculation device comprising:
a first stage calculation section for performing, using the logical calculation circuit, a first stage calculation including the operations of calculating and storing two binary numbers corresponding to the augend and the addend;
a second stage calculation section for performing a second stage calculation, following the first stage calculation, including operations of calculating and storing one binary number as a first addition result corresponding to the exclusive OR of the two binary numbers using a pair of parallel-connected logical calculation circuits, and an operation of storing the first carry information for the bit in question calculated according to the augend and the addend using the logical calculation circuit;
a third stage calculation section for performing a third stage calculation, following the second stage calculation, including operations of calculating and storing one binary number as a second addition result corresponding to the exclusive OR of the first addition result and the first carry information from the previous bit using another pair of the parallel-connected logical calculation circuits, and operations of calculating and storing a second carry information for the bit in question according to the augend, the addend, and the first carry information from the previous bit using the logical calculation circuit; and
a fourth stage calculation section for performing a fourth stage calculation, using the logical calculation circuit, following the third stage calculation, including operations of calculating and storing a signed-digit binary number as an addition result of the logical calculation device according to the second addition result and the second carry information from the previous bit.

19. A logical calculation device for performing multiplication of two pieces of binary numbers in sequence of a plural number of divided levels, comprising:
a partial product generating section for generating a signed-digit partial product corresponding to the partial product of a multiplicand and a multiplier; and
an adder made by preparing a plural number of the logical calculation devices of claim 18 as elementary calculation devices, disposing them in a plural number of stages corresponding to respective levels to obtain the signed-digit binary number corresponding to the product of the multiplicand and the multiplier by performing sequential addition of respective stages using the signed-digit partial product and/or the addition result of the previous stage as inputs.

20. The logical calculation device of claim 19, wherein
the partial product generating section, according to the multiplicand and multiplier, generates signed-digit partial products about one fourth in number of bits of the multiplier;
the addition section is constituted with a plural number of the elementary calculation devices connected in parallel to form an addition unit capable of performing addition of two pieces of the signed-digit partial products, with one or more pieces of the addition units disposed at each level calculation section for performing calculation at each level;
the first level calculation section for performing the first level calculation, using a plural number of the addition units disposed in parallel, performs operations of addition using the signed-digit partial products as inputs and storing the addition results at the first level substantially half in number of the total number of the signed-digit partial products generated in the partial product generating section;
each of intermediate level calculation sections for performing calculation of the intermediate level, using a plural number of addition units connected in parallel, perform addition of inputs, the addition results of the previous level, to obtain the addition results of the intermediate level substantially half in number of the previous level; and
final level calculation unit for performing the final level calculation, using one addition unit, performs addition of inputs, the addition results of the previous level, to obtain one addition result of the final level and stores the obtained addition result of the final level as a signed-digit binary number corresponding to the product of the multiplicand and the multiplier.

21. The logical calculation device of claim 15, wherein
the logical calculation includes the addition of three binary numbers: an augend; an addend; and a carry from a lower bit; and
the logical calculation device comprises:
a first addition stage calculation section for performing, using a pair of the parallel-connected logical calculation circuits, a first stage addition calculation including operations of calculating and storing a binary number as a first addition result corresponding to an exclusive OR of binary numbers corresponding to two out of three binary numbers; and
a second addition stage calculation section for performing, following the first addition stage calculation, a second addition stage calculation including operations of calculating and storing a binary number as a second addition result corresponding to a binary number corresponding to an exclusive OR of the first addition result and the remaining one of the three binary numbers and outputting the second addition result as an addition result of the logical calculation device using another pair of the parallel-connected logical calculation circuits, and an operation of outputting a carry in the addition of the three binary numbers according to the three binary numbers using a plural number of the logical calculation circuits.

22. A logical calculation device for performing multiplication of two pieces of binary numbers in sequence of a plural number of divided levels, comprising:
a partial product generating section for generating the partial product of a multiplicand and a multiplier; and
an addition section formed with a plural number of the logical calculation devices of claim 21 prepared as elementary calculation devices and disposing them in a plural number of stages corresponding to the respective levels for obtaining a calculation result by sequentially performing additions of respective stages using the partial product and/or the addition result of the previous stage as inputs.

23. The logical calculation device of claim 22, wherein
the plural number of levels correspond in number at least to the number of bits of the multiplier;
the partial product generating section is constituted with elementary partial product generating sections disposed in respective level calculation sections performing calculation in respective levels; and
the addition section is constituted with elementary calculation devices disposed in respective level calculation sections for performing calculations at least in the second and later levels;
each of the level calculation sections for performing the calculations at least in the second and later levels comprises:
a first stage calculation section for performing the first stage calculation including an operation of storing one bit as the current calculation object, out of plural bits constituting the multiplicand, as a calculation object bit of the multiplicand;
a second stage calculation section for performing the second stage calculation, using the elementary partial product generating section, following the first stage calculation, including operations of calculating and storing a logical product, of the calculation object bit of the multiplicand and a bit, corresponding to the relevant level, out of plural bits constituting the multiplier, as the elementary partial product at the relevant level of the relevant calculation object bit of the multiplicand; and
third and fourth stage calculation sections for performing the third and fourth stage calculations, using the elementary calculation device, following the second stage calculation, including operations of calculating a sum of three binary numbers: the elementary partial product at the relevant level, the partial product at the previous level, and the carry at the relevant level for the bit before the relevant calculation object bit of the multiplicand and storing the sum as the partial product at the relevant level for the relevant calculation object bit of the multiplicand, and an operation of storing the carry produced in this addition as the carry at the relevant level of the relevant calculation object bit of the multiplicand.

24. A method of performing logical calculation of first and second data to be calculated for a specified logical operator, comprising:
a writing step of preparing a non-volatile memory element for retaining non-volatile state corresponding to the first data to be calculated and having the first and second terminals, and a non-volatile load element for retaining non-volatile state of different state change rate depending on the first data to be calculated, and having the third terminal connected to the first terminal of the non-volatile memory element through the coupling node, and the fourth terminal; and
a reading step of performing logical calculation based on the state change amounts of both the non-volatile memory element and the non-volatile load element obtained by connecting the fourth terminal of the non-volatile load element to a specified reference potential and by giving the second data to be calculated to the second terminal of the non-volatile memory element.

25. The logical calculation method of claim 24, wherein the specified reference potential is selectable from two or more different reference potentials corresponding to two or more different logical operators; and the reading process comprises the steps of:

giving the specified reference potential chosen to both the fourth terminal of the non-volatile load element and the coupling node; and stopping giving the specified reference potential to the coupling node while maintaining giving the specified reference potential to the fourth terminal of the non-volatile load element and, in that state, giving the second data to be calculated to the second terminal of the non-volatile memory element.

26. The logical calculation method of claim 24 or 25, wherein the writing step determines new non-volatile states of the non-volatile memory element and the non-volatile load element corresponding to the first data to be calculated by giving the third data to be calculated to the coupling node and by giving the fourth data to be calculated to both the second terminal of the non-volatile memory element and the fourth terminal of the non-volatile load element, and according to the third and fourth data to be calculated given and to the non-volatile states of the non-volatile memory element and the non-volatile load element before the third and fourth data to be calculated are given.

* * * * *